United States Patent
Hanson et al.

(10) Patent No.: US 6,921,467 B2
(45) Date of Patent: *Jul. 26, 2005

(54) PROCESSING TOOLS, COMPONENTS OF PROCESSING TOOLS, AND METHOD OF MAKING AND USING SAME FOR ELECTROCHEMICAL PROCESSING OF MICROELECTRONIC WORKPIECES

(75) Inventors: Kyle M. Hanson, Kalispell, MT (US); Steve L. Eudy, Kalispell, MT (US); Thomas L. Ritzdorf, Bigfork, MT (US); Gregory J. Wilson, Kalispell, MT (US); Daniel J. Woodruff, Kalispell, MT (US); Randy Harris, Kalispell, MT (US); Curtis A. Weber, Columbia Falls, MT (US); Tim McGlenn, Kalispell, MT (US); Timothy A. Anderson, Kalispell, MT (US); Daniel P. Bexten, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 372 days.

This patent is subject to a terminal disclaimer.

(21) Appl. No.: 09/882,293

(22) Filed: Jun. 15, 2001

(65) Prior Publication Data

US 2002/0053509 A1 May 9, 2002

Related U.S. Application Data

(63) Continuation-in-part of application No. 09/804,697, filed on Mar. 12, 2001, now Pat. No. 6,660,137, which is a continuation of application No. PCT/US00/10120, filed on Apr. 13, 2000, and a continuation-in-part of application No. 09/604,198, filed on Jun. 27, 2000, now Pat. No. 6,342,137, which is a division of application No. 09/351,980, filed on Jul. 12, 1999, now Pat. No. 6,168,695, application No. 09/882,293, which is a continuation-in-part of application No. 09/386,566, filed on Aug. 31, 1999, now Pat. No. 6,318,951, and a continuation-in-part of application No. 09/113,435, filed on Jul. 10, 1998, now Pat. No. 6,264,752, and a continuation-in-part of application No. 09/041,901, filed on Mar. 13, 1998, now Pat. No. 6,350,319, which is a continuation-in-part of application No. 08/990,107, filed on Dec. 15, 1997, now Pat. No. 6,672,820, application No. 09/882,293, which is a continuation-in-part of application No. 09/618,707, filed on Jul. 18, 2000, which is a division of application No. 08/991,062, filed on Dec. 15, 1997, now Pat. No. 6,091,498, which is a continuation-in-part of application No. 08/940,524, filed on Sep. 30, 1997, now abandoned, and a continuation-in-part of application No. 08/680,056, filed on Jul. 15, 1996, now abandoned, application No. 09/882,293, which is a continuation-in-part of application No. 09/437,926, filed on Nov. 10, 1998, now Pat. No. 6,413,436.

(60) Provisional application No. 60/226,750, filed on Aug. 21, 2000, provisional application No. 60/129,055, filed on Apr. 13, 1999, and provisional application No. 60/117,474, filed on Jan. 27, 1999.

(51) Int. Cl.[7] .............................................. C25D 17/28
(52) U.S. Cl. ...................... 204/212; 204/224 R; 204/242
(58) Field of Search ................................ 204/198, 212, 204/224 R, 242

(56) References Cited

U.S. PATENT DOCUMENTS

| | | | |
|---|---|---|---|
| 1,526,644 A | 2/1925 | Phinney |
| 1,881,713 A | 10/1932 | Laukel |
| 2,256,274 A | 9/1941 | Boedecker et al. |
| 3,664,933 A | 5/1972 | Clauss |
| 3,706,635 A | 12/1972 | Kowalski |
| 3,716,462 A | 2/1973 | Jensen |
| 3,878,066 A | 4/1975 | Dettke et al. |
| 3,930,963 A | 1/1976 | Polichette et al. |
| 4,000,046 A | 12/1976 | Weaver |
| 4,046,105 A | 9/1977 | Gomez |
| 4,134,802 A | 1/1979 | Herr |
| 4,304,641 A | 12/1981 | Grandia et al. |
| 4,384,930 A | 5/1983 | Eckles |
| 4,437,943 A | 3/1984 | Beck et al. |
| 4,451,197 A | 5/1984 | Lange |
| 4,495,453 A | 1/1985 | Inaba et al. |
| 4,500,394 A | 2/1985 | Rizzo |
| 4,566,847 A | 1/1986 | Maeda et al. |
| 4,576,689 A | 3/1986 | Makkaev et al. |
| 4,634,503 A | 1/1987 | Nogavich |
| 4,639,028 A | 1/1987 | Olson |
| 4,648,944 A | 3/1987 | George et al. |

| | | |
|---|---|---|
| 4,670,126 A | 6/1987 | Messer et al. |
| 4,760,671 A | 8/1988 | Ward |
| 4,761,214 A | 8/1988 | Hinman |
| 4,770,590 A | 9/1988 | Hughes et al. |
| 4,781,800 A | 11/1988 | Goldman et al. |
| 4,828,654 A | 5/1989 | Reed |
| 4,902,398 A | 2/1990 | Homstad |
| 4,944,650 A | 7/1990 | Masumoto |
| 4,949,671 A | 8/1990 | Davis et al. |
| 4,959,278 A | 9/1990 | Shimauchi et al. |
| 4,988,533 A | 1/1991 | Freeman et al. |
| 5,000,827 A | 3/1991 | Schuster et al. |
| 5,061,144 A | 10/1991 | Akimoto et al. |
| 5,096,550 A | 3/1992 | Mayer et al. |
| 5,115,430 A | 5/1992 | Hahne et al. |
| 5,135,636 A | 8/1992 | Yee et al. |
| 5,138,973 A | 8/1992 | Davis et al. |
| 5,151,168 A | 9/1992 | Gilton et al. |
| 5,156,174 A | 10/1992 | Thompson et al. |
| 5,156,730 A | 10/1992 | Bhatt et al. |
| 5,178,512 A | 1/1993 | Skrobak |
| 5,209,817 A | 5/1993 | Ahmad et al. |
| 5,217,586 A | 6/1993 | Datta et al. |
| 5,222,310 A | 6/1993 | Thompson et al. |
| 5,227,041 A | 7/1993 | Brogden et al. |
| 5,256,274 A | 10/1993 | Poris |
| 5,302,464 A | 4/1994 | Nomura et al. |
| 5,314,294 A | 5/1994 | Taniguchi et al. |
| 5,344,491 A | 9/1994 | Katou |
| 5,368,711 A | 11/1994 | Poris |
| 5,372,848 A | 12/1994 | Blackwell et al. |
| 5,376,176 A | 12/1994 | Kuriyama |
| 5,377,708 A | 1/1995 | Bergman et al. |
| 5,391,285 A | 2/1995 | Lytle et al. |
| 5,442,416 A | 8/1995 | Tateyama et al. |
| 5,460,478 A | 10/1995 | Akimoto et al. |
| 5,472,502 A | 12/1995 | Batchelder |
| 5,549,808 A | 8/1996 | Farooq et al. |
| 5,571,325 A | 11/1996 | Ueyama et al. |
| 5,597,460 A | 1/1997 | Reynolds |
| 5,639,206 A | 6/1997 | Oda et al. |
| 5,639,316 A | 6/1997 | Cabral, Jr. et al. |
| 5,670,034 A | 9/1997 | Lowery |
| 5,681,392 A | 10/1997 | Swain |
| 5,684,713 A | 11/1997 | Asada et al. |
| 5,700,127 A | 12/1997 | Harada et al. |
| 5,711,646 A | 1/1998 | Ueda et al. |
| 5,723,028 A | 3/1998 | Poris |
| 5,746,565 A | 5/1998 | Tepolt |
| 5,754,842 A | 5/1998 | Minagawa |
| 5,759,006 A | 6/1998 | Miyamoto et al. |
| 5,765,444 A | 6/1998 | Bacchi et al. |
| 5,765,889 A | 6/1998 | Nam et al. |
| 5,785,826 A | 7/1998 | Greenspan |
| 5,871,626 A | 2/1999 | Crafts et al. |
| 5,882,498 A | 3/1999 | Dubin et al. |
| 5,908,543 A | 6/1999 | Matsunami et al. |
| 5,932,077 A | 8/1999 | Reynolds |
| 5,980,706 A | 11/1999 | Bleck et al. |
| 5,985,126 A | 11/1999 | Bleck et al. |
| 5,989,397 A | 11/1999 | Laube et al. |
| 5,989,406 A | 11/1999 | Beetz, Jr. et al. |
| 5,999,886 A | 12/1999 | Martin et al. |
| 6,004,828 A | 12/1999 | Hanson |
| 6,027,631 A | 2/2000 | Broadbent |
| 6,028,986 A | 2/2000 | Song |
| 6,074,544 A | 6/2000 | Reid et al. |
| 6,090,260 A | 7/2000 | Inoue et al. |
| 6,091,498 A | 7/2000 | Hanson et al. |
| 6,110,346 A | 8/2000 | Reid et al. |
| 6,151,532 A | 11/2000 | Barone et al. |
| 6,156,167 A | 12/2000 | Patton et al. |
| 6,159,354 A | 12/2000 | Contolini et al. |
| 6,162,344 A | 12/2000 | Reid et al. |
| 6,162,488 A | 12/2000 | Gevelber et al. |
| 6,168,695 B1 | 1/2001 | Woodruff et al. |
| 6,179,983 B1 | 1/2001 | Reid et al. |
| 6,193,859 B1 * | 2/2001 | Contolini et al. ....... 204/224 R |
| 6,199,301 B1 | 3/2001 | Wallace |
| 6,228,232 B1 | 5/2001 | Woodruff et al. |
| 6,234,738 B1 | 5/2001 | Kimata et al. |
| 6,277,263 B1 | 8/2001 | Chen |
| 6,318,951 B1 * | 11/2001 | Schmidt et al. .......... 414/744.5 |
| 6,322,112 B1 | 11/2001 | Duncan |
| 6,391,166 B1 * | 5/2002 | Wang ..................... 204/224 R |
| 6,481,956 B1 | 11/2002 | Hofmeister |
| 6,497,801 B1 | 12/2002 | Woodruff et al. |
| 6,632,334 B2 * | 10/2003 | Anderson et al. ........... 204/227 |
| 6,699,373 B2 * | 3/2004 | Woodruff et al. ........... 204/198 |
| 2002/0008037 A1 | 1/2002 | Wilson et al. |
| 2002/0125141 A1 | 9/2002 | Wilson et al. |
| 2002/0139678 A1 | 10/2002 | Wilson et al. |

FOREIGN PATENT DOCUMENTS

| | | |
|---|---|---|
| WO | WO 00/02808 | 1/2000 |
| WO | WO 02/02808 | 1/2000 |
| WO | WO 00/61498 | 10/2000 |
| WO | WO 00/61837 | 10/2000 |
| WO | WO 01/90434 | 11/2001 |
| WO | WO 02/045476 | 6/2002 |
| WO | WO 02/097165 | 12/2002 |
| WO | WO 02/099165 | 12/2002 |

OTHER PUBLICATIONS

U.S. Appl. No. 09/679,928, filed Oct. 5, 2000, Woodruff et al.

U.S. Appl. No. 60/129,055, filed Apr. 13, 1999, McHugh.

U.S. Appl. No. 60/143,769, filed Jul. 12, 1999, McHugh.

U.S. Appl. No. 60/182,160, filed Feb. 14, 2000, McHugh et al.

U.S. Appl. No. 60/206,663, filed May 24, 2000, Wilson et al.

Lee, Tien–Yu Tom et al., "Application of a CFFD Tool in Designing a Fountain Plating Cell for Uniform Bump Plating of Semiconductor Wafers," IEEE Transactions On Components, Packaging and Manufacturing Technology—Part B, Feb. 1996, pp. 131–137, vol. 19, No. 1, IEEE.

Lowenheim, Frederick A., "Electroplating," Jan. 1979, 12 pgs, McGraw–Hill Book Company, USA.

Ritter, G., et al., "Two–And Three–Dimensional Numerical Modeling of Copper Electroplating for Advanced ULSI Metallization," Jun. 1999, 13 pgs, E–MRS Conference Symposium M. *Basic Models to Enhance Reliability*, Strasbourg, France.

PCT International Search Report for PCT/US02/17840, Applicant: Semitool, Inc., Mar. 2003, 5 pgs.

* cited by examiner

*Primary Examiner*—Arun S. Phasge
(74) *Attorney, Agent, or Firm*—Perkins Coie LLP

(57) ABSTRACT

Processing tools, components of tools, and methods of making and using such devices for electrochemical processing of microelectronic workpieces. One aspect of the invention is directed toward reaction vessels for electrochemical processing of microelectronic workpieces, processing stations including such reaction vessels, and methods for using these devices. For example, one embodiment of a reaction vessel includes an outer container having an outer wall, a first outlet configured to introduce a primary fluid flow into the outer container, and at least one second outlet configured to introduce a secondary fluid flow into the outer container separate from the primary fluid flow. The reaction vessel can also include at least one electrode, and it can also have a field shaping unit. The field shaping unit, for example, can be a dielectric assembly coupled to the second outlet to receive the secondary flow and configured to contain the secondary flow separate from the primary flow through at least a portion of the outer container. The field shaping unit can also have at least one electrode compartment through which the secondary flow can pass separately from the primary flow. The electrode is positioned in the electrode compartment.

44 Claims, 37 Drawing Sheets

PROCESSING TOOLS, COMPONENTS OF PROCESSING TOOLS, AND METHOD OF MAKING AND USING SAME FOR ELECTROCHEMICAL PROCESSING OF MICROELECTRONIC WORKPIECES

CROSS-REFERENCE TO RELATED APPLICATIONS

This application is a continuation-in-part of: (1) U.S. application Ser. No. 09/804,697, entitled "SYSTEM FOR ELECTROCHEMICALLY PROCESSING A WORKPIECE," filed on Mar. 12, 2001, now U.S. Pat. No. 6,660,137, which is a continuation of International Application No. PCT/US00/10120, filed on Apr. 13, 2000, in the English language and published in the English language as International Publication No. WO00/61498, which claims the benefit of Provisional Application No. 60/129,055, filed on Apr. 13, 1999; (2) U.S. application Ser. No. 09/604,198, filed Jun. 27, 2000 now U.S. Pat. No. 6,342,137, which is a divisional of U.S. application Ser. No. 09/351,980, filed Jul. 12, 1999, and issued on Jan. 2, 2001, as U.S. Pat. No. 6,168,695; (3) U.S. application Ser. No. 08/990,107, filed Dec. 15, 1997 now U.S. Pat. No. 6,672,820; (4) U.S. application Ser. No. 09/386,566, filed Aug. 31, 1999 now U.S. Pat. No. 6,318,951; (5) U.S. application Ser. No. 09/041,901, filed Mar. 13, 1998 now U.S. Pat. No. 6,350,319; (6) U.S. application Ser. No. 09/113,435, filed Jul. 10, 1998 now U.S. Pat. No. 6,264,752, which is a continuation-in-part of U.S. application Ser. No. 09/041,901, filed Mar. 13, 1998 now U.S. Pat. No. 6,350,319; (7) U.S. application Ser. No. 09/437,926, filed Nov. 10, 1999 now U.S. Pat. No. 6,413,436, which claims the benefit of U.S. Provisional App. Nos. 60/226,750, filed Aug. 21, 2000 and 60/117,474, filed Jan. 27, 1999; and (8) U.S. application Ser. No. 09/618,707, filed Jul. 18, 2000, which is a divisional of U.S. application Ser. No. 08/991,062, filed Dec. 15, 1997, and issued as U.S. Pat. No. 6,091,498, which is a continuation-in-part of U.S. application Ser. No. 08/940,524, filed Sep. 30, 1997 now abandoned, and Ser. No. 08/680,056, filed Jul. 15, 1996 now abandoned ; all of which are herein incorporated by reference. Additionally, this application is related to the following:

(a) U.S. patent application Ser. No. 09/875,300 entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed Jun. 5, 2001;

(b) U.S. patent application Ser. No. 09/875,428 entitled "INTEGRATED TOOLS WITH TRANSFER DEVICES FOR HANDLING MICROELECTRONIC WORKPIECES," filed Jun. 5, 2001;

(c) U.S. patent application Ser. No. 09/875,304 entitled "DISTRIBUTED POWER SUPPLIES FOR MICROELECTRONIC WORKPIECE PROCESSING TOOLS," filed Jun. 5, 2001;

(d) U.S. patent application Ser. No. 09/872,151 entitled "APPARATUS AND METHOD FOR ELECTROCHEMICAL PROCESSING OF MICROELECTRONIC WORKPIECES," filed on May 31, 2001;

(e) U.S. patent application Ser. No. 09/875,424 entitled "LIFT AND ROTATE ASSEMBLY FOR USE IN A WORKPIECE PROCESSING STATION AND A METHOD OF ATTACHING THE SAME," filed Jun. 5, 2001;

(f) U.S. patent applications entitled "TUNING ELECTRODES USED IN A REACTOR FOR ELECTROCHEMICALLY PROCESSING A MICROELECTRONIC WORKPIECE," one filed on May 4, 2001, and identified as U.S. application Ser. No. 09/849,505, and two additional applications filed on May 24, 2001, and identified by Ser. Nos. 09/866,391 and 09/866,463; and (g) U.S. patent application Ser. No. 09/875,365 entitled "ADAPTABLE ELECTROCHEMICAL PROCESSING CHAMBER," filed Jun. 5, 2001.

All of the foregoing U.S. Patent Applications in paragraphs (a)–(g) above are herein incorporated by reference.

TECHNICAL FIELD

This invention relates machines for electrochemically processing microelectronic workpiece and methods of making and using such machines.

BACKGROUND

Microelectronic devices, such as semiconductor devices and field emission displays, are generally fabricated on and/or in microelectronic workpieces using several different types of machines ("tools"). In a typical fabrication process, several different processes are performed on a workpiece to form integrated circuits, micro-mechanical components and many other types of features. The operations involved in fabricating a semiconductor device, for example, include depositing materials, patterning, doping, implanting, chemical-mechanical polishing, electropolishing, heat treating, etching, etc. A conductive component, such as a contact or conductive line, is generally constructed by depositing one or more layers of conductive materials on the workpieces, and then etching and/or polishing (i.e., planarizing) the workpieces to remove a portion of the deposited material. As the size of the individual features on microelectronic devices decreases, there is a high demand for tools that can precisely deposit or polish materials.

Plating tools that plate metals or other materials on the workpieces are becoming an increasingly useful type of processing machine. Electroplating and electroless plating techniques can be used to deposit copper, solder, permalloy, gold, silver, platinum and other metals onto workpieces for forming blanket layers or patterned layers. A typical copper plating process involves depositing a copper seed layer onto the surface of the workpiece using chemical vapor deposition (CVD), physical vapor deposition (PVD), electroless plating processes, or other suitable methods. After forming the seed layer, a blanket layer or patterned layer of copper is plated onto the workpiece by applying an appropriate electrical potential between the seed layer and an anode in the presence of an electroprocessing solution. The workpiece is then cleaned, etched and/or annealed in subsequent procedures before transferring the workpiece to another processing machine.

FIG. 1A illustrates an embodiment of an electrochemical processing station 1 that includes a container 2 for receiving a flow of electroplating solution from a fluid inlet 3 at a lower portion of the container 2. The processing station 1 can include an anode 4, a diffuser 6 having a plurality of apertures 7, and a workpiece holder 9 for carrying a workpiece 5. The workpiece holder 9 can include a plurality of electrical contacts for providing electrical current to a seed layer on the surface of the workpiece 5. When the seed layer is biased with a negative potential relative to the anode 4 it is a cathode. In operation the electroplating fluid flows around the anode 4, through the apertures 7 in the diffuser 6 and against the plating surface of the workpiece 5. The electroplating solution is an electrolyte that conducts electrical current between the anode 4 and the cathodic seed layer on the surface of the workpiece 5. Therefore, ions in the electroplating solution plate the surface of the workpiece 5.

The electrochemical processing stations used in fabricating microelectronic devices must meet many specific performance criteria. For example, many processes must be able to form small contacts by filling vias that are less than 0.5 μm wide, and even less than 0.1 μm wide, with the plated layer of material. The layer of plated material should also be deposited to a desired, uniform thickness across the surface of the workpiece 5. One factor that influences the uniformity of the plated layer is the mass transfer of electroplating solution at the surface of the workpiece. This parameter is generally influenced by the velocity of the flow of the electroplating solution perpendicular to the surface of the workpiece and the motion of the workpiece. Another factor that influences the uniformity of the plated layer is the current density of the electrical field across the surface of the wafer.

One concern of existing electrochemical processing stations is providing a uniform mass transfer at the surface of the workpiece. Referring to FIG. 1A, existing processing stations generally use the diffuser 6 to enhance the uniformity of the fluid flow perpendicular to the face of the workpiece. Although the diffuser 6 improves the uniformity of the fluid flow, it produces a plurality of localized areas of increased flow velocity perpendicular to the surface of the workpiece 5 (indicated by arrows 8). The localized areas generally correspond to the position of the apertures 7 in the diffuser 6. The increased velocity of the fluid flow normal to the substrate in the localized areas increases the mass transfer of the electroplating solution in these areas. This typically results in faster plating rates in the localized areas over the apertures 7. Although many different configurations of apertures have been used in plate-type diffusers, these diffusers may not provide adequate uniformity for the precision required in many current applications.

Another concern of electrochemical processing stations is that the diffusion layer in the electroplating solution adjacent to the surface of the workpiece 5 can be disrupted by gas bubbles or particles. For example, bubbles can be introduced to the plating solution by the plumbing and pumping system of the processing equipment, or they can evolve from inert anodes. Consumable anodes are often used to prevent or reduce the evolvement of gas bubbles in the electroplating solution, but these anodes erode and they form a passivated film surface that must be maintained. Consumable anodes, moreover, often generate particles that can be carried in the plating solution. As a result, gas bubbles and/or particles can flow to the surface of the workpiece 5, which disrupts the uniformity and affects the quality of the plated layer.

Still another challenge of designing electrochemical processing stations for plating uniform layers is providing a desired electrical field at the surface of the workpiece 5. The distribution of electrical current in the plating solution is a function of the uniformity of the seed layer across the contact surface, the configuration/condition of the anode, and the configuration of the chamber. However, the current density profile on the plating surface can change. For example, the current density profile typically changes during a plating cycle because plating material covers the seed layer, or it changes over a longer period of time because the shape of consumable anodes changes as they erode and the concentration of constituents in the plating solution can change. Therefore, it can be difficult to maintain a desired current density at the surface of the workpiece 5.

Still another concern of electrochemical processing stations is that they are typically optimized for use with a single size of workpiece. The anode 4 and the diffuser 6 will accordingly have a size and shape that is specific to a particular size of workpiece. Using an anode 4 and a diffuser 6 designed for one size of workpiece to process a differently sized workpiece 5 will yield inconsistent and generally undesirable results. For example, a semiconductor wafer having a 150 mm diameter is small enough to fit in a processing station 1 designed for a 200 mm diameter wafer, but even if the workpiece holder 9 was modified to hold a 150 mm wafer, the flow patterns and electric field characteristics designed for a 200 mm wafer would yield an uneven plated layer on the smaller 150 mm wafer.

As a result, adapting a processing station 1 to handle a differently sized workpiece 5 typically requires substantial modification of the plating stations because it usually involves replacing at least the anode 4 and the diffuser 6. Replacing these parts, however, is frequently more difficult and time consuming than the simple schematic diagram of FIG. 1 would imply. This requires stocking separate supplies of differently-sized anodes and diffusers, and it also requires a significant amount of downtime to remove the anode/diffuser pair for one type of workpiece and then install an anode/diffuser pair for a different workpiece. If the anodes 4 are consumable, replacing them is complicated by the fact that they require maintenance of a passivated film layer for consistent operation. As a consequence, manufacturers typically optimize the processing station to process a single size workpiece and leave it unchanged. If the manufacturer wishes to produce two different sizes of workpieces, the manufacturer will commonly purchase an entirely separate processing machine so that each machine need only handle one size.

FIG. 1B illustrates an apparatus 10 for single-wafer processing in accordance with one embodiment of an LT-210C available from Semitool, Inc. of Kalispell, Mont. The apparatus 10 includes a housing 11 that encloses a plurality of processing chambers 20 and a workpiece loader 12 that receives containers 13 filled with microelectronic workpieces 5. The apparatus 10 also includes a transfer device 15 that removes the workpieces 14 from the containers 13, moves the workpieces 5 among the processing chambers 20, and returns the processed workpieces 5 to the containers 13. The transfer device 15, for example, can include a pair of robots 16 that move along opposite sides of a track 17. The robots 16 can move along the linear track independently from each other, and each robot can have an arm 18 and an end effector 19 carried by the arm. Existing linear track systems are shown in U.S. Pat. No. 5,571,325 issued to Ueyama, et al., PCT Publication No. WO 00/022808 and U.S. patent application Ser. Nos. 09/386,566; 09/386,590; 09/386,568; and 09/759,998, all of which are herein incorporated in their entirety by reference. Instead of the system shown in FIG. 1B, the transfer device can be a rotary system having one or more robots that rotate about a fixed location in the plating tool. One existing rotary transfer mechanism is shown in U.S. Pat. No. 6,136,163 issued to Cheung, et al. Many rotary and linear transfer mechanisms have a plurality of individual robots that can each independently access most, if not all, of the processing stations within an individual tool to increase the flexibility and throughput of the plating tool.

One concern of existing transfer mechanisms is that the wafers may collide with one another as the transfer mechanisms handle wafers within a tool. Because many processing apparatus have a plurality of individual robots that move independently from each other to access many processing chambers within a single apparatus, the motion of the individual robots must be orchestrated so that the workpieces do not collide with each other or components of the tool. This typically requires complex algorithms in the software for controlling the motion of the workpieces that define the "rules" of movement so that one robot does not conflict with another robot. The complexity of the software often necessitates significant processor capabilities and processing time, which accordingly increases the cost of the processing tools and reduces the throughput of workpieces. Additionally, errors in determining the position of the workpieces, executing the software, or calibrating the system can result in collisions between workpieces. Thus, it would be desirable to avoid collisions with workpieces in a manner that does not adversely impact other parameters of the processing apparatus.

Another concern of existing transfer mechanisms is that they typically have complex mechanical and electrical assemblies with several components. This increases the risk that a component may malfunction, causing downtime of the entire processing machine and/or collisions that damage the workpieces. Therefore, it would be desirable to reduce the complexity of the transfer mechanisms.

Yet another aspect of existing transfer mechanisms is that they may not provide sufficient freedom of motion of the workpieces. Although many robots have been developed that have six degrees of freedom, many of these robots are not used in processing apparatus for fabricating microelectronic workpieces because the additional degrees of freedom increase the complexity of the systems. As a result, many existing transfer mechanisms limit one or more motions of the robots, such as limiting the vertical motion of the robots. It will be appreciated that it would be desirable to maintain the freedom of motion for the robots while also reducing the probability of collisions between the workpieces and the complexity of the robots.

As shown in FIG. 1B, the apparatus 10 also includes a central power supply 30 that receives, for example, AC power and converts the AC power to other waveforms for use throughout the tool. For example, the output of the power supply 30 is provided to each of the electrodes in the plating chambers. Additional power supplies are generally used to operate solenoid valves 50 for directing fluid to and from the processing chambers 20, the workpiece loader 12 (to drive the motors and actuators that move and access the containers 13), and to two head controllers 40 (one of which is visible in FIG. 1B). The head controllers 40 are coupled to the processing chambers 20 to drive the motors that open, close, and otherwise operate the chambers 20.

The power provided from the power supply 30 to the electrodes in the processing chambers and the power provided from other power sources to other components of the tool are conducted along a power distribution network that typically comprises a variety of cable types that have different electrical characteristics (i.e., physical construction, impedance, electromagnetic coupling, noise immunity, etc.). Although variation in the electrical characteristics of the cables may be tolerable for the power conducted to the motors used in processing chambers, even subtle variations between the electrical characteristics of the power provided to the electrodes in electrochemical processing chambers can result in substantial differences and inconsistencies in the wafers.

One characteristic of some power distribution networks is that the power distribution lines used to provide power to electrodes in a first processing chamber may have different electrical characteristics than the power distribution lines that provide power to electrodes in a second electrochemical processing chamber. Further, the power distribution lines that provide power to the electrodes in the processing chambers may be electromagnetically coupled to other power distribution lines in the power distribution network. The signals transmitted to one processing chamber over one power line, for example, can be inductively and/or capacitively coupled with signals transmitted to other components. Many applications compensate for such inductive and/or capacitive coupling by shielding the power lines, but even shielding may not provide adequate protection in some instances. As a result, different processing chambers often effectively receive different chemical processing power signals.

SUMMARY

One aspect of the present invention is directed toward versatile processing tools that can be reconfigured to processes microelectronic workpieces having different sizes, such as 200 mm or 300 mm, without substantial, time-consuming modifications of the processing stations in the tool. The present inventors recognized that many microelectronic device fabricators are interested in using 300 mm workpieces, but some fabricating processes are not ready for 300 mm applications and it is expensive to replace all of the equipment in a line to process 300 mm workpieces. The fabricators are thus postponing purchases of certain types of processing equipment (e.g., electroplating tools and cleaning tools) that are otherwise ready for processing 300 mm workpieces. As such, several aspects of selected embodiments of the invention are directed toward providing tools that can be easily configured to process either a workpiece having a first size (e.g., 200 mm) or a second size (e.g., 300 mm) so that fabricators can "bridge-the-gap" in the transition to using 300 mm workpieces. The fabricators can accordingly take advantage of tools that incorporate the latest technological advancements for processing microelectronic workpieces without being limited to processing workpieces having only a single size.

One embodiment of an inventive processing tool includes a cabinet or other platform defining at least one enclosed interior region, a plurality of workpiece processing stations in the interior region that treat at least one surface of a workpiece, a transfer mechanism for carrying workpieces within the interior region, and a plurality of modular lift/rotate mechanisms coupled to corresponding processing stations. The processing stations, for example, can be electrochemical plating chambers (electrical or electroless) and/or cleaning chambers (rinse, spin/rinse, etch/clean, etc.). The tool can accordingly be an electroplating tool, a cleaning and/or etching tool, a combination plating and cleaning tool, or another type of tool that uses one or more types of processing stations. In one embodiment, the tool includes electrochemical processing chambers having reaction vessels with components that can be changed-out quickly to reconfigure the reaction vessels for processing workpieces having different sizes. For example, the tool can have a first dielectric insert that shapes the electrical field to process a first workpiece having a first size and a second dielectric insert that shapes the electrical field to process a second workpiece having a second size. The first and second dielectric workpieces can be interchangeable such that one can be removed and replaced by the other without having to further modify other components in the reaction vessel. This allows the reaction vessel to be reconfigured quickly and easily for processing different types of workpieces without having to significantly change other aspects of the tool.

The transfer mechanism can include a transport unit configured to move within the interior region, at least one arm coupled to the transport unit, and at least one end-effector coupled to the transport unit. The transfer unit provides a system in which the workpieces are spaced apart from each other within the interior so that they cannot collide with each other or another part of the transfer mechanism to reduce the complexity of the software for controlling the end-effectors, and yet the workpieces can be superimposed with each other to reduce the space within the interior region that is needed for moving two workpieces between the processing stations. The transfer unit, for example, can be configured to move along a linear track within the interior region and/or rotate relative to a fixed position or the linear track. The arm can be a single arm attached to the transport unit to move along a lift path to change the vertical position of the arm, and the transfer mechanism can include a first end-effector and a second end-effector rotatably coupled to the arm to rotate about at least one rotation axis generally parallel to the lift path. The first end-effector can be spaced apart from the arm by a first distance and the second end-effector can be spaced apart from the arm by a second distance such that the first and second end-effectors rotate through different planes relative to the arm. As a result, the transfer mechanism provides a high-degree of freedom of motion without complex collision avoidance algorithms such that it can handle workpieces of different sizes by simply changing the size of the end-effectors and providing relatively minor changes to motion control algorithms.

The lift/rotate mechanisms are individually coupled to corresponding processing heads of the processing stations. Several embodiments of lift/rotate mechanisms can be tilted outward from the interior region or removed from the tool without opening or removing all of the panels of the cabinet to provide easy access to the components of the processing stations for servicing or reconfiguring the processing stations to handle workpieces having a different size. The lift/rotate mechanisms can also include separate access panels and doors that provide access to the mechanical and/or electrical control components of each lift/rotate mechanism such that an individual lift/rotate mechanism can be serviced or repaired without opening the large panels of the lower compartment where the chemicals for the plating and/or cleaning solutions are stored. This feature inhibits chemical vapors in the lower portion of the cabinet from escaping into the clean room.

Another aspect of the invention is directed toward processing tools with reaction vessels that (a) shield the workpiece from the electrodes, (b) provide a uniform mass transfer at the surface of the workpiece, (c) enable manipulation of the electrical field, and/or (d) prevent selected matter from contacting the workpiece. In one embodiment, the reaction vessel can include dielectric electrode compartments and interface members coupled to the electrode compartments to prevent selected matter from contacting the workpiece and/or the electrodes. The interface members, for example, can be filters that entrap particles and prevent bubbles in the plating solution from passing to the workpiece. As a result, particles that break away from consumable electrodes cannot reach the surface of the workpiece. The interface members can alternatively be ion-membranes that are either permeable or impermeable to the fluids in the reaction vessel. The interface members can allow only selected ions to pass between the electrodes and the workpiece such that the electrode compartments are not in fluid communication with the workpiece. This feature allows one type of fluid to be used in the electrode compartments and a different type of fluid to be used in the area next to the workpiece, which reduces the need to replenish additives to the fluids as often and adds more flexibility to designing electrodes and other features of the reaction vessel. These reaction vessels can be configured to be used in the "bridge-tools" by making the field shaping units into inserts having different virtual electrodes that create different electrical fields according to the size and shape of the workpiece, or these reaction vessels can be used in tools dedicated to processing a single size of workpieces.

Additionally, either aspect of the tool can include individual power supplies that are coupled to the reaction vessels by links that have at least substantially identical electrical properties. In one embodiment, the dedicated power supplies are positioned in the tool such that the links have at least substantially the same length and the links are spaced apart from other electrical lines that are coupled to the motors for moving the workpieces. This enhances the consistency of the electrical properties of the links, and it also reduces interference with the signals carried by the links caused by capacitive or inductive coupling.

The various subassemblies of the tool also provide significant improvements that are unique apart from the combination of the subassemblies in the tool. For example, embodiments of the reaction vessels, transfer devices, lift/rotate assemblies and dedicated power supplies each have unique attributes that are independent of one another and yet can be combined together because the independent attributes compliment each other in the overall operation of several embodiments of tools in accordance with the invention.

DETAILED DESCRIPTION

Figure 1A:
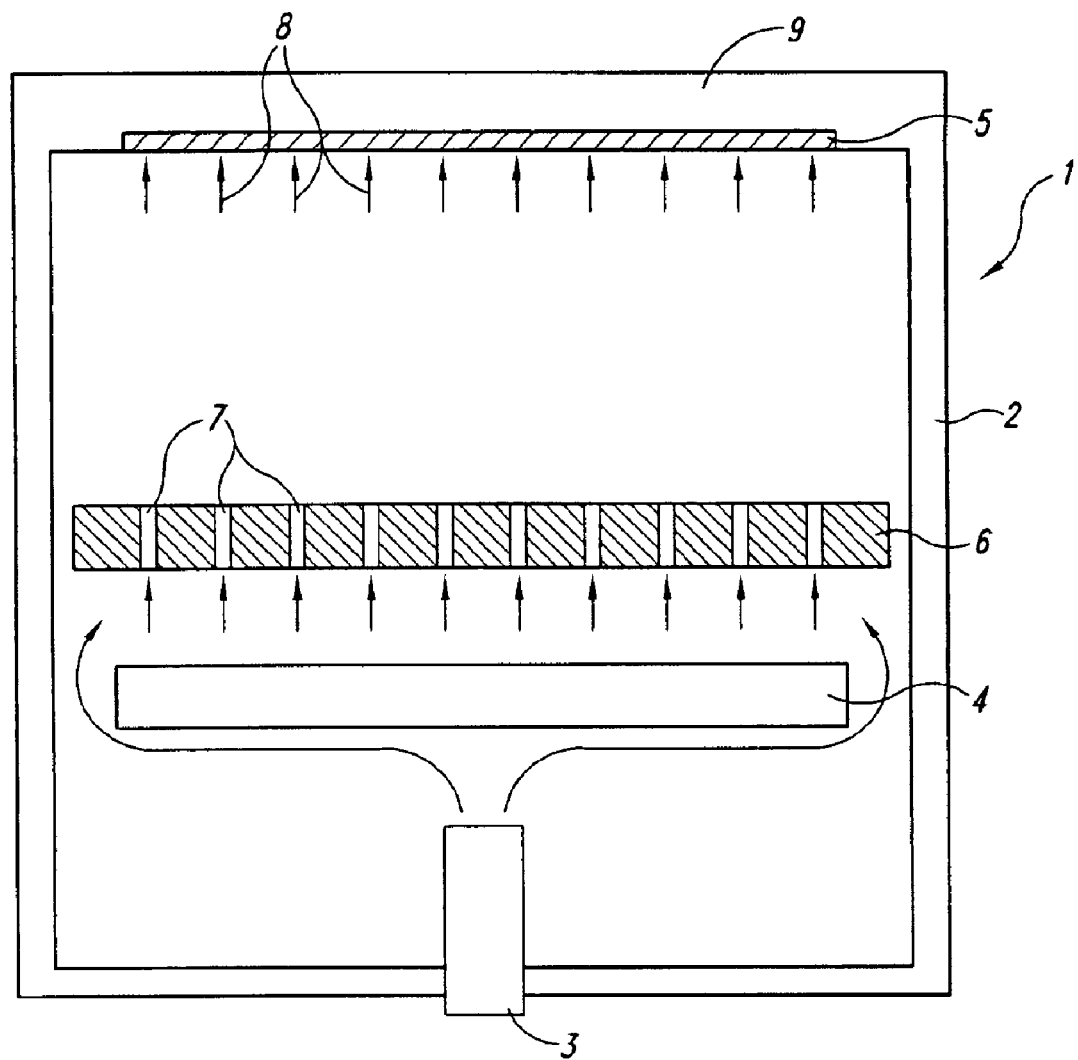
FIG. 1A is a schematic diagram of an electroplating chamber in accordance with the prior art.

The following description discloses the details and features of several aspects of electrochemical processing reaction vessels tools and components of such tools for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 2–32.

Integrated tools in accordance with the invention have several different subassemblies that are independently unique and yet compliment each other when combined together in a single integrated tool platform. For example, one particularly useful line of integrated tools are "bridge tools" that have processing stations which can process workpieces having one size and then can be readily reconfigured to process different workpieces having a different size. The bridge tools, for example, can include electrochemical processing stations that have reaction vessels with interchangeable inserts which define different electrical fields for different sized workpieces and can be quickly interchanged for one another. One subassembly of these tools is a reaction vessel with virtual electrodes that create an electrical field in accordance with the size and/or shape of the workpiece. Other subassemblies that can be used with the tool include transfer mechanisms for providing fast, collision-free handling of the workpieces within the tool, dedicated power supplies for providing accurate electrical signals to electrode(s) in the reaction vessels, and lift/rotate assemblies for providing quick, easy access to the processing stations in the tool or components of the lift/rotate assemblies.

The operation and features of tools and the various subassemblies are best understood in light of the environment and equipment in which they can be used to electrochemically process workpieces (e.g., electroplate and/or electropolish). As such, embodiments of integrated tools for electrochemical processing are initially described with reference to FIGS. 2 and 3. The details and features of several embodiments of (a) electrochemical reaction vessels and methods for adapting the vessels to process different types of workpieces are then described with reference to FIGS. 4–13; (b) transfer devices for transporting the workpieces are described with reference to FIGS. 14A–20; (c) power distribution systems for providing power to electrodes in the reaction vessels are described with respect to FIGS. 21–23; and (d) lift/rotate/tilt assemblies are described with respect to FIGS. 24–32.

A. Selected Embodiments of Integrated Tools

Figure 2:
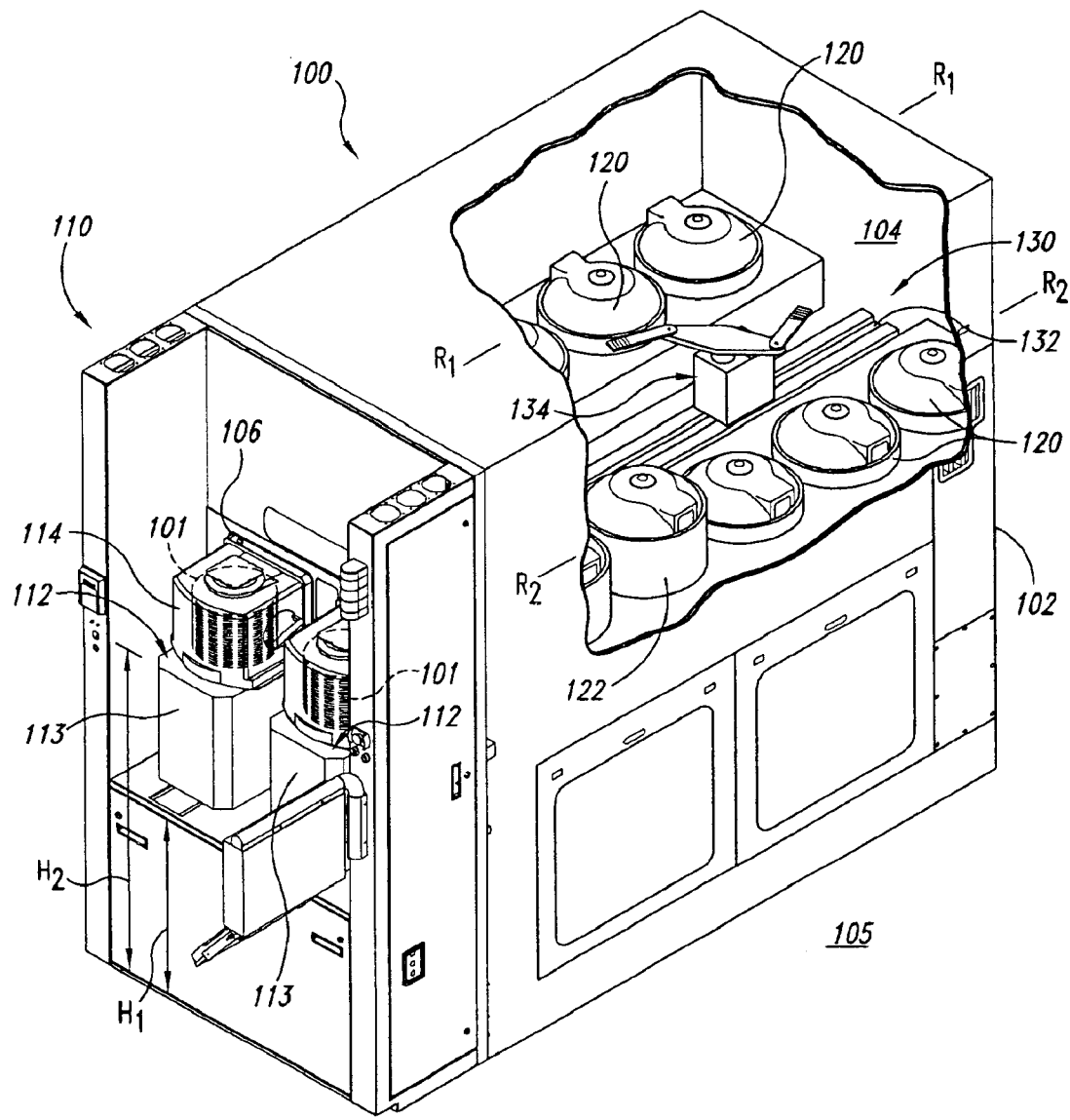
FIG. 2 is an isometric view of an electroprocessing machine having electroprocessing stations for processing microelectronic workpieces in accordance with an embodiment of the invention.

FIG. 2 is an isometric view of a processing machine 100 having an electrochemical processing station 120 and a transfer device 130 in accordance with an embodiment of the invention. A portion of the processing machine 100 is shown in a cut-away view to illustrate selected internal components. In one aspect of this embodiment, the processing machine 100 can include a cabinet 102 having an interior region 104 defining an interior enclosure that is at least partially isolated from an exterior region 105. The cabinet 102 can also include a plurality of apertures 106 through which microelectronic workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing machine 100 can also include a plurality of electrochemical processing stations 120 and the transfer device 130 in the interior region 104 of the cabinet 102. The processing machine 100, for example, can be a plating tool that also includes clean/etch capsules 122, electroless plating stations, annealing stations, and/or metrology stations.

The transfer device 130 includes a linear track 132 extending in a lengthwise direction of the interior region 104 between the processing stations. The transfer device 130 can further include a robot unit 134 carried by the track 132. In the particular embodiment shown in FIG. 2, a first set of processing stations is arranged along a first row $R_1$—$R_1$ and a second set of processing stations is arranged along a second row $R_2$—$R_2$. The linear track 132 extends between the first and second rows of processing stations, and the robot unit 134 can access any of the processing stations along the track 132.

Figure 3:
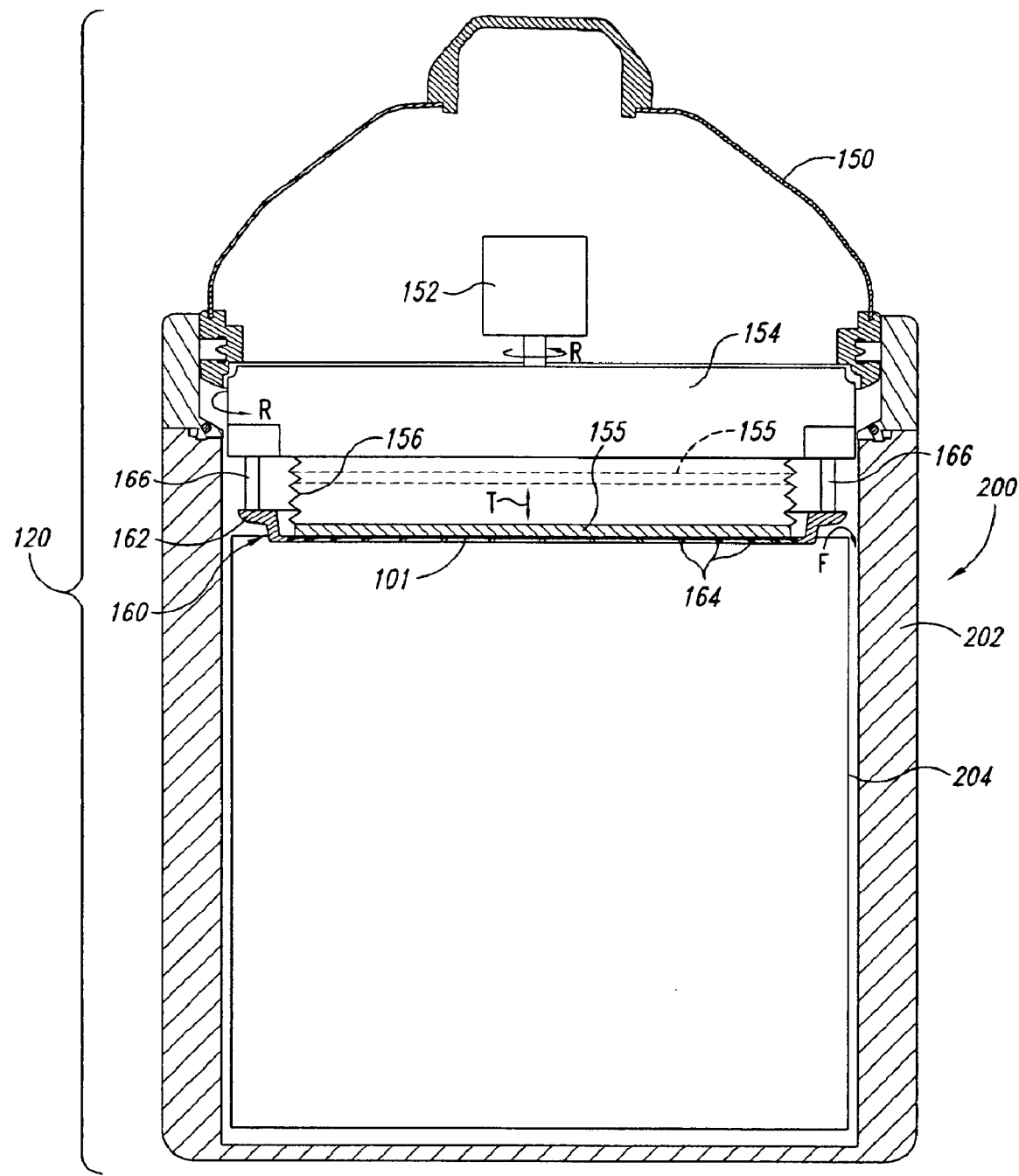
FIG. 3 is a cross-sectional view of an electroprocessing station having a processing chamber for use in an electroprocessing machine in accordance with an embodiment of the invention. Selected components in FIG. 3 are shown schematically.

FIG. 3 illustrates an embodiment of an electrochemical-processing chamber 120 having a head assembly 150 and a processing chamber 200. The head assembly 150 includes a spin motor 152, a rotor 154 coupled to the spin motor 152, and a contact assembly 160 carried by the rotor 154. The rotor 154 can have a backing plate 155 and a seal 156. The backing plate 155 can move transverse to a workpiece 101 (arrow T) between a first position in which the backing plate 155 contacts a backside of the workpiece 101 (shown in solid lines in FIG. 3) and a second position in which it is spaced apart from the backside of the workpiece 101 (shown in broken lines in FIG. 3). The contact assembly 160 can have a support member 162, a plurality of contacts 164 carried by the support member 162, and a plurality of shafts 166 extending between the support member 162 and the rotor 154. The contacts 164 can be ring type spring contacts or other types of contacts that are configured to engage a portion of the seed-layer on the workpiece 101. Commercially available head assemblies 150 and contact assemblies 160 can be used in the electroprocessing chamber 120. Particular suitable head assemblies 150 and contact assemblies 160 are disclosed in U.S. Pat. Nos. 6,228,232 and 6,080,691; and U.S. application Ser. Nos. 09/385,784; 09/386,803; 09/386,610; 09/386,197; 09/501,002; 09/733,608; and 09/804,696, all of which are herein incorporated by reference.

The processing chamber 200 includes an outer housing 202 (shown schematically in FIG. 3) and a reaction vessel 204 (also shown schematically in FIG. 3) in the housing 202. The reaction vessel 204 carries at least one electrode (not shown in FIG. 3) and directs a flow of electroprocessing solution to the workpiece 101. The electroprocessing solution, for example, can flow over a weir (arrow F) and into the external housing 202, which captures the electroprocessing solution and sends it back to a tank. Several embodiments of reaction vessels 204 are shown and described in detail with reference to FIGS. 4–13.

In operation the head assembly 150 holds the workpiece at a workpiece processing site of the reaction vessel 204 so that at least a plating surface of the workpiece engages the electroprocessing solution. An electrical field is established in the solution by applying an electrical potential between the plating surface of the workpiece via the contact assembly 160 and one or more electrodes in the reaction vessel 204. For example, the contact assembly 160 can be biased with a negative potential with respect to the electrode(s) in the reaction vessel 204 to plate materials onto the workpiece. On the other hand the contact assembly 160 can be biased with a positive potential with respect to the electrode(s) in the reaction vessel 204 to (a) de-plate or electropolish plated material from the workpiece or (b) deposit other materials (e.g., electrophoric resist). In general, therefore, materials can be deposited on or removed from the workpiece with the workpiece acting as a cathode or an anode depending upon the particular type of material used in the electrochemical process.

Figure 4:
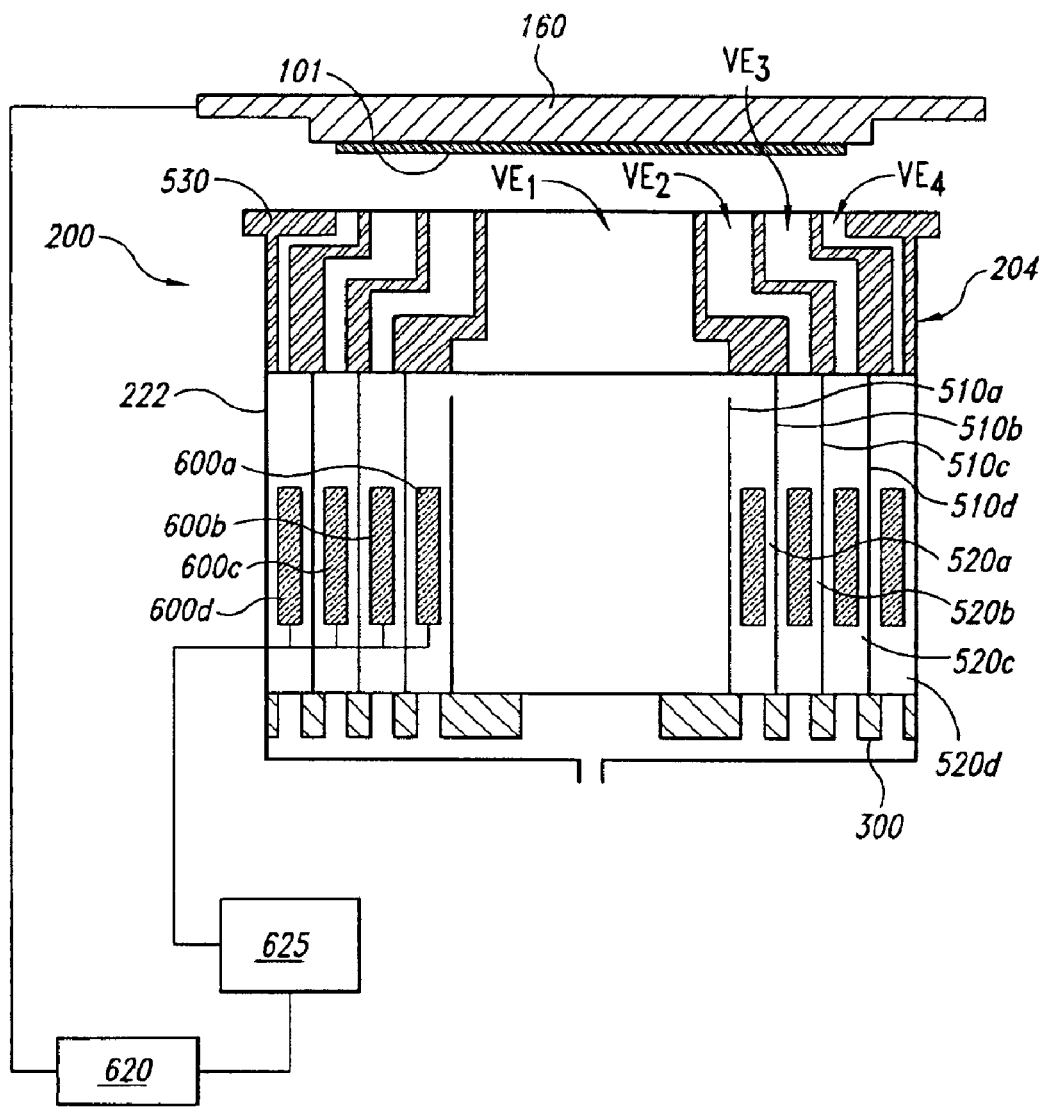
FIG. 4 is a schematic cross-sectional view of an electrochemical processing chamber in accordance with one embodiment of the invention.
Figure 5:
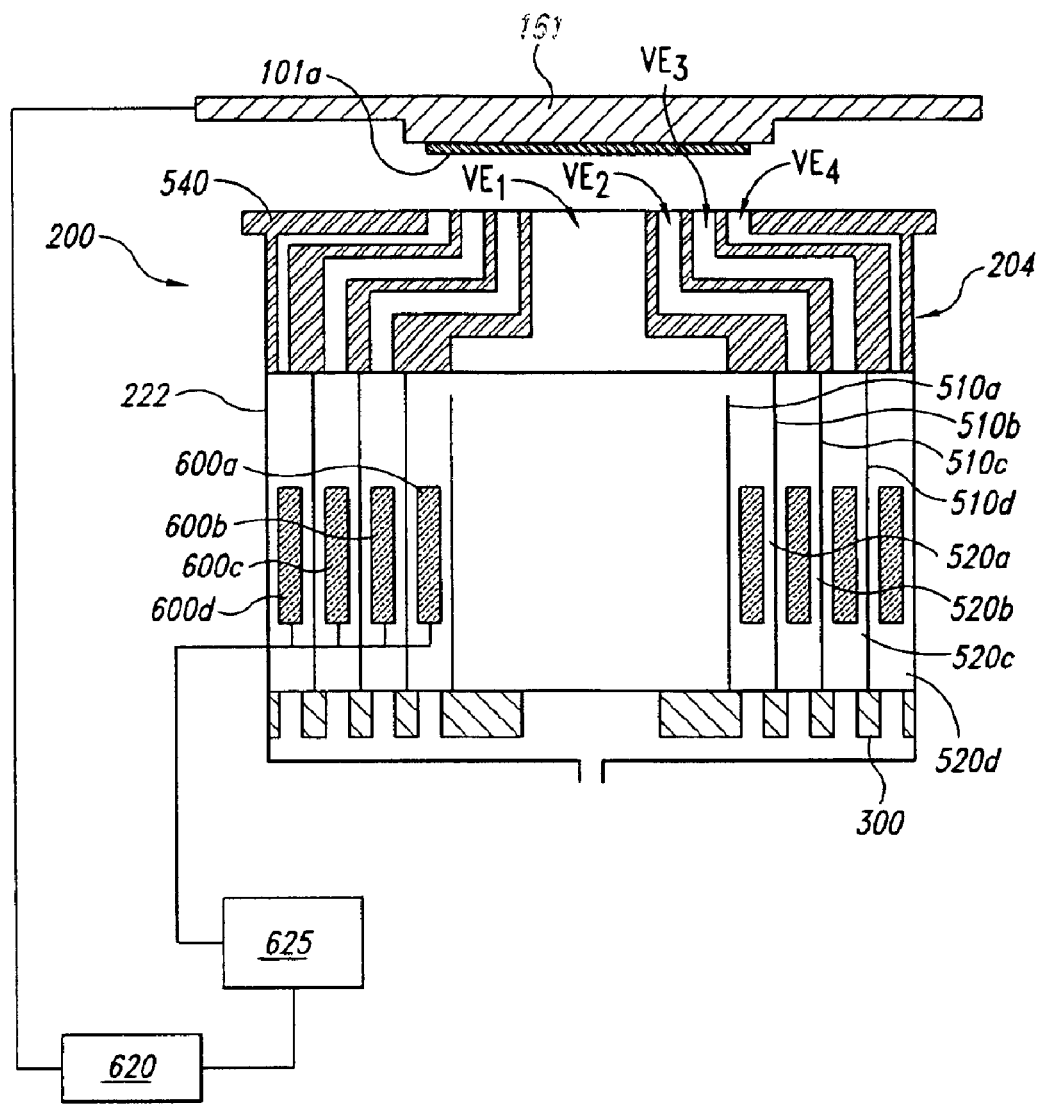
FIG. 5 is a schematic cross-sectional view of the electrochemical processing chamber of FIG. 4 modified to process a differently-sized workpiece.

B. Selected Embodiments of Reaction Vessels for use in Electrochemical Processing Chambers FIGS. 4, 5 and 13 schematically illustrate aspects of processing chambers 200 in accordance with certain embodiments of the invention. Several embodiments of reaction vessels 204 for use in processing chambers 200 are shown in more detail in FIGS. 6–12. Several embodiments of reaction vessels in accordance with the invention solve the problem of providing a desired mass transfer at the workpiece by configuring the electrodes so that a primary flow guide and/or a field shaping unit in the reaction vessel direct a substantially uniform primary fluid flow toward the workpiece. Additionally, field shaping units in accordance with several embodiments of the invention create virtual electrodes such that the workpiece is shielded from the electrodes. This allows for the use of larger electrodes to increase electrode life, eliminates the need to "burn-in" electrodes to decrease downtime, and/or provides the capability of manipulating the electrical field by merely controlling the electrical current to one or more of the electrodes in the vessel. Furthermore, additional embodiments of the invention include interface members in the reaction vessel that inhibit particulates, bubbles and other undesirable matter in the reaction vessel from contacting the workpiece to enhance the uniformity and the quality of the finished surface on the workpieces. The interface members can also allow two different types of fluids to be used in the reaction vessel, such as a catholyte and an anolyte, to reduce the need to replenish additives as often and to add more flexibility to designing electrodes and other components in the reaction vessel.

In one embodiment of the invention, a reaction vessel includes an outer container having an outer wall, a first outlet configured to introduce a primary fluid flow into the outer container, and at least one second outlet configured to introduce a secondary fluid flow into the outer container separate from the primary fluid flow. The reaction vessel can also include a field shaping unit in the outer container and at least one electrode. The field shaping unit can be a dielectric assembly coupled to the second outlet to receive the secondary flow and configured to contain the secondary flow separate from the primary flow through at least a portion of the outer container. The field shaping unit also has at least one electrode compartment through which the secondary flow can pass separately from the primary flow. The electrode is positioned in the electrode compartment.

In a particular embodiment, the field shaping unit has a compartment assembly having a plurality of electrode compartments and a virtual electrode unit. The compartment assembly can include a plurality of annular walls including an inner or first annular wall centered on a common axis and an outer or second annular wall concentric with the first annular wall and spaced radially outward. The annular walls of the field shaping unit can be positioned inside of outer wall of the outer container so that an annular space between the first and second walls defines a first electrode compartment and an annular space outside of the second wall toward the outer wall defines a second electrode compartment. The reaction vessel of this particular embodiment can have a first annular electrode in the first electrode compartment and/or a second annular electrode in the second electrode compartment.

The virtual electrode unit can include a plurality of partitions that have lateral sections attached to corresponding annular walls of the electrode compartment and lips that project from the lateral sections. In one embodiment, the first partition has an annular first lip that defines a central opening, and the second partition has an annular second lip surrounding the first lip that defines an annular opening.

In additional embodiments, the reaction vessel can further include a distributor coupled to the outer container and a primary flow guide in the outer container. The distributor can include the first outlet and the second outlet such that the first outlet introduces the primary fluid flow into the primary flow guide and the second outlet introduces the secondary fluid flow into the field shaping unit separately from the primary flow. The primary flow guide can condition the primary flow for providing a desired fluid flow to a workpiece processing site. In one particular embodiment, the primary flow guide directs the primary flow through the central opening of the first annular lip of the first partition. The secondary flow is distributed to the electrode compartments of the field shaping unit to establish an electrical field in the reaction vessel.

In the operation of one embodiment, the primary flow can pass through a first flow channel defined, at least in part, by the primary flow guide and the lip of the first partition. The primary flow can be the dominant flow through the reaction vessel so that it controls the mass transfer at the workpiece. The secondary flow can generally be contained within the field shaping unit so that the electrical field(s) of the electrode(s) are shaped by the virtual electrode unit and the electrode compartments. For example, in the embodiment having first and second annular electrodes, the electrical effect of the first electrode can act as if it is placed in the central opening defined by the lip of the first partition, and the electrical effect of the second electrode can act as if it is placed in the annular opening between the first and second lips. The actual electrodes, however, can be shielded from the workpiece by the field shaping unit such that the size and shape of the actual electrodes does not affect the electrical field perceived by the workpiece.

One feature of several embodiments is that the field shaping unit shields the workpiece from the electrodes. As a result, the electrodes can be much larger than they could without the field shaping unit because the size and configuration of the actual electrodes does not appreciably affect the electrical field perceived by the workpiece. This is particularly useful when the electrodes are consumable anodes because the increased size of the anodes prolongs their life, which reduces downtime for servicing a tool. Additionally, this reduces the need to "burn-in" anodes because the field shaping element reduces the impact that films on the anodes have on the shape of the electrical field perceived by the workpiece. Both of these benefits significantly improve the operating efficiency of the reaction vessel.

Another feature of several embodiments of the invention is that they provide a uniform mass transfer at the surface of the workpiece. Because the field shaping unit separates the actual electrodes from the effective area where they are perceived by the workpiece, the actual electrodes can be configured to accommodate internal structure that guides the flow along a more desirable flow path. For example, this allows the primary flow to flow along a central path. Moreover, a particular embodiment includes a central primary flow guide that projects the primary flow radially inward along diametrically opposed vectors that create a highly uniform primary flow velocity in a direction perpendicular to the surface of the workpiece.

The reaction vessel can also include an interface member carried by the field shaping unit downstream from the electrode. The interface member can be in fluid communication with the secondary flow in the electrode compartment. The interface member, for example, can be a filter and/or an ion-membrane. In either case, the interface member can inhibit particulates (e.g., particles from an anode) and bubbles in the secondary flow from reaching the surface of the workpiece to reduce non-uniformities on the processed surface. This accordingly increases the quality of the surface of the workpiece. Additionally, in the case of an ion-membrane, the interface member can be configured to prevent fluids from passing between the secondary flow and the primary flow while allowing preferred ions to pass between the flows. This allows the primary flow and the secondary flow to be different types of fluids, such as a catholyte and an anolyte, which reduces the need to replenish additives as often and adds more flexibility to designing electrodes and other features of the reaction vessel.

Referring to FIG. 4, the processing chamber 200 includes a reaction vessel 204 positioned beneath a contact assembly 160. The contact assembly 160 carries a workpiece 101 which may be brought into contact with the electroprocessing solution in the reaction vessel 204. For ease of explanation, FIG. 4 shows the contact assembly 160 and workpiece 101 spaced above the position they would occupy with respect to the reaction vessel in processing the workpiece.

The reaction vessel 204 of FIG. 4 has a plurality of annular electrodes 600a–d received therein. This particular embodiment employs four separate electrodes 600a–d, but it should be understood that any number of electrodes could be employed. While it is anticipated that there will be at least one electrode, there can be more than the four electrodes shown in FIG. 4. The electrodes may be connected to a common power supply 610, or each of the electrodes 600 may be provided with a separate power supply. FIG. 4 shows a power supply 610 electrically coupled to the contact assembly and to a power supply controller 625, which may independently control the power delivered to each of the electrodes 600a–d. In this fashion, a desired potential may be created between the workpiece 101 and each of the electrodes 600.

The electrodes 600 in FIG. 4 are housed in electrically separate electrode compartments 520. In particular, a first electrode compartment 520a is defined by a first wall 510a and a second wall 510b, a second electrode compartment 520b is defined by the second wall 510b and a third wall 510c, a third electrode compartment 520c is defined by the third wall 510c and a fourth wall 510d, and a fourth electrode compartment 520d is defined by the fourth wall 510d and the outer wall 222 of the reaction vessel 204. The walls 510a–d of this embodiment are concentric annular dividers that define annular electrode compartments 520a–d.

The processing chamber 200 also includes a virtual electrode unit 530 which individually shapes the electrical fields produced by the electrodes 600a–d. This virtual electrode unit 530 may define one or more "virtual electrodes" that define the effective shape, size and position of the electrical field perceived by the workpiece. In one embodiment of the invention, the virtual electrode unit 530 defines a separate virtual electrode associated with each of the electrode compartments 520a–d. Hence, a first virtual electrode $VE_1$ is associated with the first electrode compartment 520a, a second virtual electrode $VE_2$ is associated with the second electrode compartment 520b, a third virtual electrode $VE_3$ is associated with the third electrode compartment 520c, and a fourth virtual electrode $VE_4$ is associated with the fourth electrode compartment 520d. Each of the virtual electrodes VE may be electrically connected to the electrode 600 received in the associated electrode compartment 520.

In one embodiment, the virtual electrodes VE are electrically associated with the electrode 600 in the associated electrode compartment 520 via flow of an electrically conductive processing fluid through the electrode compartment. As a result, each of the virtual electrodes VE receive an electrical potential with respect to the workpiece 101 from the associated electrode 600. Processing fluid may be delivered to the various electrode compartments via a distributor 300. For example, fluid from the distributor 300 will flow upwardly through the fourth electrode compartment 520d, passing over the fourth electrode 600d, then flow upwardly through the fourth virtual electrode $VE_4$ via a flow conduit in the virtual electrode unit 530. In this embodiment, therefore, the shape and size of each virtual electrode is defined by the shape and size of an opening in the virtual electrode unit 530 in fluid communication with one of the electrode compartments. Other embodiments of the invention may utilize virtual electrodes which need not be defined by the passage of fluid through an opening. As explained below in connection with FIG. 8, for example, ion-permeable membranes may limit the passage of bulk fluid from the electrode compartments 520b–d, instead merely passing ions through the membrane and to the associated virtual electrode.

In one embodiment, one or more of the walls 510a–d are coupled to the virtual electrode unit 530 to define a field shaping unit 500. Coupling the walls 510 to the virtual electrode unit 530 allows the field shaping unit to be removed from the reaction vessel as a unit. In one embodiment detailed below, the electrodes 600 remain in place in the reaction vessel 204 when the field shaping unit 500 is removed. If so desired, however, the electrodes 600 may be carried by the field shaping unit 500, such as by attaching electrodes 600 to the walls 510 or providing an electrically conductive coating on the walls 510 which can be electrically coupled to the power supply 620 or power supply controller 625 when the walls 510 are received in the reaction vessel 204 for processing a workpiece.

FIG. 5 illustrates the processing chamber 200 of FIG. 4, also in a schematic fashion. In FIG. 5, however, the processing chamber 200 has been modified to process a workpiece 101a which is smaller than the workpiece 101 shown in FIG. 4. Many features of the processing chamber 200 shown in FIG. 5 can be the same as those described in connection with FIG. 4, and thus like reference numbers refer to like parts in these Figures. The primary differences between the embodiment of FIG. 4 and the embodiment of FIG. 5 relate to the contact assembly and the virtual electrode assembly. In particular, the contact assembly 161 of FIG. 5 is adapted to hold a smaller workpiece than is the contact assembly 160 of FIG. 4 and the virtual electrode unit 540 in FIG. 5 defines a different arrangement of virtual electrodes VE than does the virtual electrode unit 530 of FIG. 4.

The virtual electrode unit 530 in FIG. 4 has virtual electrodes $VE_{1-4}$ which are sized and have relative positions adapted to process the larger first workpiece 101. The virtual electrodes $VE_{1-4}$ of the virtual electrode unit 540 in FIG. 5 may have different sizes and/or relative positions from the virtual electrodes $VE_{1-4}$ in the virtual electrode unit 530 in FIG. 4. In particular, the virtual electrodes VE of FIG. 4 may be optimized for processing the first workpiece 101 whereas the virtual electrodes VE of FIG. 5 may be optimized for processing the second workpiece 101a. As a consequence, the effective electrical field in the vicinity of the workpiece can be changed depending on the particular needs of different workpieces.

The processing chamber 200 may be modified from the configuration shown in FIG. 4 to the configuration shown in FIG. 5 by replacing the contact assembly 160 with a new contact assembly 161 and by replacing the virtual electrode unit 530 with a new virtual electrode unit 540. In some circumstances, it may not be necessary to replace the contact assembly, for example, when the two workpieces 101 and 101a are the same size, but have different processing requirements requiring different electrical fields. Hence, the processing chamber 200 can be quickly and easily modified from one configuration adapted to process a first workpiece 101 to a different configuration adapted to process a second workpiece 101a simply by replacing one virtual electrode unit 530 with a different virtual electrode unit 540. If the walls 510 are coupled to the virtual electrode unit 530 for removal of the field shaping unit 500 as a unit, the other virtual electrode unit 540 may also have walls 510 coupled thereto to define a different field shaping unit which can be placed in the reaction vessel 204 in the same position previously occupied by the previous field shaping unit 500. Similarly, if the electrodes 600 are carried by the walls 510 of the initial field shaping unit 500 shown in FIG. 4 for removal therewith as a unit, the replacement field shaping unit may also have electrodes 600 carried by its walls 510.

Hence, in accordance with several embodiments of the invention, a processing chamber 200 can be modified to process different workpieces in a simple, straightforward manner. In one embodiment explained below, this simplifies modifying an existing processing chamber 200 from a first configuration for treating a first workpiece to a second configuration for treating a different second workpiece. In another embodiment explained below, this enables a manufacturer greater flexibility in manufacturing processing lines customized to treat different workpieces.

Figure 6:
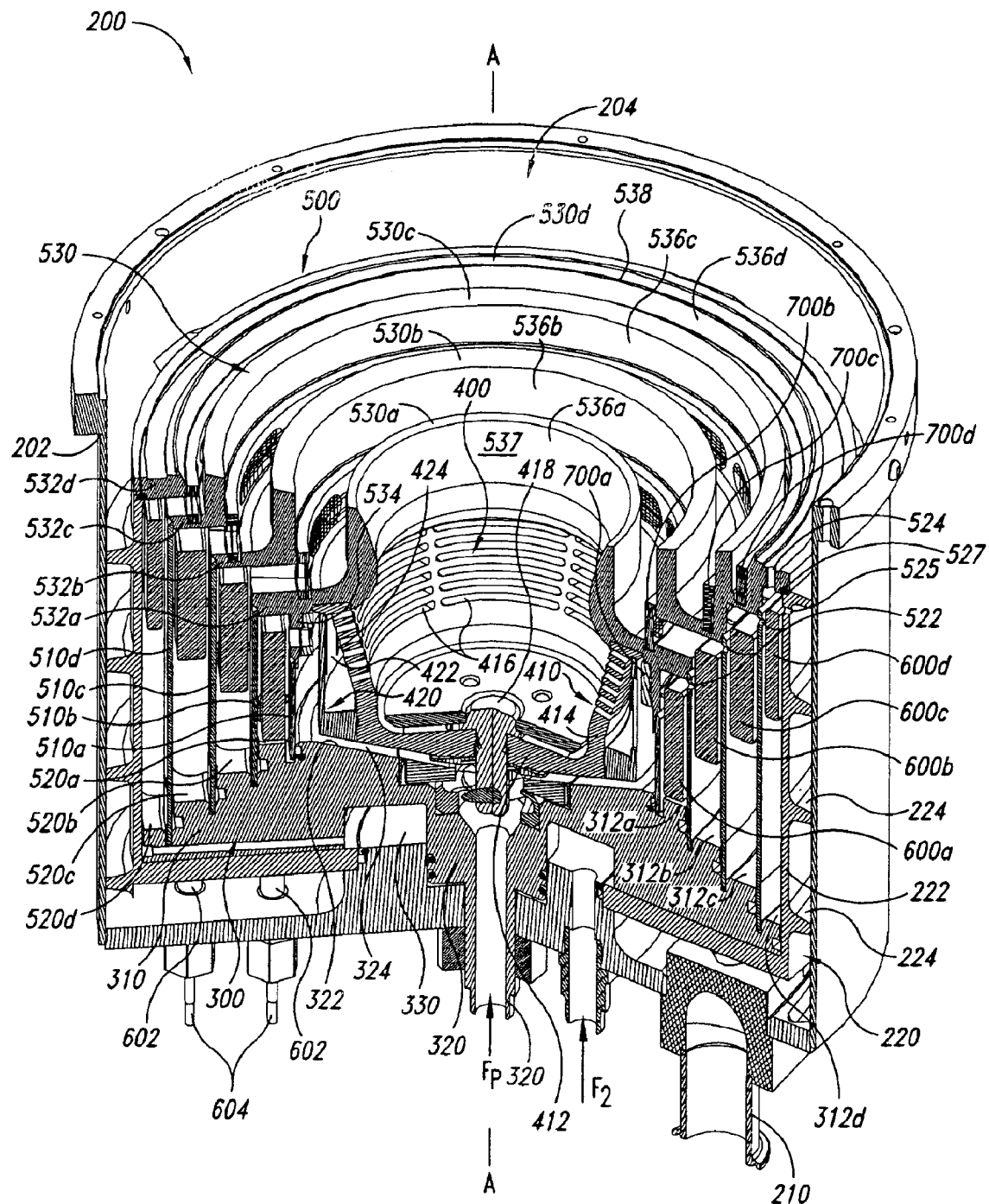
FIG. 6 is an isometric view showing a cross-sectional portion of a processing chamber taken along line 6—6 of FIG. 10A.

FIG. 6 more specifically illustrates an embodiment of a housing 202 receiving a reaction vessel 204 similar, in some respects, to the reaction vessel 204 shown schematically in FIG. 4. As many features of the reaction vessel 204 shown in FIG. 6 can be the same as those described with reference to FIGS. 4 and 5, like reference numbers refer to like parts in these Figures. The housing 202 in FIG. 6 can have a drain 210 for returning the processing fluid that flows out of the reaction vessel 204 to a storage tank, and a plurality of openings for receiving inlets and electrical fittings. The reaction vessel 204 can include an outer container 220 having an outer wall 222 spaced radially inwardly of the housing 202. The outer container 220 can also have a spiral spacer 224 between the outer wall 222 and the housing 202 to provide a spiral ramp (i.e., a helix) on which the processing fluid can flow downward to the bottom of the housing 202. The spiral ramp reduces the turbulence of the return fluid to inhibit entrainment of gasses in the return fluid.

FIGS. 4 and 5 illustrate reaction vessels 204 with distributors 300 receiving a flow of fluid from a single inlet. The particular embodiment of the reaction vessel 204 shown in FIG. 6, however, can include a distributor 300 for receiving a primary fluid flow $F_p$ and a secondary fluid flow $F_2$, a primary flow guide 400 coupled to the distributor 300 to condition the primary fluid flow $F_p$, and a field shaping unit 500 coupled to the distributor 300 to contain the secondary flow $F_2$. In a manner that shapes the electrical field in the reaction vessel 204. The reaction vessel 204 can also include at least one electrode 600 in a compartment of the field shaping unit 500 and at least one filter or other type of interface member 700 carried by the field shaping unit 500 downstream from the electrode. The primary flow guide 400 can condition the primary flow $F_p$ by projecting this flow radially inwardly relative to a common axis A—A, and a portion of the field shaping unit 500 directs the conditioned primary flow $F_p$ toward the workpiece. In several embodiments, the primary flow passing through the primary flow guide 400 and then through the center of the field shaping unit 500 controls the mass transfer of processing solution at the surface of the workpiece. The field shaping unit 500 also defines the shape of the electric field, and it can influence the mass transfer at the surface of the workpiece if the secondary flow passes through the field shaping unit. The reaction vessel 204 can also have other configurations of components to guide the primary flow $F_p$ and the secondary flow $F_2$ through the processing chamber 200. The reaction vessel 204, for example, may not have a distributor in the processing chamber, but rather separate fluid lines with individual flows can be coupled to the vessel 204 to provide a desired distribution of fluid through the primary flow guide 400 and the field shaping unit. For example, the reaction vessel 204 can have a first outlet in the outer container 220 for introducing the primary flow into the reaction vessel and a second outlet in the outer container for introducing the secondary flow into the reaction vessel 204. Each of these components is explained in more detail below.

Figure 7A:
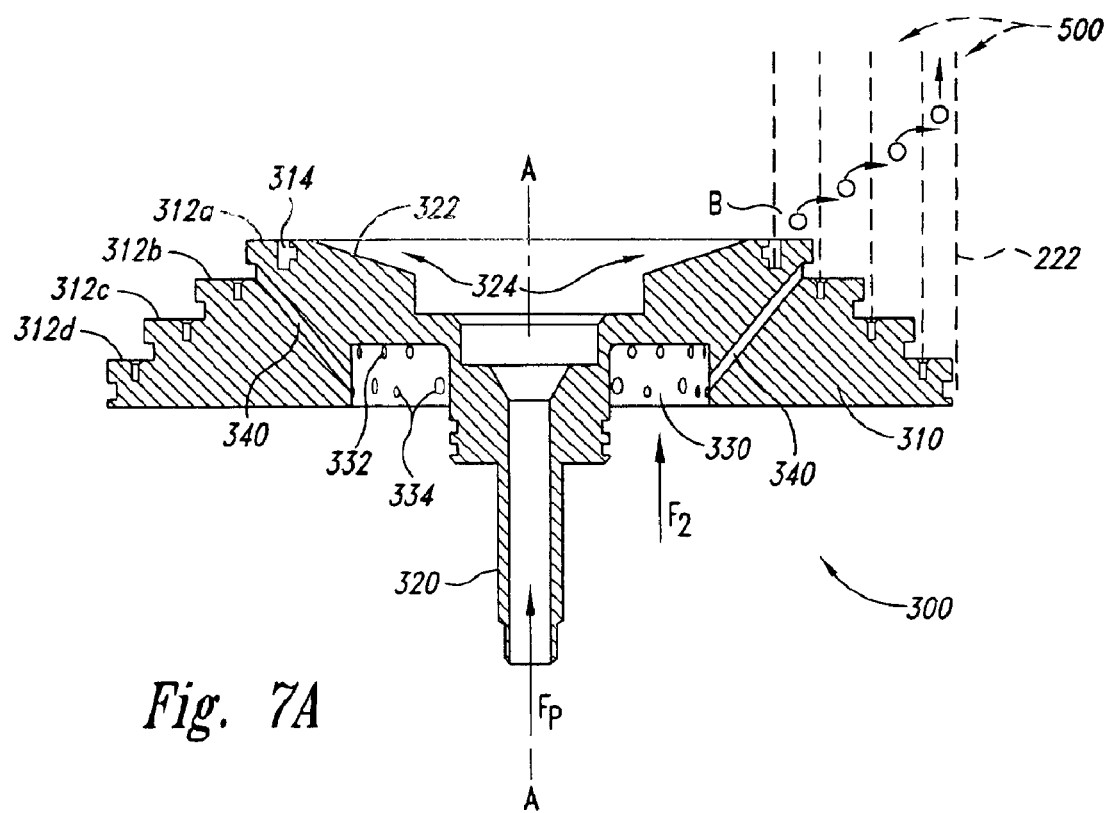
FIGS. 7A–7D are cross-sectional views of a distributor for a processing chamber in accordance with an embodiment of the invention.

FIGS. 7A–7D illustrate an embodiment of the distributor 300 for directing the primary fluid flow to the primary flow guide 400 and the secondary fluid flow to the field shaping unit 500. Referring to FIG. 7A, the distributor 300 can include a body 310 having a plurality of annular steps 312 (identified individually by reference numbers 312a–d) and annular grooves 314 in the steps 312. The outermost step 312d is radially inward of the outer wall 222 (shown in broken lines) of the outer container 220 (FIG. 6), and each of the interior steps 312a–c can carry an annular wall (shown in broken lines) of the field shaping unit 500 in a corresponding groove 314. The distributor 300 can also include a first inlet 320 for receiving the primary flow $F_p$ and a plenum 330 for receiving the secondary flow $F_2$. The first inlet 320 can have an inclined, annular cavity 322 to form a passageway 324 (best shown in FIG. 6) for directing the primary fluid flow $F_p$ under the primary flow guide 400. The distributor 300 can also have a plurality of upper orifices 332 along an upper part of the plenum 330 and a plurality of lower orifices 334 along a lower part of the plenum 330. As explained in more detail below, the upper and lower orifices are open to channels through the body 310 to distribute the secondary flow $F_2$ to the risers of the steps 312. The distributor 300 can also have other configurations, such as a "step-less" disk or non-circular shapes.

Figure 7B:
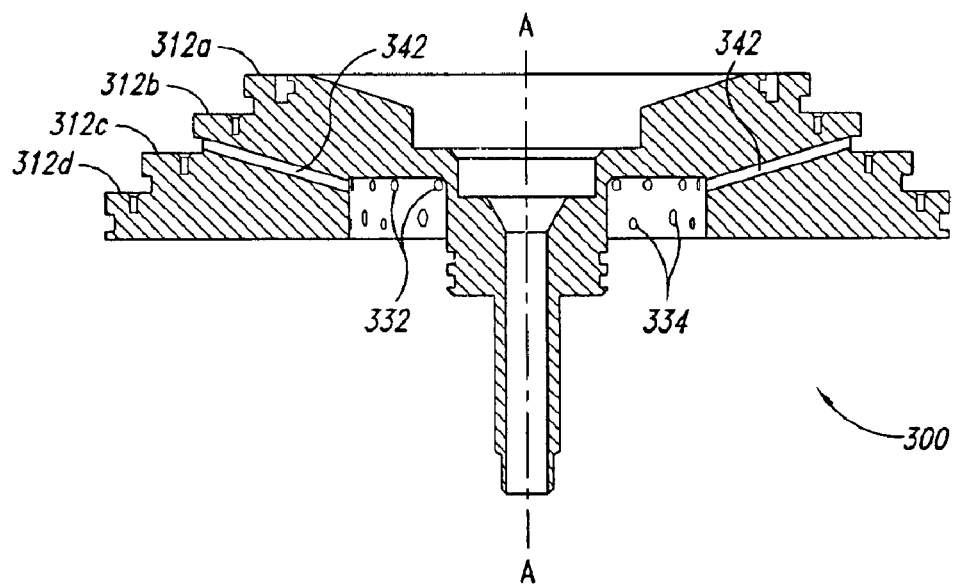
Figure 7C:
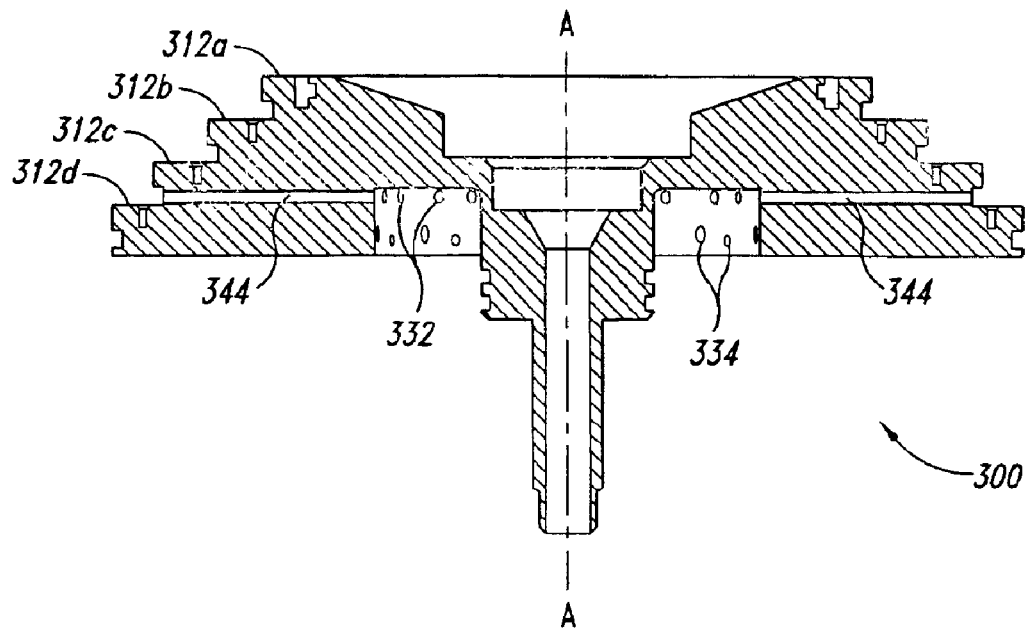
Figure 7D:
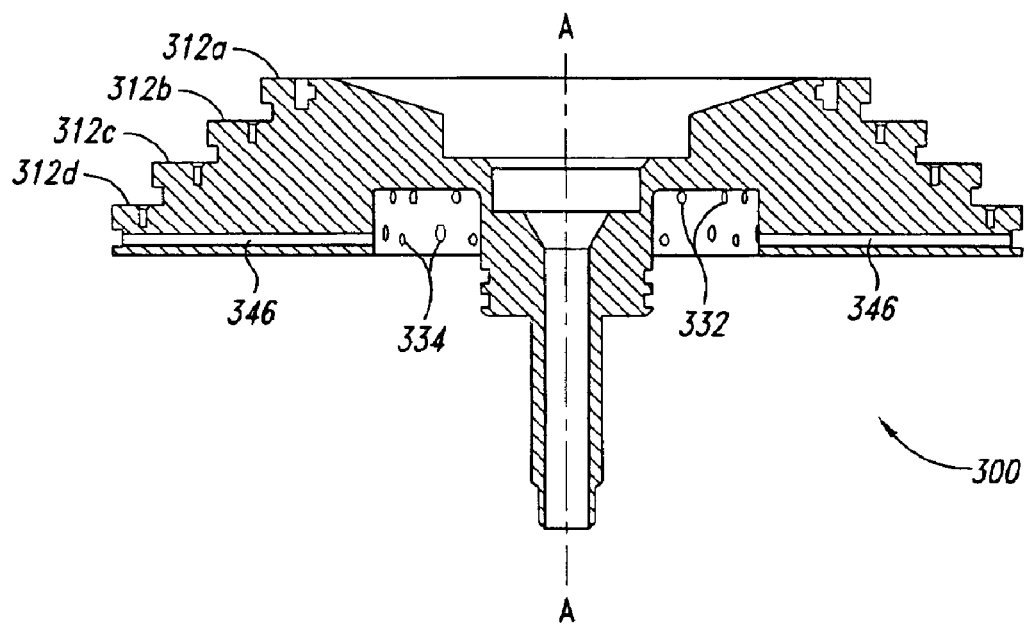

FIGS. 7A–7D further illustrate one configuration of channels through the body 310 of the distributor 300. Referring to FIG. 7A, a number of first channels 340 extend from some of the lower orifices 334 to openings at the riser of the first step 312a. FIG. 7B shows a number of second channels 342 extending from the upper orifices 332 to openings at the riser of the second step 312b, and FIG. 7C shows a number of third channels 344 extending from the upper orifices 332 to openings at the riser of the third step 312c. Similarly, FIG. 7D illustrates a number of fourth channels 346 extending from the lower orifices 334 to the riser of the fourth step 312d.

The particular embodiment of the channels 340–346 in FIGS. 7A–7D are configured to transport bubbles that collect in the plenum 330 radially outward as far as practical so that these bubbles can be captured and removed from the secondary flow $F_2$. This is beneficial because the field shaping unit 500 removes bubbles from the secondary flow $F_2$ by sequentially transporting the bubbles radially outwardly through electrode compartments. For example, a bubble B in the compartment above the first step 312a can sequentially cascade through the compartments over the second and third steps 312b–c, and then be removed from the compartment above the fourth step 312d. The first channel 340 (FIG. 7A) accordingly carries fluid from the lower orifices 334 where bubbles are less likely to collect to reduce the amount of gas that needs to cascade from the inner compartment above the first step 312a all the way out to the outer compartment. The bubbles in the secondary flow $F_2$ are more likely to collect at the top of the plenum 330 before passing through the channels 340–346. The upper orifices 332 are accordingly coupled to the second channel 342 and the third channel 344 to deliver these bubbles outward beyond the first step 312a so that they do not need to cascade through so many compartments. In this embodiment, the upper orifices 332 are not connected to the fourth channels 346 because this would create a channel that inclines downwardly from the common axis such that it may conflict with the groove 314 in the third step 312c. Thus, the fourth channel 346 extends from the lower orifices 334 to the fourth step 312d.

Referring again to FIG. 6, the primary flow guide 400 receives the primary fluid flow $F_p$ via the first inlet 320 of the distributor 300. In one embodiment, the primary flow guide 400 includes an inner baffle 410 and an outer baffle 420. The inner baffle can have a base 412 and a wall 414 projecting upward and radially outward from the base 412. The wall 414, for example, can have an inverted frusto-conical shape and a plurality of apertures 416. The apertures 416 can be holes, elongated slots or other types of openings. In the illustrated embodiment, the apertures 416 are annularly extending radial slots that slant upward relative to the common axis to project the primary flow radially inward and upward relative to the common axis along a plurality of diametrically opposed vectors. The inner baffle 410 can also include a locking member 418 that couples the inner baffle 410 to the distributor 300.

The outer baffle 420 can include an outer wall 422 with a plurality of apertures 424. In this embodiment, the apertures 424 are elongated slots extending in a direction transverse to the apertures 416 of the inner baffle 410. The primary flow $F_p$ flows through (a) the first inlet 320, (b) the passageway 324 under the base 412 of the inner baffle 410, (c) the apertures 424 of the outer baffle 420, and then (d) the apertures 416 of the inner baffle 410. The combination of the outer baffle 420 and the inner baffle 410 conditions the direction of the flow at the exit of the apertures 416 in the inner baffle 410. The primary flow guide 400 can thus project the primary flow along diametrically opposed vectors that are inclined upward relative to the common axis to create a fluid flow that has a highly uniform velocity. In alternative embodiments, the apertures 416 do not slant upward relative to the common axis such that they can project the primary flow normal, or even downward, relative to the common axis.

FIG. 6 also illustrates an embodiment of the field shaping unit 500 that receives the primary fluid flow $F_p$ downstream from the primary flow guide 400. The field shaping unit 500 also contains the second fluid flow $F_2$ and shapes the electrical field within the reaction vessel 204. In this embodiment, the field shaping unit 500 has a compartment structure with a plurality of walls 510 (identified individually by reference numbers 510a–d) that define a plurality of electrode compartments 520 (identified individually by reference numbers 520a–d). The walls 510 can be annular skirts or dividers, and they can be received in one of the annular grooves 314 in the distributor 300. In one embodiment, the walls 510 are not fixed to the distributor 300 so that the field shaping unit 500 can be quickly removed from the distributor 300. For example, each of the walls 510 may have a lower edge which is releasably received in the annular grooves 314 in the distributor 300. This allows easy access to the electrode compartments 520 and/or quick removal of the field shaping unit 500 as a unit to change the shape of the electric field, as explained in more detail below.

The field shaping unit 500 can have at least one wall 510 outward from the primary flow guide 400 to prevent the primary flow $F_p$ from contacting an electrode. In the particular embodiment shown in FIGS. 6 and 8, the field shaping unit 500 has a first electrode compartment 520a between the first and second walls 510a–b, a second electrode compartment 520b between the second and third walls 510b–c, a third electrode compartment 520c between the third and fourth walls 510c–d, and a fourth electrode compartment 520d between the fourth wall 510d and the outer wall 222 of the container 220. Although the walls 510a–d of FIG. 6 define annular electrode compartments 520a–d, alternate embodiments of the field shaping unit can have walls with different configurations to create non-annular electrode compartments and/or each electrode compartment can be further divided into cells. The second-fourth walls 510b–d can also include holes 522 for allowing bubbles in the first-third electrode compartments 520a–c to "cascade" radially outward to the next outward electrode compartment 520 as explained above with respect to FIGS. 7A–7D. The bubbles can then exit the fourth electrode compartment 520d through an exit hole 525 through the outer wall 222. In an alternative embodiment, the bubbles can exit through an exit hole 524.

The electrode compartments 520 provide electrically discrete compartments to house an electrode assembly having at least one electrode and generally two or more electrodes 600 (identified individually by reference numbers 600a–d). The electrodes 600 can be annular members (e.g., annular rings or arcuate sections) that are configured to fit within annular electrode compartments, or they can have other shapes appropriate for the particular workpiece (e.g., rectilinear). In the illustrated embodiment, for example, the electrode assembly includes a first annular electrode 600a in the first electrode compartment 520a, a second annular electrode 600b in the second electrode compartment 520b, a third annular electrode 600c in the third electrode compartment 520c, and a fourth annular electrode 600d in the fourth electrode compartment 520d. The electrodes 600 may be supported in the reaction vessel 204 in any suitable fashion. In the particular embodiment shown in FIG. 6, the electrodes are supported by pillars 602 which extend upwardly from a bottom of the reaction vessel 204. These pillars 602 may be hollow, serving as a guide for wires 604 connecting the electrodes 600 to power supplies. As explained in U.S. application Ser. Nos. 60/206,661, 09/845,505, and 09/804,697, all of which are incorporated herein by reference, each of the electrodes 600a–d can be biased with the same or different potentials with respect to the workpiece to control the current density across the surface of the workpiece. In alternate embodiments, the electrodes 600 can be non-circular shapes or sections of other shapes.

Embodiments of the reaction vessel 204 that include a plurality of electrodes provide several benefits for plating or electropolishing. In plating applications, for example, the electrodes 600 can be biased with respect to the workpiece at different potentials to provide uniform plating on different workpieces even though the seed layers vary from one another or the bath(s) of electroprocessing solution have different conductivities and/or concentrations of constituents. Additionally, another the benefit of having a multiple electrode design is that plating can be controlled to achieve different final fill thicknesses of plated layers or different plating rates during a plating cycle or in different plating cycles. Other benefits of particular embodiments are that the current density can be controlled to (a) provide a uniform current density during feature filling and/or (b) achieve plating to specific film profiles across a workpiece (e.g., concave, convex, flat). Accordingly, the multiple electrode configurations in which the electrodes are separate from one another provide several benefits for controlling the electrochemical process to (a) compensate for deficiencies or differences in seed layers between workpieces, (b) adjust for variances in baths of electroprocessing solutions, and/or (c) achieve predetermined feature filling or film profiles.

In the illustrated embodiment, the adjacent electrodes 600 are spaced from one another to define annular spaces for receiving a wall 510. Hence, the second wall 510b is received in the annular space between the first electrode 600a and the second electrode 600b, the third wall 510c is received in the annular space between the second electrode 600b and the third electrode 600c, and the fourth wall 510d is received in the annular space between the third electrode 600*c* and the fourth electrode 600*d*. In one embodiment, the annular spaces between the electrodes 600 are sufficiently large to allow the walls to slide therein for removal and installation of the walls 510 in the reaction vessel 204 without modifying the electrodes 600. If so desired, spacers (not shown) may be positioned between the walls 510 and the adjacent electrodes 600 to help center the electrodes 600 within their respective electrode compartments 520.

The field shaping unit 500 can also include a virtual electrode unit 530 coupled to the walls 510 of the compartment assembly for individually shaping the electrical fields produced by the electrodes 600. In this particular embodiment, the virtual electrode unit includes first fourth partitions 530*a*–530*d*, respectively. The first partition 530*a* can have a first section 532*a* coupled to the second wall 510*b*, a skirt 534 depending downward above the first wall 510*a*, and a lip 536*a* projecting upwardly. The lip 536*a* has an interior surface 537 that directs the primary flow $F_p$ exiting from the primary flow guide 400. The second partition 530*b* can have a first section 532*b* coupled to the third wall 510*c* and a lip 536*b* projecting upward from the first section 532*b*, the third partition 530*c* can have a first section 532*c* coupled to the fourth wall 510*d* and a lip 536*c* projecting upward from the first section 532*c*, and the fourth partition 530*d* can have a first section 532*d* carried by the outer wall 222 of the container 220 and a lip 536*d* projecting upward from the first section 532*d*. The fourth partition 530*d* may simply abut the outer wall 222 so that the field shaping unit 500 can be quickly removed from the vessel 204 by simply lifting the virtual electrode unit. The interface between the fourth partition 530*d* and the outer wall 222 is sealed by a seal 527 to inhibit both the fluid and the electrical current from leaking out of the fourth electrode compartment 520*d*. The seal 527 can be a lip seal. Additionally, each of the sections 532*a*–*d* can be lateral sections extending transverse to the common axis.

In one embodiment, each of the individual partition elements 530*a*–*d* are joined together so the virtual electrode unit 530 can be removed from the reaction vessel as a unit rather than separately as discrete elements. For example, the individual partitions 530*a*–*d* can be machined from or molded into a single piece of dielectric material, or they can be individual dielectric members welded or otherwise joined together. In alternate embodiments, the individual partitions 530*a*–*d* are not attached to each other and/or they can have different configurations. In the particular embodiment shown in FIG. 6, the first sections 532*a*–*d* of the partitions 530*a*–*d* are annular horizontal members and each of the lips 536*a*–*d* are annular vertical members arranged concentrically.

The walls 510*a*–*d* and the virtual electrode unit 530 are generally dielectric materials that contain the second flow $F_2$ of the processing solution for shaping the electric fields generated by the electrodes 600*a*–*d*. The second flow $F_2$, for example, can pass (a) through each of the electrode compartments 520*a*–*d*, (b) between the individual partitions 530*a*–*d*, and then (c) upward through the annular openings between the lips 536*a*–*d*. In this embodiment, the secondary flow $F_2$ through the first electrode compartment 520*a* can join the primary flow $F_p$ in an antechamber just before the primary flow guide 400, and the secondary flow through the second-fourth electrode compartments 520*b*–*d* can join the primary flow $F_p$ beyond the top edges of the lips 536*a*–*d*. The flow of electroprocessing solution then flows over a shield weir attached at rim 538 and into the gap between the housing 202 and the outer wall 222 of the container 220 as disclosed in International Application No. PCT/US00/10120. As explained below with reference to FIG. 6, the fluid in the secondary flow $F_2$ can be prevented from flowing out of the electrode compartments 520*a*–*d* to join the primary flow $F_p$ while still allowing electrical current to pass from the electrodes 600 to the primary flow. In this alternate embodiment, the secondary flow $F_2$ can exit the reaction vessel 204 through the holes 522 in the walls 510 and the hole 525 in the outer wall 222. In still additional embodiments in which the fluid of the secondary flow does not join the primary flow, a duct can be coupled to the exit hole 525 in the outer wall 222 so that a return flow of the secondary flow passing out of the field shaping unit 500 does not mix with the return flow of the primary flow passing down the spiral ramp outside of the outer wall 222.

The field shaping unit 500 can have other configurations that are different than the embodiment shown in FIG. 6. For example, the electrode compartment assembly can have only a single wall 510 defining a single electrode compartment 520, and the reaction vessel 204 can include only a single electrode 600. The field shaping unit of either embodiment still separates the primary and secondary flows so that the primary flow does not engage the electrode, and thus it shields the workpiece from the single electrode. One advantage of shielding the workpiece from the electrodes 600*a*–*d* is that the electrodes can accordingly be much larger than they could be without the field shaping unit because the size of the electrodes does not have effect on the electrical field presented to the workpiece. This is particularly useful in situations that use consumable electrodes because increasing the size of the electrodes prolongs the life of each electrode, which reduces downtime for servicing and replacing electrodes.

An embodiment of reaction vessel 204 shown in FIG. 6 can accordingly have a first conduit system for conditioning and directing the primary fluid flow $F_p$ to the workpiece, and a second conduit system for conditioning and directing the secondary fluid flow $F_2$. The first conduit system, for example, can include the inlet 320 of the distributor 300; the channel 324 between the base 412 of the primary flow guide 400 and the inclined cavity 322 of the distributor 300; a plenum between the wall 422 of the outer baffle 420 and the first wall 510*a* of the field shaping unit 500; the primary flow guide 400; and the interior surface 537 of the first lip 536*a*. The first conduit system conditions the direction of the primary fluid flow $F_p$ by passing it through the primary flow guide 400 and along the interior surface 537 so that the velocity of the primary flow $F_p$ normal to the workpiece is at least substantially uniform across the surface of the workpiece. The primary flow $F_p$ and rotation of the workpiece can accordingly be controlled to dominate the mass transfer of electroprocessing medium at the workpiece.

The second conduit system, for example, can include the plenum 330 and the channels 340–346 of the distributor 300, the walls 510 of the field shaping unit 500, and the partitions 530*a*–*d* of the field shaping unit 500. The secondary flow $F_2$ contacts the electrodes 600 to establish individual electrical fields in the field shaping unit 500 that are electrically coupled to the primary flow $F_p$. The field shaping unit 500, for example, separates the individual electrical fields created by the electrodes 600*a*–*d* to create "virtual electrodes" at the top of the openings defined by the lips 536*a*–*d* of the partitions. In this particular embodiment, the central opening inside the first lip 536*a* defines a first virtual electrode, the annular opening between the first and second lips 536*a*–*b* defines a second virtual electrode, the annular opening between the second and third lips 536*b*–*c* defines a third virtual electrode, and the annular opening between the third and fourth lips 536c–d defines a fourth virtual electrode. These are "virtual electrodes" because the field shaping unit 500 shapes the individual electrical fields of the actual electrodes 600a–d so that the effect of the electrodes 600a–d acts as if they are placed between the top edges of the lips 536a–d. This allows the actual electrodes 600a–d to be isolated from the primary fluid flow, which can provide several benefits as explained in more detail below.

An additional embodiment of the processing chamber 200 includes at least one interface member 700 (identified individually by reference numbers 700a–d) for further conditioning the secondary flow $F_2$ of electroprocessing solution. The interface members 700, for example, can be filters that capture particles in the secondary flow that were generated by the electrodes (i.e., anodes) or other sources of particles. The filter-type interface members 700 can also inhibit bubbles in the secondary flow $F_2$ from passing into the primary flow $F_p$ of electroprocessing solution. This effectively forces the bubbles to pass radially outwardly through the holes 522 in the walls 510 of the field shaping unit 500. In alternate embodiments, the interface members 700 can be ion-membranes that allow ions in the secondary flow $F_2$ to pass through the interface members 700. The ion-membrane interface members 700 can be selected to (a) allow the fluid of the electroprocessing solution and ions to pass through the interface member 700, or (b) allow only the desired ions to pass through the interface member such that the fluid itself is prevented from passing beyond the ion-membrane.

Figure 8:
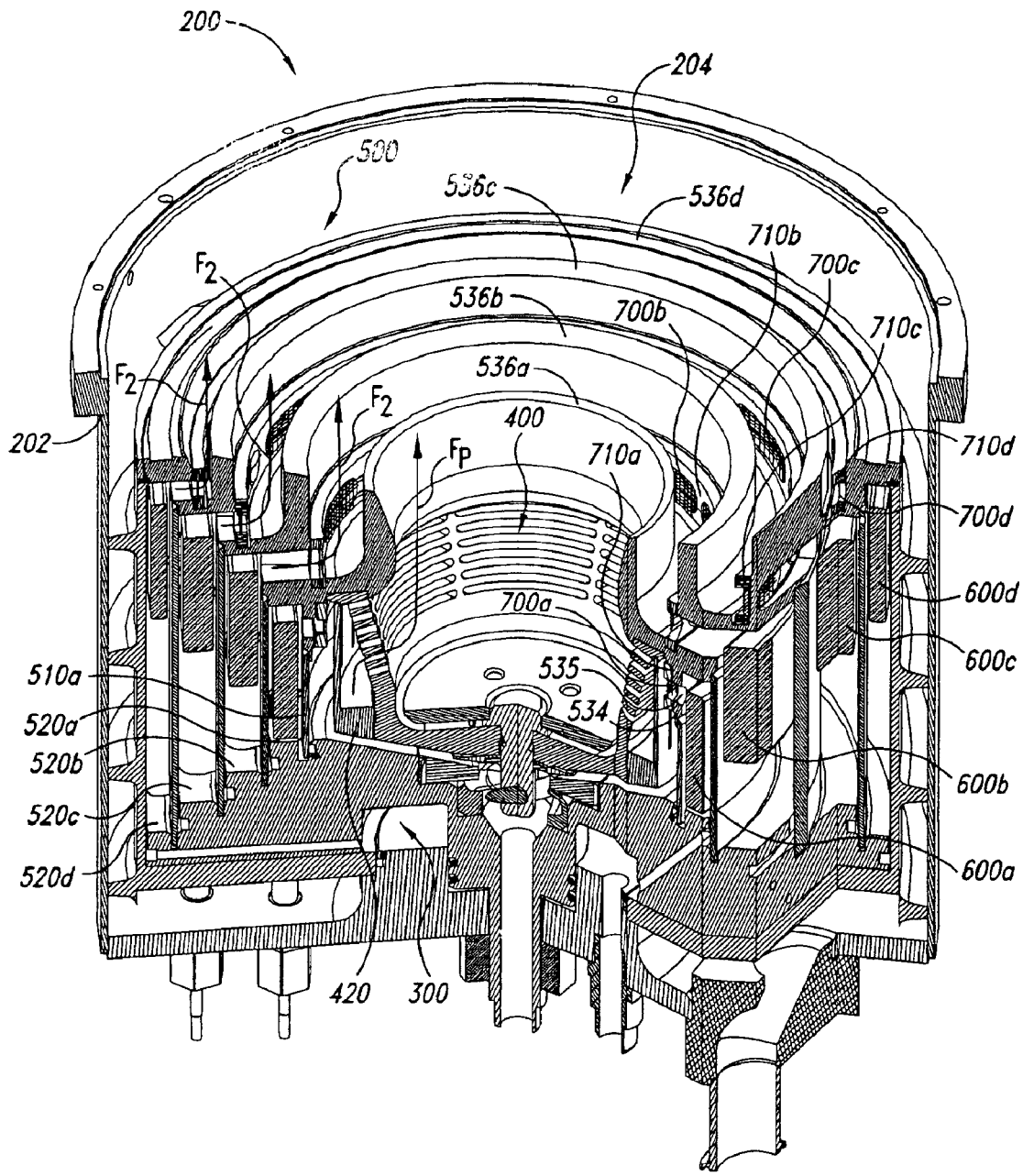
FIG. 8 is an isometric view showing a different cross-sectional portion of the processing chamber of FIG. 6 taken along line 8—8 of FIG. 10B.
Figure 10A:
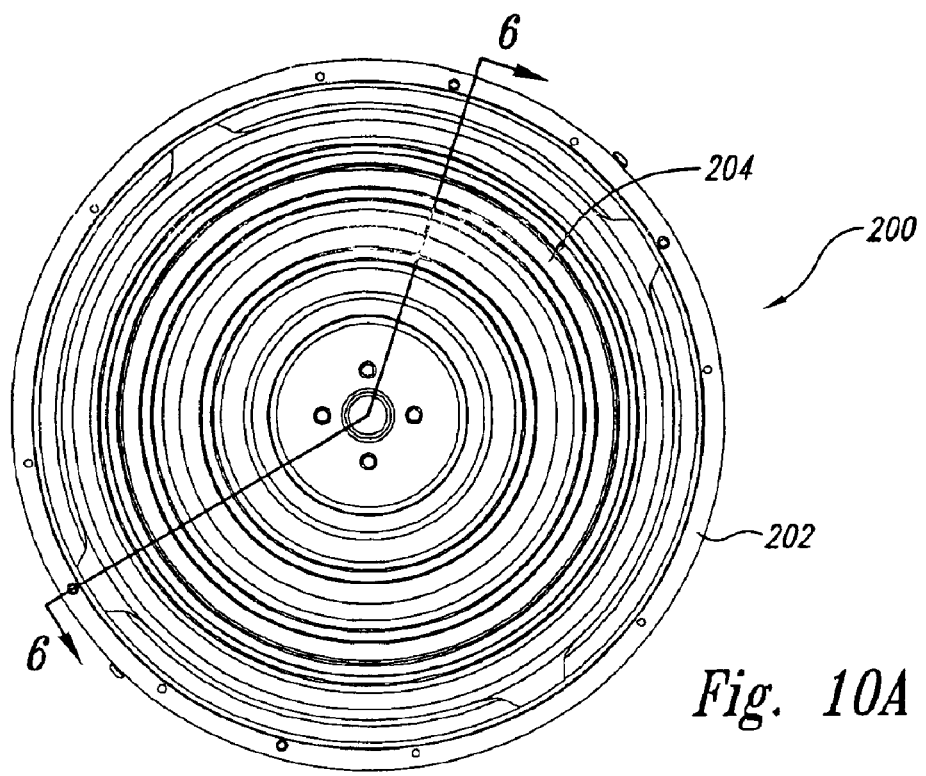
FIGS. 10A and 10B are top plan views of a processing chamber that provide a reference for the isometric, cross-sectional views of FIGS. 6 and 8, respectively.
Figure 10B:
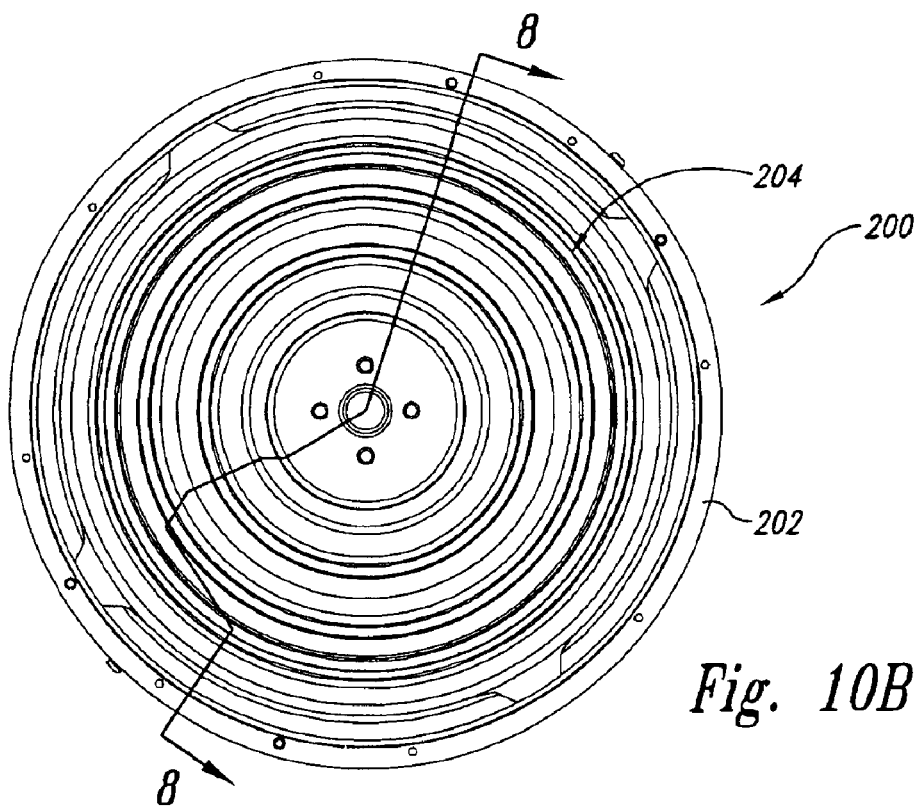

FIG. 8 is another isometric view of the reaction vessel 204 of FIG. 6 showing a cross-sectional portion taken along a different cross-section. More specifically, the cross-section of FIG. 6 is shown in FIG. 10A and the cross-section of FIG. 8 is shown in FIG. 10B. Returning now to FIG. 8, this illustration further shows one embodiment for configuring a plurality of interface members 700a–d relative to the partitions 530a–d of the field shaping unit 500. A first interface member 700a can be attached to the skirt 534 of the first partition 530a so that a first portion of the secondary flow $F_2$ flows past the first electrode 600a, through an opening 535 in the skirt 534, and then to the first interface member 700a. Another portion of the secondary flow $F_2$ can flow past the second electrode 600b to the second interface member 700b. Similarly, portions of the secondary flow $F_2$ can flow past the third and fourth electrodes 600c–d to the third and fourth interface members 700c–d.

When the interface members 700a–d are filters or ion-membranes that allow the fluid in the secondary flow $F_2$ to pass through the interface members 700a–d, the secondary flow $F_2$ joins the primary fluid flow $F_p$. The portion of the secondary flow $F_2$ in the first electrode compartment 520a can pass through the opening 535 in the skirt 534 and the first interface member 700a, and then into a plenum between the first wall 510a and the outer wall 422 of the baffle 420. This portion of the secondary flow $F_2$ accordingly joins the primary flow $F_p$ and passes through the primary flow guide 400. The other portions of the secondary flow $F_2$ in this particular embodiment pass through the second-fourth electrode compartments 520b–d and then through the annular openings between the lips 536a–d. The second-fourth interface members 700b–d can accordingly be attached to the field shaping unit 500 downstream from the second fourth electrodes 600b–d.

In the particular embodiment shown in FIG. 8, the second interface member 700b is positioned vertically between the first and second partitions 530a–b, the third interface member 700c is positioned vertically between the second and third partitions 530b–c, and the fourth interface member 700d is positioned vertically between the third and fourth partitions 530c–d. The interface assemblies 710a–d are generally installed vertically, or at least at an upwardly inclined angle relative to horizontal, to force the bubbles to rise so that they can escape through the holes 522 in the walls 510a–d (FIG. 6). This prevents aggregations of bubbles that could potentially disrupt the electrical field from an individual electrode.

Figure 9A:
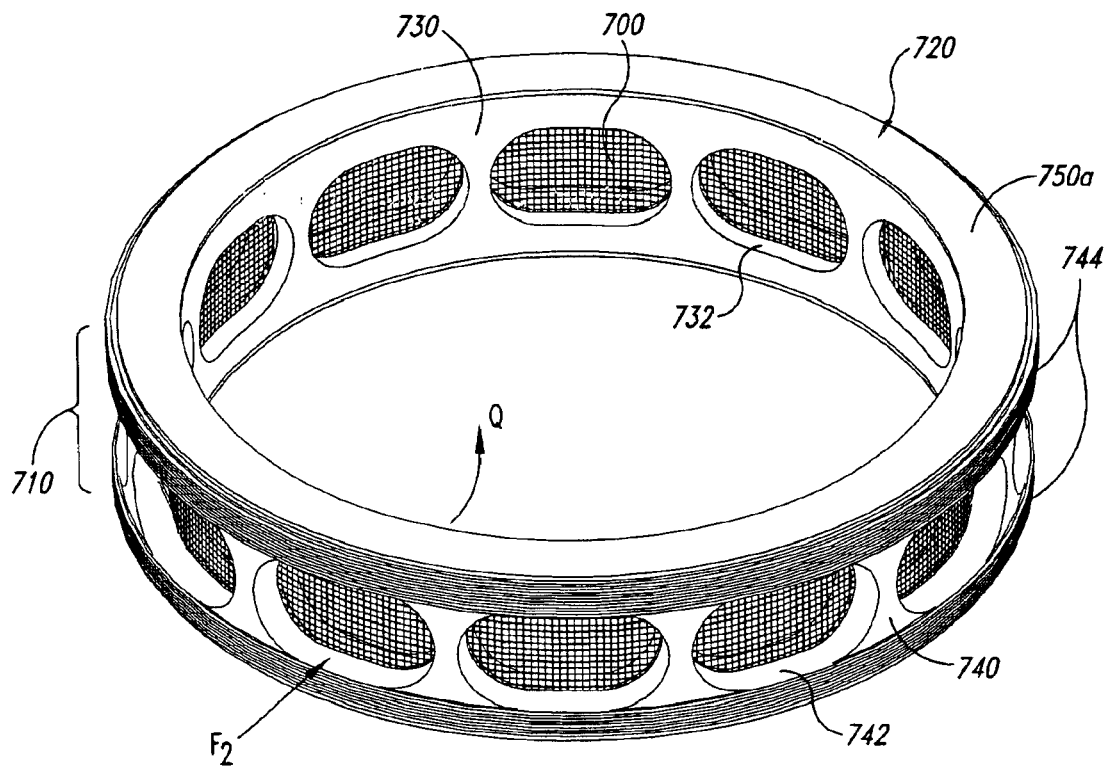
FIG. 9A is an isometric view of an interface assembly for use in a processing chamber in accordance with an embodiment of the invention.
Figure 9B:
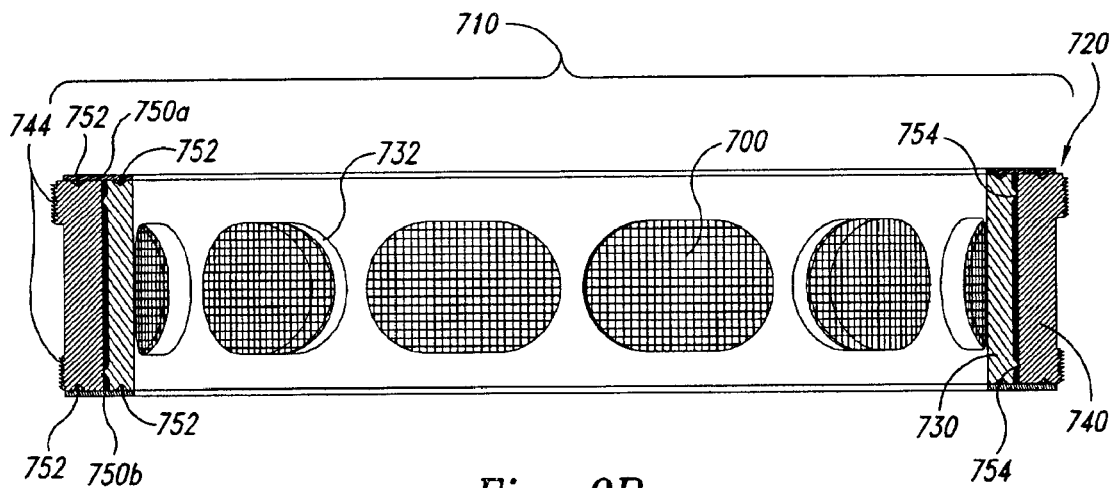
FIG. 9B is a cross-sectional view of the interface assembly of FIG. 9A.

FIGS. 9A and 9B illustrate an interface assembly 710 for mounting the interface members 700 to the field shaping unit 500 in accordance with an embodiment of the invention. The interface assembly 710 can include an annular interface member 700 and a fixture 720 for holding the interface member 700. The fixture 720 can include a first frame 730 having a plurality of openings 732 and a second frame 740 having a plurality of openings 742 (best shown in FIG. 9A). The holes 732 in the first frame can be aligned with the holes 742 in the second frame 740. The second frame can further include a plurality of annular teeth 744 extending around the perimeter of the second frame. It will be appreciated that the teeth 744 can alternatively extend in a different direction on the exterior surface of the second frame 740 in other embodiments, but the teeth 744 generally extend around the perimeter of the second frame 740 in a top annular band and a lower annular band to provide annular seals with the partitions 536a–d (FIG. 6). The interface member 700 can be pressed between the first frame 730 and the second frame 740 to securely hold the interface member 700 in place. The interface assembly 710 can also include a top band 750a extending around the top of the frames 730 and 740 and a bottom band 750b extending around the bottom of the frames 730 and 740. The top and bottom bands 750a–b can be welded to the frames 730 and 740 by annular welds 752. Additionally, the first and second frames 730 and 740 can be welded to each other by welds 754. It will be appreciated that the interface assembly 710 can have several different embodiments that are defined by the configuration of the field shaping unit 500 (FIG. 6) and the particular configuration of the electrode compartments 520a–d (FIG. 6).

When the interface member 700 is a filter material that allows the secondary flow $F_2$ of electroprocessing solution to pass through the holes 732 in the first frame 730, the post-filtered portion of the solution continues along a path (arrow Q) to join the primary fluid flow $F_p$ as described above. One suitable material for a filter-type interface member 700 is POREX®, which is a porous plastic that filters particles to prevent them from passing through the interface member. In plating systems that use consumable anodes (e.g., phosphorized copper or nickel sulfamate), the interface member 700 can prevent the particles generated by the anodes from reaching the plating surface of the workpiece.

In alternate embodiments in which the interface member 700 is an ion-membrane, the interface member 700 can be permeable to preferred ions to allow these ions to pass through the interface member 700 and into the primary fluid flow $F_p$. One suitable ion-membrane is NAFION® perfluorinated membranes manufactured by DuPont®. The NAFION 450 ion-selective membrane, for example, is useful in copper plating applications. Other suitable types of ion-membranes for plating can be polymers that are permeable to many cations, but reject anions and non-polar species. It will be appreciated that in electropolishing applications, the interface member 700 may be selected to be permeable to anions, but reject cations and non-polar species. The preferred ions can be transferred through the ion-membrane interface member 700 by a driving force, such as a difference in concentration of ions on either side of the membrane, a difference in electrical potential, or hydrostatic pressure.

Using an ion-membrane that prevents the fluid of the electroprocessing solution from passing through the interface member 700 allows the electrical current to pass through the interface member while filtering out particles, organic additives and bubbles in the fluid. For example, in plating applications in which the interface member 700 is permeable to cations, the primary fluid flow $F_p$ that contacts the workpiece can be a catholyte and the secondary fluid flow $F_2$ that does not contact the workpiece can be a separate anolyte because these fluids do not mix in this embodiment. A benefit of having separate anolyte and catholyte fluid flows is that it eliminates the consumption of additives at the anodes and the need to replenish the additives as often. Additionally, this feature combined with the "virtual electrode" aspect of the reaction vessel 204 reduces the need to "burn-in" anodes for insuring a consistent black film over the anodes for predictable current distribution because the current distribution is controlled by the configuration of the field shaping unit 500. Another advantage is that it also eliminates the need to have a predictable consumption of additives in the secondary flow $F_2$ because the additives to the secondary flow $F_2$ do not effect the primary fluid flow $F_p$ when the two fluids are separated from each other.

Referring to FIG. 8 again, the interface assemblies 710a–d are generally installed so that the interface members 700a–d are vertical or at least at an upwardly inclined angle relative to horizontal. The vertical arrangement of the interface assemblies 710a–d is advantageous because the interface members 700 force the bubbles to rise so that they can escape through the holes 522 in the walls 510a–d (FIG. 6). This prevents aggregations of bubbles that could potentially disrupt the electrical field from an individual anode.

From time to time, it may be desirable to modify a particular reaction vessel 204 from a first configuration for processing a first type of workpiece 5 to a second configuration for processing a different second type of workpiece 5. For example, a reaction vessel 204 adapted to treat a first size of workpiece, e.g., to electroplate a semiconductor wafer having a 300 mm diameter, is not well suited to treat differently sized workpieces, e.g., to electroplate 200 mm semiconductor wafers, to yield consistent, high-quality products. The two types of workpieces need not be different shapes to merit alteration of the electric field and/or flow pattern of processing fluid. For example, the workpieces may require plating of a different material or a different thickness of the same material, or the workpieces' surfaces may have different conductivities.

One embodiment of the present invention provides a reaction vessel 204 which can be easily modified to treat different workpieces and which can be easily disassembled for access to the electrodes 600 therein. In this embodiment, at least the virtual electrode unit 530 of the field shaping unit 500 can be easily removed from the reaction vessel 204 and replaced with a different virtual electrode unit adapted for treating a different workpiece.

As seen in FIGS. 6 and 8, the outer partition 530d may simply rest atop the upper edge of the outer wall 222 of the reaction vessel 204 without being securely affixed thereto. As noted above, each of the individual partitions 530a–d may be joined together, enabling the virtual electrode unit 530 to be removed from the reaction vessel 204 as a unit rather than separately as discrete elements. In the particular embodiment shown in FIG. 6, an upper edge of each of the walls 510a–d is coupled to a separate partition 530a–d, respectively, and the lower edge of each of the walls 510 may be releasably received in an annular recess 314 in the distributor 300. The walls 510 may also be slidably received in annular spaces between adjacent pairs of electrodes 600, as noted above. As a consequence, the entire field shaping unit 500, not just the virtual electrode unit 530, may be removed from the reaction vessel as a unit.

Figure 11:
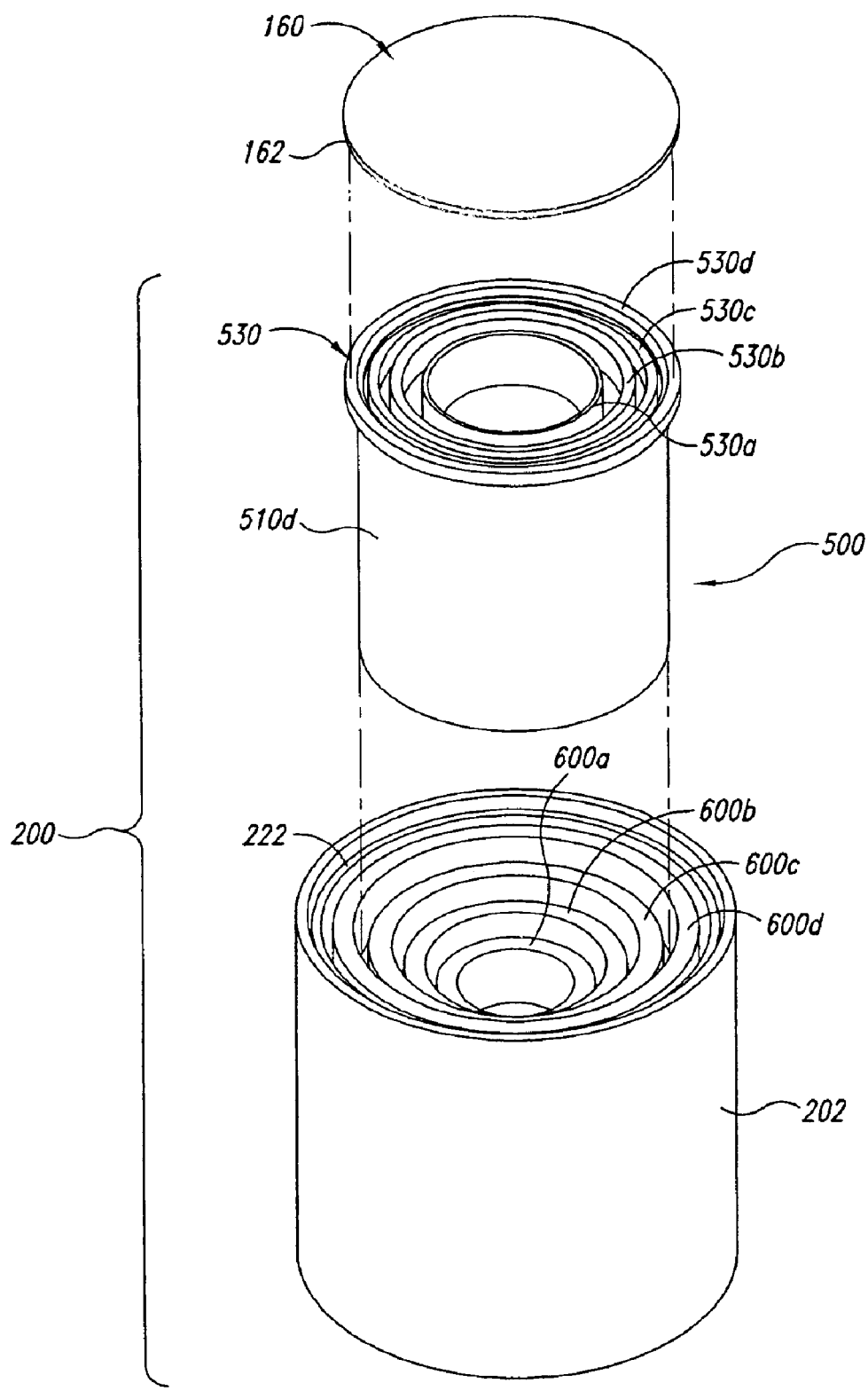
FIG. 11 is an isometric view schematically showing removal of a field shaping unit from the processing chamber of FIG. 6.

FIG. 11 illustrates removal of the field shaping unit 500 from the reaction vessel 204. As can be seen in this view, the virtual electrode unit 530 and the walls 510 (only the outer wall 510d being visible in FIG. 11) of the field shaping unit 500 are removed from the reaction vessel 204 as a unit. The electrodes 600 remain in place in the reaction vessel supported by the pillars (602 in FIG. 6). Removing the field shaping unit 500 in this fashion allows ready access to the electrodes, e.g., for periodic inspection and maintenance or for scheduled replacement of consumable anodes. It also permits replacement of the field shaping unit 500 with a different field shaping unit better adapted for use with a different workpiece.

Figure 12:
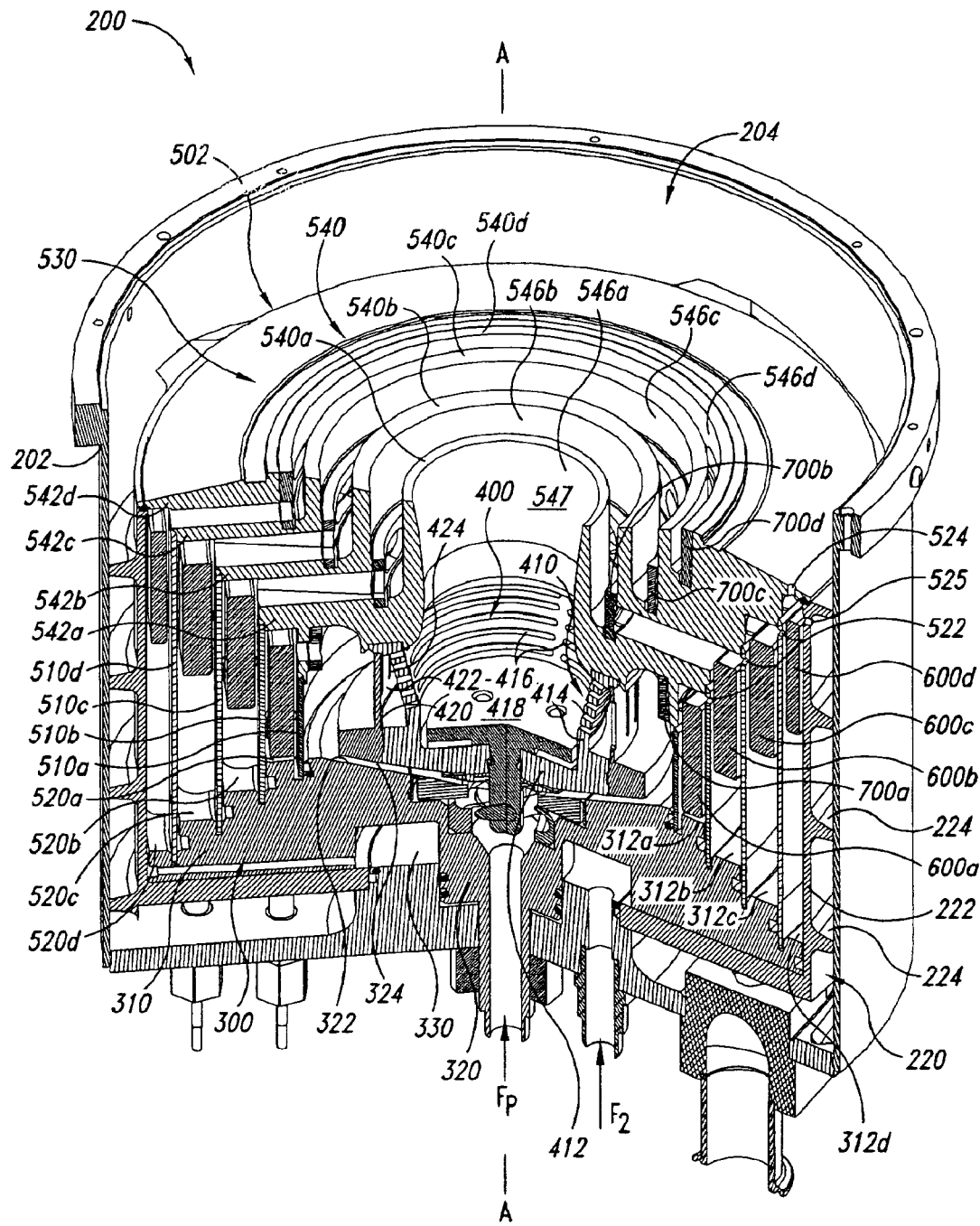
FIG. 12 is an isometric view similar to FIG. 6, showing a cross-sectional portion of a processing chamber modified in accordance with another embodiment of the invention.
Figure 13:
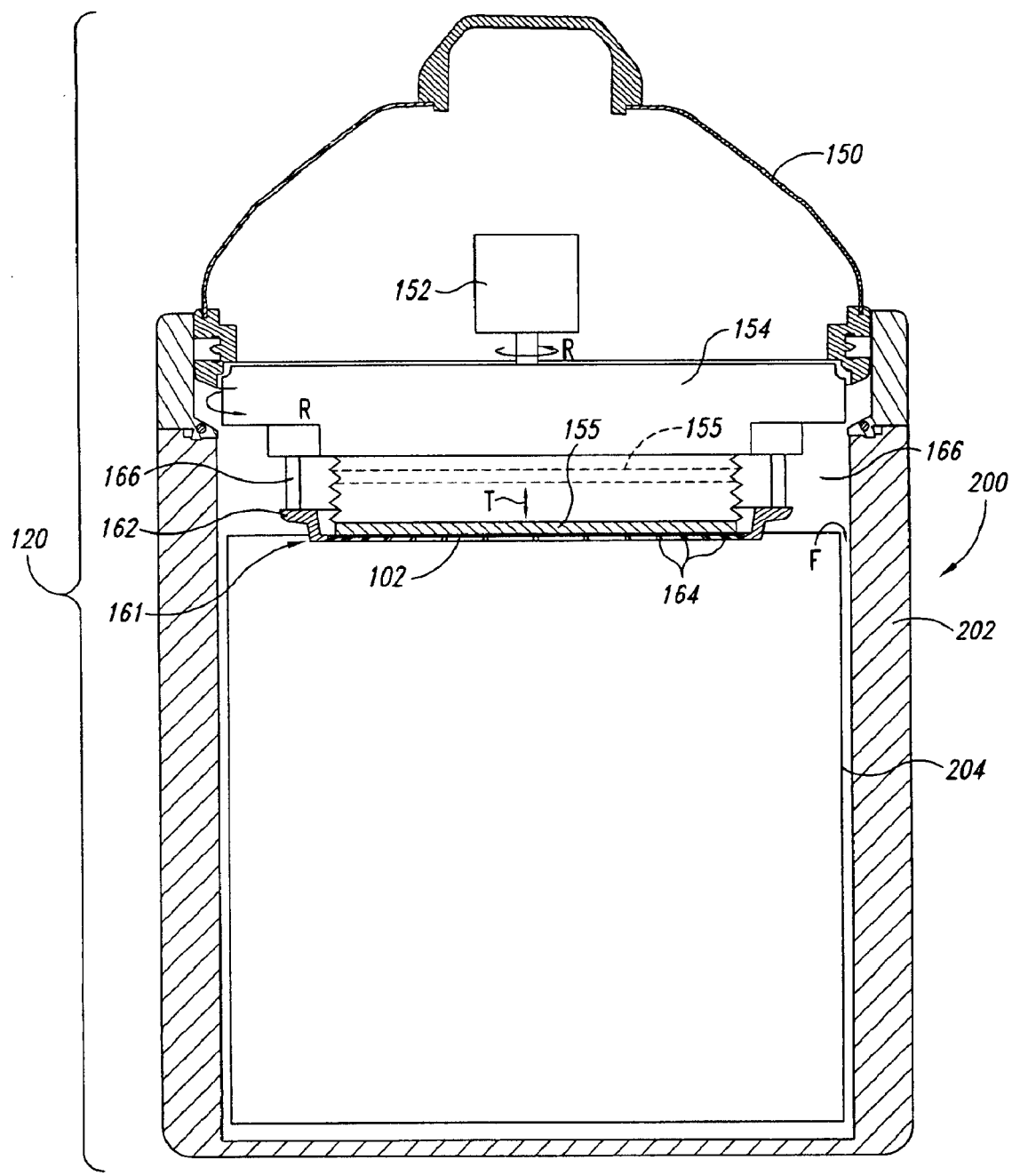
FIG. 13 is a schematic cross-sectional view of the electroprocessing station of FIG. 3 modified to process a differently-sized workpiece.

FIG. 12 is an isometric view of an embodiment of the processing chamber 200 with a different virtual electrode unit 540 therein. Many features of the processing chamber 200 shown in FIG. 12 can be the same as those described above with reference to FIG. 6, and thus like reference numbers refer to like parts in these Figures. The primary difference between the embodiment of FIG. 6 and the embodiment of FIG. 12 is that the virtual electrode unit 540 in FIG. 12 defines a different flow pattern than does the virtual electrode unit 530 of FIG. 6.

The general structure of the virtual electrode units 530 and 540 are similar. Hence, the virtual electrode unit 540 of FIG. 12 includes first-fourth partitions 540a–540d, respectively. The first partition 540a can have a first section 542a coupled to the second wall 510b, a skirt 544 depending downward above the first wall 510a, and a lip 546a projecting upwardly. The lip 546a has an interior surface 547 that directs the primary flow $F_p$ exiting from the primary flow guide 400. The second partition 540b can have a first section 542b coupled to the third wall 510c and a lip 546b projecting from the first section 542b, the third partition 540c can have a first section 542c coupled to the fourth wall 510d and a lip 546c projecting upward from the first section 542c, and the fourth partition 540d can have a first section 542d which engages the outer wall 222 of the container 220 and a lip 546d projecting from the first section 542d. As with the virtual electrode unit 530 described above, the partitions 540a–d may be joined together so the virtual electrode unit 540 can be removed from the reaction vessel as a unit. In the particular embodiment shown in FIG. 12, the first sections 542a–d of the partitions 540a–d are annular horizontal members and each of the lips 546a–d are annular vertical members that are arranged concentrically.

The two virtual electrode units 530 and 540 functionally differ in that the partitions 540a–d in FIG. 12 define gaps between adjacent lips 546 having different relative positions with respect to the common axis A—A from the gaps defined between adjacent lips 536 of the partitions 530a–d in FIG. 6. As explained above, these gaps may define the discharge outlets for the processing fluid and, hence, the relative positions and sizes of the virtual electrodes. As a practical matter, these virtual electrodes define the shape of the electrical field in the processing fluid. As a consequence, replacing the virtual electrode unit 530 of FIG. 6 with the virtual electrode unit 540 of FIG. 12 will alter the effective electrical field adjacent the workpiece. Comparing FIGS. 6 and 12, it can be seen that the first sections 542*a–d* and lips 546*a–d* of partitions 540*a–d* in FIG. 12 are longer than the first sections 532*a–d* and lips 536*a–d* of partitions 530*a–d* in FIG. 6. As a result, the virtual electrodes defined by the virtual electrode unit 540 are positioned higher within and closer to the common axis A—A of the reaction vessel 204 than the virtual electrodes of FIG. 6. The processing chamber 200 of FIG. 12 with virtual electrode unit 540 may be better adapted for use with a smaller workpiece than is the processing chamber 200 of FIG. 6 with virtual electrode unit 530.

The walls 510 in FIG. 12 are received in the same spaces between adjacent electrodes 600 as are the walls 510 in FIG. 6. In one embodiment, the virtual electrode units 530 and 540 merely abut the walls 510, but the walls 510 remain in place when either of the virtual electrode units are removed. In such an embodiment, the virtual electrode units 530 and 540 may have recesses or abutments at the same relative positions so that they will abut the upper edges of the walls 510 when one virtual electrode unit replaces the other. This enables one to alter the electric field in the processing chamber 200 without altering any other parts of the processing chamber. In an alternative embodiment, the walls 510 are coupled to the virtual electrode unit 540 and the field shaping unit 502 may be removed as a unit. This would be directly analogous to the embodiment shown in FIG. 11, with the field shaping unit 502 of FIG. 12 being readily substitutable for the field shaping unit 500 of FIG. 6. To ensure that the walls 510 are properly arranged to be received in the annular spaces between adjacent electrodes 600, the relative positions of the walls 510 of the field shaping unit 502 (FIG. 12) may be the same as the relative positions of the walls 510 of the field shaping unit 500 (FIG. 6).

C. Methods of Treating Different Workpices with the Same Electrochemical Processing Chamber As noted above, certain embodiments of the present invention provide methods enabling a single electrochemical processing chamber to be used to treat different workpieces. In the following discussion of different embodiments of these methods, reference is made to the processing chambers 200 shown in FIGS. 6 and 12. It should be understood that this is solely for purposes of convenience, however, and that various methods of the invention may be carried out with processing chambers which differ from those illustrated in these drawings or which do not include all of the detailed features shown in the drawings.

In this aspect of the invention, various embodiments of electrochemical processing chambers and methods enable a single electrochemical processing chamber to be used to treat different workpieces. Many of these embodiments permit a user to process different workpieces (e.g., a 200 mm semiconductor wafer and a 300 mm semiconductor wafer) in the same electrochemical processing chamber without necessitating modification of the electrodes. For example, an electrochemical processing chamber of the invention can include a virtual electrode unit defining virtual electrodes. Simply by replacing one virtual electrode unit for another in such an embodiment, the effective electrical field in the processing chamber can be modified without requiring modification of the electrode(s). A further embodiment of the invention incorporates a virtual electrode unit in a field shaping unit which also includes one or more walls defining a separate compartment for the electrode or each of multiple electrodes. If so desired, such a field shaping unit may be replaced as a unit, further simplifying modification of the processing chamber. Certain embodiments of the invention provide methods which capitalize on the ease of replacing the virtual electrode units to thereby alter the electrical field in an electrochemical processing chamber to meet the processing needs for different workpieces.

One embodiment of the invention provides a method of modifying an electrochemical processing chamber from a first configuration for treating a first workpiece to a second configuration for treating a different second workpiece. The electrochemical processing chamber initially includes a reaction vessel having a plurality of electrodes positioned in electrically separate electrode compartments and a first virtual electrode unit. The first virtual electrode unit defines a first set of virtual electrodes having predefined relative positions adapted for treating the first workpiece, each of the virtual electrodes being in fluid communication with one of the electrode compartments. The method includes providing a second virtual electrode unit which defines a second set of virtual electrodes having predetermined relative positions adapted for treating the second workpiece, the relative positions of the virtual electrodes in the first set differing from the relative positions of the virtual electrodes in the second set. The first virtual electrode unit is replaced with the second virtual electrode unit, thereby modifying an effective electric field of the electrochemical processing chamber for treatment of the second workpiece without necessitating modification of the electrodes. This can increase the functionality of a processing line, enabling a manufacturer to readily switch from processing one type of workpiece to processing a different type of workpiece in the same electrochemical processing chamber rather than purchase a separate processing line dedicated to each type of workpiece.

In more particular aspects of this embodiment, the electrode compartments may be defined by a first plurality of walls which are coupled to the first virtual electrode unit, with the first plurality of walls and the first virtual electrode unit together defining a first field shaping unit. With such a field shaping unit, replacing the first virtual electrode unit with the second virtual electrode unit may comprise removing the first field shaping unit as a unit. In a further embodiment, the electrochemical processing chamber may initially include a first contact assembly adapted to support the first workpiece in a predetermined position with respect to the first set of virtual electrodes. In this further embodiment, a second contact assembly adapted to support the second workpiece may be provided and the first contact assembly may be replaced with the second contact assembly.

An alternative embodiment of the invention also provides a method for fairly easily modifying an electrochemical processing chamber to process different workpieces while avoiding any need to modify the electrodes. This electrochemical processing chamber initially includes a reaction vessel and a replaceable first field shaping unit. The first field shaping unit has a plurality of concentric walls and a virtual electrode unit. The walls electrically separate a plurality of concentric electrode compartments. The virtual electrode unit defines a first set of virtual electrodes having predefined relative positions, with a separate one of the virtual electrodes in fluid communication with each of the electrode compartments. The reaction vessel includes a wall defining an interior which receives the walls of the first field shaping unit and a plurality of electrodes. At least one of the electrodes is positioned in each of the electrode compartments, with adjacent electrodes being spaced from one another to define predefined spaces within which the walls are received. The method includes providing a second field shaping unit having a plurality of concentric walls and a second virtual electrode unit, with the second virtual electrode unit defining a second set of virtual electrodes having predetermined relative positions adapted for treating the second workpiece. The relative positions of the virtual electrodes in the second set differ from the relative positions of the virtual electrodes in the first set. Without modifying the electrodes, the first field shaping unit is removed from the reaction vessel as a unit. Also without modifying the electrodes, the second field shaping unit is installed in the reaction vessel as a unit, with the walls of the second field shaping unit being received in the predefined spaces between the electrodes. As a result, the virtual electrodes in the initial electrochemical processing chamber are moved to new relative positions defined by the second virtual electrode unit for treatment of the second workpiece without necessitating modification of the electrodes.

Another embodiment of the invention provides a method of effectuating electrochemical treatment of a first workpiece and a different second workpiece. This method includes providing an initial electrochemical processing chamber and a second virtual electrode unit. The initial electrochemical processing chamber includes a reaction vessel having a plurality of electrodes positioned in electrically separate electrode compartments and a first virtual electrode unit defining a first set of virtual electrodes having predefined relative positions adapted for treating the first workpiece, each of the virtual electrodes being in fluid communication with one of the electrode compartments. The second virtual electrode unit is adapted to define a second set of virtual electrodes having predefined relative positions adapted for treating the second workpiece, each of the virtual electrodes of the second virtual electrode unit being adapted for fluid communication with one of the electrode compartments. Relative positions of the virtual electrodes of the second field shaping unit are different from relative positions of the virtual electrodes of the first field shaping unit. A user is instructed to treat the first workpiece with the initial electrochemical processing chamber; to replace the first virtual electrode unit with the second virtual electrode unit, thereby modifying the initial electrochemical processing chamber by repositioning the virtual electrodes without necessity of altering the electrodes of the reaction vessel; and to treat the second workpiece with the modified electrochemical processing chamber.

A method in accordance with an alternative embodiment of the invention provides a simple process for treatment of a first workpiece and a different second workpiece in an electrochemical processing chamber. This method includes providing an electrochemical processing chamber comprising a first contact assembly, a reaction vessel, an electrode received in an interior of the reaction vessel, and a first virtual electrode unit defining a first virtual electrode in fluid communication with the electrode. A second contact assembly and a second virtual electrode unit are also provided, with the second virtual electrode unit defining a second virtual electrode. The first workpiece is supported with the first contact assembly at a predetermined position with respect to the first virtual electrode. The first workpiece is treated by applying an electrical potential to the electrode. Thereafter, the first virtual electrode unit is replaced with the second virtual electrode unit, thereby modifying an effective electric field of the electrochemical processing chamber for treatment of the second workpiece without necessitating modification of the electrodes. The second workpiece is supported with the second contact assembly at a predetermined position with respect to the second virtual electrode. Thereafter, the second workpiece is treated by applying an electrical potential to the electrode.

An alternative embodiment of the invention provides a method of effectuating assembly of an electrochemical processing chamber. In this method, a reaction vessel is provided, the reaction vessel having an outer wall and a plurality of electrodes, adjacent electrodes being spaced from one another to define a wall-receiving space therebetween. A replaceable first field shaping unit is provided, the first field shaping unit having a wall adapted to be received in the wall-receiving space between the electrodes and a first virtual electrode unit coupled to the wall. The first virtual electrode unit defines a first set of virtual electrodes having predefined relative positions. A second field shaping unit is provided, the second field shaping unit having a wall adapted to be received in the wall-receiving space between the electrodes and a second virtual electrode unit coupled to the wall. The second virtual electrode unit defines a second set of virtual electrodes having predefined relative positions. At least one functional characteristic of the first field shaping unit is identified and at least one functional characteristic of the second field shaping unit is identified. The identified functional characteristic of the first field shaping unit is different from the identified functional characteristic of the second field shaping unit, enabling a user to select between the first and second field shaping units to adapt the reaction vessel to treat a selected type of workpiece.

As noted above, other aspects of the invention provide electrochemical processing chambers. One such embodiment of the invention provides an electrochemical processing chamber including a reaction vessel having an interior, an electrode received in the interior of the react vessel, and a first virtual electrode unit. The first virtual electrode unit may comprise a dielectric material and define a first virtual electrode in fluid communication with the electrode. The first virtual electrode unit is exchangeable for a second virtual electrode unit, without necessitating modification of the electrode, to adapt the processing chamber for treating a differently-sized workpiece. Such an adaptable processing chamber permits a manufacturer significant flexibility in producing a variety of products with minimal downtime.

An electrochemical processing chamber of another embodiment of the invention includes a reaction vessel having an inner surface and a first wall spaced from the inner surface of the reaction vessel. The first wall, which may be formed of a dielectric material, electrically separates a first electrode compartment from a second electrode compartment. A first electrode is positioned in the first electrode compartment and a second electrode is positioned in the second electrode compartment. A first virtual electrode unit, which may comprise a dielectric material, defines a first virtual electrode in fluid communication with the first electrode compartment. The first partition also defines, in part, a second virtual electrode in fluid communication with the outer electrode compartment. The first virtual electrode unit is exchangeable for a second virtual electrode unit, without necessitating modification of the electrodes, to adapt the processing chamber for treating a differently-sized workpiece.

An electrochemical processing chamber in accordance with still another embodiment of the invention includes a plurality of concentric walls, which may be formed of a dielectric material, defining a plurality of concentric annular electrode compartments, and a plurality of electrodes. Each of the electrode compartments has at least one of the electrodes positioned therein. A fluid distributor has a plurality of fluid channels, each of the electrode compartments being in fluid communication with at least one of the fluid channels. A first virtual electrode unit, formed of a dielectric material, defines a plurality of flow conduits, with at least one of the flow conduits being in fluid communication with each of the electrode compartments. The first virtual electrode unit is exchangeable for a second virtual electrode unit, without modification of any of the electrodes, to adapt the processing chamber for use with a differently-sized workpiece. Avoiding the need to modify the electrodes in this fashion allows a manufacturer to adapt this embodiment to use with different workpieces quickly and without need for a separate inventory of different electrodes for each type of workpiece to be produced.

Yet another embodiment of the invention provides an electrochemical processing chamber including a reaction vessel and a replaceable field shaping unit. The reaction vessel includes a vessel wall, which defines an interior, and first and second electrodes, the first electrode being spaced radially inwardly of the second electrode. The replaceable field shaping unit includes a first wall which is removably received in the interior of the reaction vessel, the first wall being formed of a dielectric material and electrically separating a first electrode compartment from a second electrode compartment. The first electrode is positioned within the first electrode compartment and the second electrode is positioned within the second electrode compartment. The replaceable field shaping unit also includes a virtual electrode unit including a first partition formed of a dielectric material and coupled to the first wall. The first partition defines a first virtual electrode in fluid communication with the first electrode compartment and defines, in part, a second virtual electrode in fluid communication with the second electrode compartment. The replaceable field shaping unit is removable from the reaction vessel as a unit without necessitating modification of the reaction vessel. The unit-based approach to modification afforded by this embodiment can ease transition from one type of workpiece to another.

A further embodiment of the invention provides an electrochemical processing chamber including a replaceable first field shaping unit and a reaction vessel. The replaceable first field shaping unit includes a plurality of concentric walls electrically separating a plurality of concentric electrode compartments. It also includes a virtual electrode unit comprising a plurality of partitions, each of the walls having a separate partition coupled thereto. The virtual electrode unit defines a plurality of virtual electrodes, with a separate virtual electrode in fluid communication with each of the electrode compartments. The reaction vessel includes a reaction vessel, which has an interior receiving the walls of the first replaceable field shaping unit, and a plurality of electrodes, at least one of the electrodes being positioned in each of the electrode compartments. The replaceable first field shaping unit is removable from the reaction vessel as a unit for replacement with a second field shaping unit, without necessitating modification of any of the plurality of electrodes, to adapt the electrochemical processing chamber for use with a differently-sized workpiece. This embodiment also eases transitions to different types of workpieces by facilitating unit-based modification.

An electrochemical processing system in accordance with one additional embodiment of the invention includes a reaction vessel, a replaceable first field shaping unit and a replaceable second field shaping unit. The reaction vessel includes a reaction vessel and a plurality of concentric, annular electrodes. The reaction vessel has an outer wall having an upper edge and adjacent electrodes are spaced from one another to define annular wall-receiving spaces therebetween. The replaceable first field shaping unit includes a plurality of concentric walls and a first virtual electrode unit. The walls may be formed of a dielectric material and having upper edges, with the walls being positioned with respect to one another to be received in the wall-receiving spaces between the electrodes to define a plurality of concentric electrode compartments, with at least one of the electrodes being received within each of the electrode compartments. The first virtual electrode unit, which may also be formed of a dielectric material, is coupled to the walls adjacent their upper edges and adapted to abut the outer wall of the reaction vessel adjacent the upper edge thereof. The first virtual electrode unit defines a first set of discharge openings having predefined relative positions, each of the discharge openings of the first set being adapted for fluid communication with one of the electrode compartments, with each discharge opening of the first set defining a position of an virtual electrode. The replaceable second field shaping unit is much like the first field shaping unit, but has a second set of discharge openings relative positions differing from the relative positions of the discharge openings of the first set. The first field shaping unit and the second field shaping unit are each adapted for installation in and removal from the reaction vessel as a unit. Providing such a reaction vessel and different field shaping units allows a manufacturer to configure the electrochemical processing system to meet current production needs with a minimum of difficulty and wasted workpiece-dependent components.

Still another embodiment of the invention provides an electrochemical processing chamber including a reaction vessel having an interior; an electrode received in the interior of the reaction vessel; a first virtual electrode unit and a first contact assembly. The first virtual electrode unit, which may comprise a dielectric material, defines a first virtual electrode in fluid communication with the electrode. The first contact assembly is adapted to support a workpiece in a predetermined position with respect to the first virtual electrode. The first contact assembly is exchangeable for a second contact assembly and the first virtual electrode unit is exchangeable for a second virtual electrode unit, without necessitating modification of the electrode, to adapt the processing chamber for treating a differently-sized workpiece. Providing exchangeable contact assemblies and exchangeable virtual electrode units in accordance with this embodiment extends functionality of the processing chamber without requiring complex, time-consuming changes to switch from one size of workpiece to another.

One embodiment of the invention provides a method for modifying an electrochemical processing chamber 200 from a first configuration for treating a first workpiece 101 (shown in FIG. 3) to a second configuration for treating a different second workpiece 101a (shown in FIG. 13). The second workpiece 101a may differ from the first in terms of size (as in the illustrated embodiment), electrical properties, or a variety of other features, as noted above. An electrochemical processing chamber 200 is initially configured to treat the first workpiece 101. For example, the electrochemical processing chamber 200 of FIG. 6 may include a first virtual electrode unit 530 which defines a plurality of virtual electrodes sized and positioned to electroplate a metal on a particular type of workpiece, e.g., a 300 mm semiconductor wafer. One of these workpieces will be positioned in the contact assembly 160 (FIG. 3) and the contact assembly 160 may be positioned over the reaction vessel 204 with a surface of the workpiece in contact with a processing solution in the reaction vessel 204. The workpiece may then be treated with the electrochemical processing chamber 200. When using the apparatus shown in FIG. 6, this could include delivering a primary fluid flow $F_p$ through the first inlet 320 and delivering a secondary fluid flow $F_2$ through the plenum 330. An electrical potential may be applied to the electrodes 600 and the secondary fluid flow $F_2$ may pass through the electrode compartments 320a–d, through the discharge openings defined by the virtual electrode unit 530, and into electrical contact with the primary fluid flow $F_p$.

After the first workpiece 101 is treated, the electrochemical processing chamber 200 may be modified to treat a different second workpiece 101a, e.g., a 200 mm semiconductor wafer. As suggested in FIG. 11, this may be achieved by lifting the contact assembly 160 and removing the initial virtual electrode unit 530 of FIG. 6 from the reaction vessel 204. Thereafter, a different virtual electrode unit 540 (FIG. 12) may be installed in the reaction vessel. In one embodiment, the initial virtual electrode unit 530 is removed as a unit, but the walls 510 remain in place. The second virtual electrode unit 540 may then be installed by placing it atop the upper edges of the same walls 510. In an alternative embodiment, the walls 510 are coupled to the first virtual electrode unit 530 and the entire field shaping unit 500 of FIG. 6 is removed as a unit. Thereafter, the second field shaping unit 502 may be installed in the reaction vessel 204, yielding an electrochemical processing chamber 200 essentially as shown in FIG. 12. When installing the second field shaping unit 502 in the reaction vessel 204, the walls 510 of the second field shaping unit 502 may be inserted in the annular spaces between adjacent electrodes previously occupied by the walls 510 of the first field shaping unit 500. Similarly, the lower edges of the walls 510 of the second field shaping unit 502 may be positioned in the annular recesses 314 in the distributor 310 previously occupied by lower edges of the walls 510 of the first field shaping unit 500.

After the electrochemical processing chamber 200 has been adapted for treating the second type of workpiece, one of the second workpieces may be treated with the modified electrochemical processing chamber 200. The process may substantially parallel that outlined above in connection with treating the first workpiece. Depending on the nature of the contact assembly 160 being used and the differences between the workpieces, it may be necessary to replace the contact assembly 160 used to treat the first workpiece 101 with a different contact assembly 161 better suited to handle the second type of workpiece 101a. FIG. 13 schematically illustrates the electrochemical processing chamber of FIG. 3 modified for use with a smaller second workpiece 101a. In FIG. 13, the contact assembly 160 of FIG. 3 has been replaced with a smaller contact assembly 161 sized to accommodate the smaller workpiece 101a carried thereby. The rotor 154 and backing plate 155 of FIG. 3 may also replaced with like components better adapted to mate with the smaller contact assembly 161. Once the second workpiece 101a is properly positioned in an appropriate contact assembly 161, the contact assembly 161 may be positioned over the reaction vessel 204 with a surface of the workpiece in contact with a processing solution, the primary and secondary fluid flows $F_p$ and $F_2$ may be established and power may be applied to the electrodes 600, as outlined above in connection with treatment of the first workpiece.

Figure 1B:
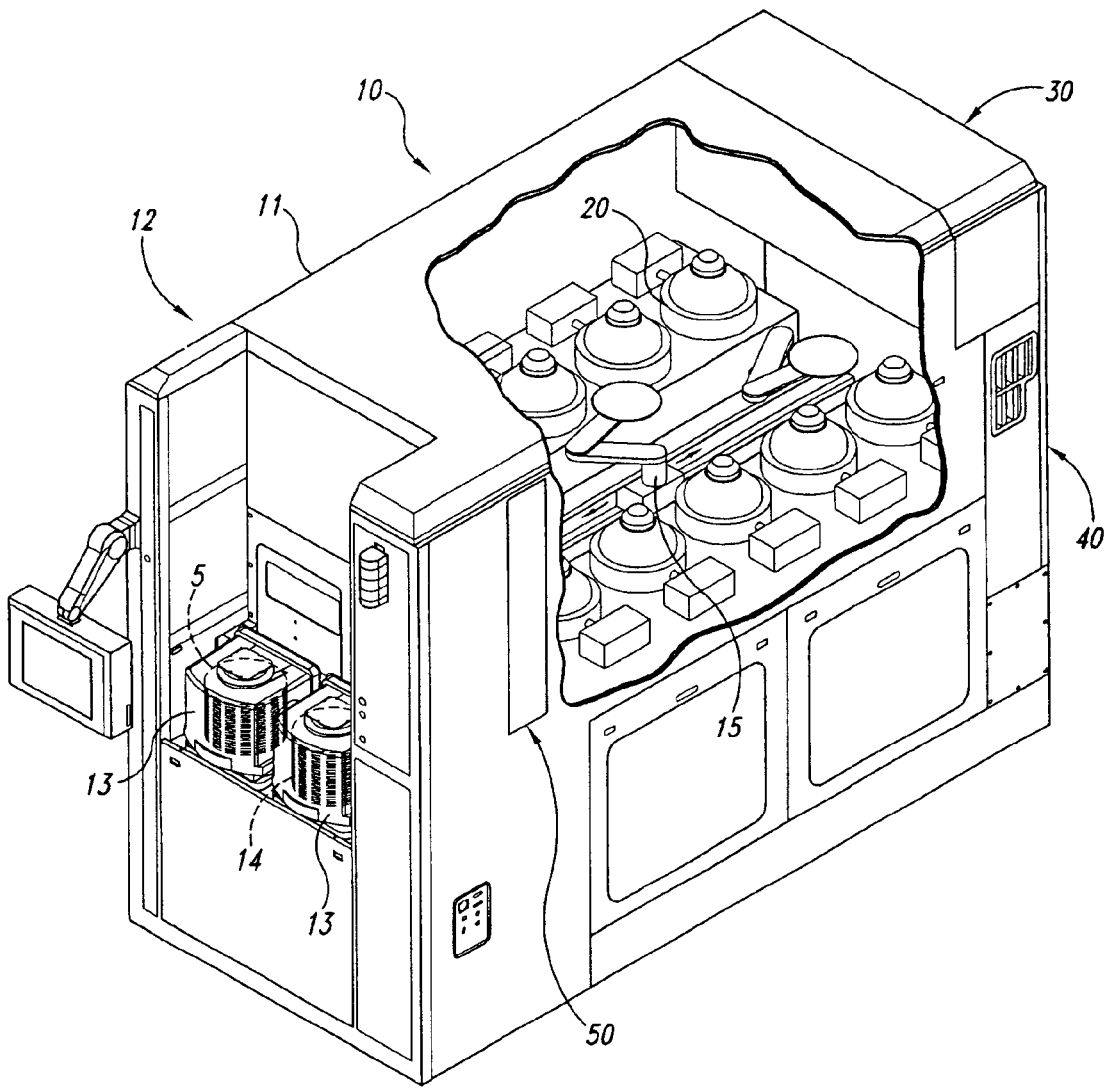
FIG. 1B is an isometric view of an electrochemical processing tool in accordance with the prior art.

As noted above, the virtual electrodes defined by the first virtual electrode unit 530 (FIG. 6) may be sized and shaped to optimize electrochemical processing for the first workpiece and the virtual electrodes defined by the second virtual electrode unit 540 (FIG. 12) may be sized and shaped to optimize electrode chemical processing for the second workpiece. Simply by replacing the first field shaping unit 500 with the second field shaping unit 502 thereby permits the same electrochemical processing chamber 200 to be optimized for treating two different workpieces without necessitating modification of the electrodes 600 in the reaction vessel 204. This is indirect contrast to conventional single wafer processing chambers 1 such as that shown in FIG. 1, wherein attempting to adapt the processing chamber for use with differently sized workpieces would necessitate significant modifications. These modifications would include removing the anode 4 and primary flow guide 6 and replacing them with new, different parts. The electrical connection of the anode 4 to its power supply can complicate this exchange, particularly as compared to the simple modification process afforded by this embodiment of the present invention.

Another embodiment of the present invention permits a manufacturer to effectuate electrochemical treatment of two different workpieces by providing an initial electrochemical processing chamber 200 and a second virtual electrode unit 540 and giving the user appropriate instructions. The initial electrochemical processing chamber 200 may be substantially the same as that shown in FIG. 6 and include a virtual electrode unit 530 optimized for treating the first workpiece. The second virtual electrode unit 540 may define virtual electrodes having predefined relative positions optimized for treating the second workpiece. The user may be instructed to treat the first workpiece with the initial electrochemical processing chamber 200; to replace the first virtual electrode unit 530 with the second virtual electrode unit 540, thereby modifying the initial electrochemical processing chamber by repositioning the virtual electrodes without necessity of altering the electrodes of the reaction vessel; and to treat the second workpiece with the modified electrochemical processing chamber. The user may be instructed in any appropriate way. This may include written communication such as a written instruction manual, hands-on training, and/or videotaped instruction, for example.

An alternative embodiment of the invention provides a method of effectuating assembly of an electrochemical processing chamber 200. This embodiment includes providing a reaction vessel 204 having an outer wall 222, a plurality of electrodes (e.g., 600a and 600b), and a wall-receiving space between adjacent electrodes. A replaceable first field shaping unit (e.g., the field shaping unit 500 of FIG. 6) is provided. The first field shaping unit 500 has at least one wall (e.g., wall 510b) adapted to be received in the wall-receiving space between the electrodes 600. The first field shaping unit has a first virtual electrode unit 530 coupled to the wall 510. The first virtual electrode unit 530 defines a first set of virtual electrodes (e.g., $VE_1$ and $VE_2$) having predefined relative positions. A second field shaping unit 500 (e.g., the one shown in FIG. 8) is provided, with the second field shaping unit 500 also having at least one wall (e.g., wall 510b) adapted to be received in the wall-receiving space between the electrodes 600. The second field shaping unit 500 has a second virtual electrode unit 540 coupled to the wall 510 and defining a second set of virtual electrodes (e.g., $VE_1$ and $VE_2$) having predefined relative positions.

At least one functional characteristic of the first field shaping unit 500 is identified and at least one functional characteristic of the second field shaping unit 500 is identified. The identified functional characteristic of the first field shaping unit 500 is different from the identified functional characteristic of the second field shaping unit 500. For example, the first field shaping unit 500 may be identified as being adapted for use with a particular size of workpiece, such as a 300 mm semiconductor wafer, and the second field shaping unit may be identified as being adapted for use with a different size of workpiece, such as a 200 mm semiconductor wafer. This identifying information may enable a user to select between the first and second field shaping units to adapt the reaction vessel to treat a selected type of workpiece.

D. Selected Embodiments of Transfer Devices For Handling Microelectronic Workpieces in Processing Machines Another aspect of the processing tool 100 is that the transfer device 130 enhances the throughput and reduces the complexity of automatically handling the microelectronic workpieces inside the cabinet 102 (FIG. 2). As explained above, one aspect of the transfer device 130 is that it provides a single robot with dual end-effectors to efficiently handle the workpieces within the cabinet 102 in a manner that requires fewer components and less complex collision avoidance computer algorithms.

Several embodiments of integrated tools in accordance with this aspect of the invention comprise a single robot, dual end-effector transfer device that is expected to increase the flexibility of designing integrated tools. By using a single robot, less space is needed within the cabinet for the robot. As a result, more space can be used for the processing chambers so that larger processing chambers can be used in the same or very similar foot print as smaller chambers. This is useful as many device fabricators transition from using 200 mm wafers to 300 mm wafer because 300 mm tools can be used in approximately the same area as 200 mm tools, and the 300 mm tools can have the same number of processing chambers as the 200 mm tools. Thus, several embodiments of single robots with dual end-effectors in accordance with the invention allow designers to more easily replace 200 mm tools with 300 mm tools.

Another feature is that each of the end-effectors of the single robot can service processing chambers in either row inside tool. The integrated tools can accordingly have several different configurations of processing chambers that can be assembled on a "custom basis." The processing chambers can have a common configuration so that different types of processing chambers can be mounted to the tool within the cabinet. By providing a robot with two end effectors that have a significant range of motion, each end-effector can access any of the processing chambers so that the configuration of the processing chambers in the tool is not limited by the motion of the robot and/or the end-effectors. Therefore, the processing chambers can be arranged in a configuration that affords an efficient movement of workpieces through the tool to enhance the throughput.

The throughput of finished workpieces is also expected to be enhanced because the workpieces cannot collide with each other or another robot in the tool when a single robot with dual end-effectors is used. The robot can accordingly be a high-speed device that moves quickly to reduce the time that each workpiece rests on an end-effector. Additionally, the robot can move quickly because it does not need complex collision-avoidance software that takes time to process and is subject to errors. The single robot can accordingly service the processing stations as quickly as a dual robot system with single end-effectors on each robot. In several embodiments of the invention, therefore, the combination of having a fast, versatile robot and a flexible, efficient arrangement of processing stations provides a high throughput (w/hr/ft$^2$) of finished workpieces.

In one embodiment, a transfer device can include a transport unit configured to move along a linear track and an arm assembly operatively coupled to the transport unit. For example, the transfer device can further include a lift assembly carried by the transport unit, and the arm assembly can be coupled to the lift assembly. The arm assembly can include an arm actuator carried by the lift assembly to move along a lift path and an arm carried by the arm actuator to rotate about the lift path. The arm can include a first extension projecting from one side of the lift path and a second extension projecting from another side of the lift path. The arm actuator can rotate the arm about the lift path to position the first and second extensions relative to processing stations of an apparatus. The transfer device can also include a first end-effector and a second end-effector. The first end-effector is rotatably coupled to the first extension of the arm to rotate about a first rotation axis, and the second end-effector is rotatably coupled to the second extension of the arm to rotate about a second rotation axis. The first and second rotation axes can be generally parallel to the lift path, which itself can be substantially oblique or normal to the track.

The arm can include a medial section coupled to the lift actuator. The first extension can project from one side of the medial section, and the second extension can project from another side of the medial section. The first and second extensions can be integral with one another or they can be separate sections that are fixedly attached to each other. As a result, the transfer device can include a single arm with two extensions such that rotation of the arm causes both of the extensions to rotate about a single axis. In still another embodiment, the first end-effector is spaced above the arm by a first distance, and the second end-effector is spaced above the arm by a second distance. The first distance is different than the second distance to space the first end-effector at a different elevation than the second end-effector. The different spacing of the first and second end-effectors relative to the arm allows the device to carry two workpieces in a superimposed relationship without the potential of a collision between the workpieces. Several additional embodiments and alternate embodiments of devices, systems and methods are also included in the invention.

Figure 14A:
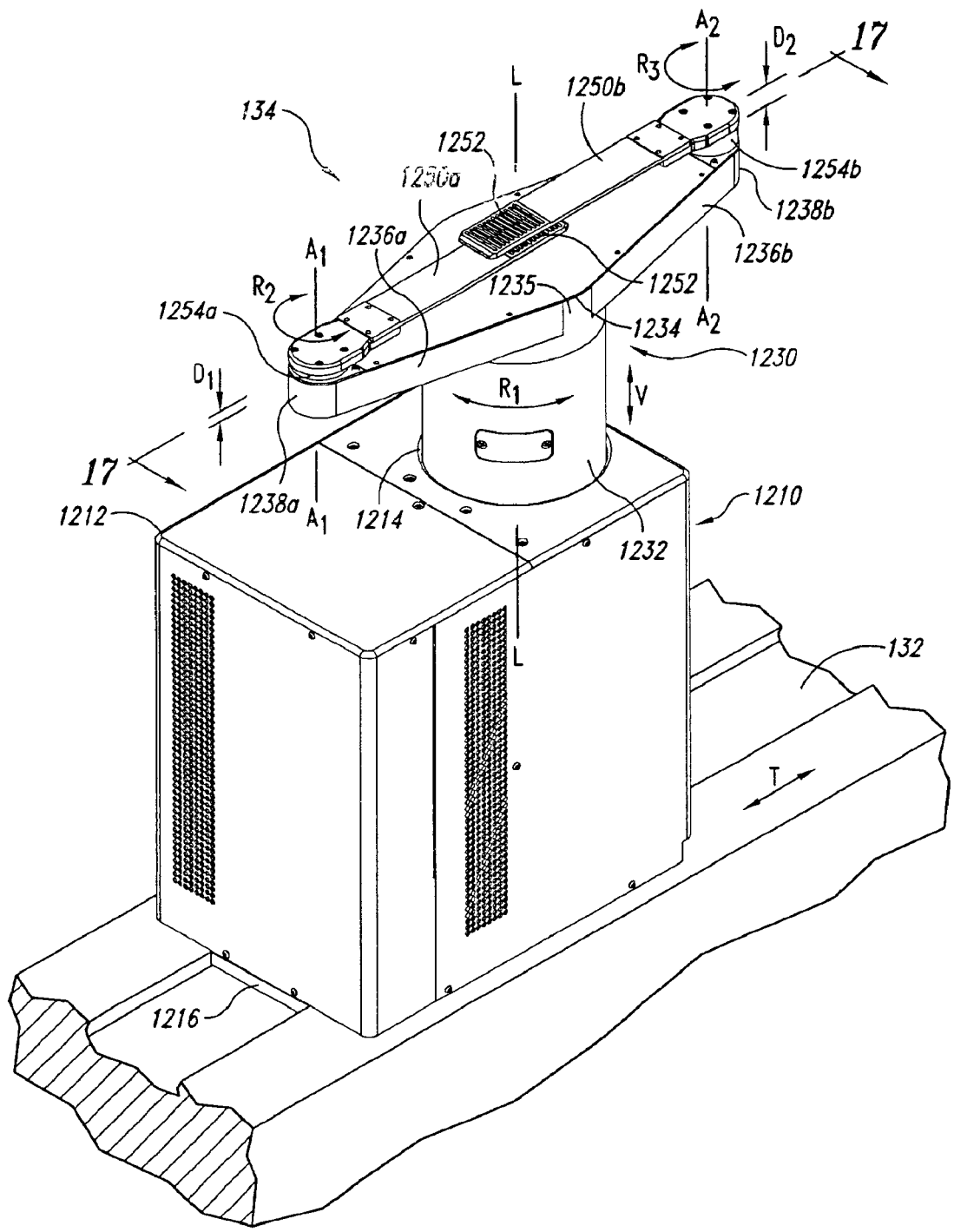
FIGS. 14A and 14B are isometric views of transfer devices for handling microelectronic workpieces in accordance with embodiments of the invention.

FIG. 14A illustrates an embodiment of the robot unit 134 shown in FIG. 2 in greater detail. The robot unit 134 can include a transport unit 1210, an arm assembly 1230 carried by the transport unit 1210, and first and second end-effectors 1250 (identified individually by reference numbers 1250a and 1250b) carried by the arm assembly 1230. The transport unit 1210 can include a shroud or housing 1212 having a plurality of panels attached to an internal frame (not shown in FIG. 14A). An opening 1214 in a top panel of the housing 1212 receives a portion of the arm assembly 1230. It will be appreciated that the transport unit 1210 and the housing 1212 can have many different configurations depending upon the particular environment in which the robot unit 134 is used. The transport unit 1210, for example, can be a base that can be stationary, rotary, or move in a non-linear manner. The transport unit 1210 can also include a guide member configured to move laterally along the rack 132. The particular embodiment of the transport unit 1210 shown in FIG. 14A includes a guide member defined by a base plate 1216 that slidably couples the robot unit 134 to the track 132. The robot unit 134 can accordingly translate along the track 132 (arrow 7) to position the robot unit 134 adjacent to a desired processing station 120 (FIG. 2).

The arm assembly 1230 can include a waist member 1232 that is coupled to a lift assembly (not shown in FIG. 14A). The arm assembly 1230 can also include an arm 1234 having a medial section 1235, a first extension 1236a projecting from one side of the medial section 1235, and a second extension 1236b extending from another side of the medial section 1235. The first and second extensions 1236a–b of the arm 1234 can be diametrically opposed to one another as shown in FIG. 14A, or they can extend at a desired angle to each other. In one embodiment, the first and second extensions 1236a and 1236b are integral with another, but in alternate embodiments the first and second extensions 1236a and 1236b can be individual components that are fixed to each other.

The arm assembly 1230 can move along a lift path L—L to change the elevation of the arm 1234 for positioning the end-effectors 1250 at desired elevations. The lift path L—L generally extends transverse to the track 132, which as used herein includes any oblique or perpendicular arrangement. The arm assembly 1230 can also rotate (arrow RI) about the lift path L—L to position a distal end 1238a of the first extension 1236a and/or a distal end 1238b of the second extension 1236b proximate to a desired workpiece container 114 or processing station 120. The first and second extensions 1236a–b generally rotate about the lift path L—L as a single unit because they are integral or fixed with each other. The motion of the first and second extensions 1236a–b are accordingly dependent upon each other in this embodiment. In alternate embodiments, the arm 1234 can have extensions that are not fixed to each other and can move independently from each other. Selected embodiments of lift assemblies for moving the arm assembly 1230 along the lift path L—L and other assemblies for rotating the arm 1234 about the lift path are described in more detail below with reference to FIGS. 16 and 17.

The end-effectors 1250 are rotatably carried by the arm 1234. In one embodiment, the first end-effector 1250a is rotatably coupled to the first distal end 1238a to rotate about a first rotation axis $A_1$—$A_1$ (arrow $R_2$). The second end-effector 1250b can be rotatably coupled to the second distal end 1238b of the arm 1234 to rotate about a second rotation axis $A_2$—$A_2$ (arrow $R_3$). The first and second rotation axes $A_1$—$A_1$ and $A_2$—$A_2$ can extend generally parallel to the lift path L—L, but in alternate embodiments these axes can extend transverse to the lift path L—L. The end-effectors 1250a–b can each include a workpiece holder 1252 for holding the workpieces 101 to the end-effectors 1250. The workpiece holders 252 shown in FIG. 14A are vacuum chucks that hold the workpieces 101 to the end-effectors 1250 using suction. Alternate embodiments of workpiece holders 1252 can include edge-grip end effectors, such as those disclosed in the foregoing patent applications that have been incorporated by reference. As explained in more detail below with reference to FIGS. 15A 15C, the rotational motion of (a) the arm 1234 about the lift path L—L, (b) the first end-effector 1250a about the first rotation axis $A_1$—$A_1$, and (c) the second end-effector 1250b about the second rotation axis $A_2$—$A_2$ can be coordinated so that the first and second end-effectors 1250a and 1250b can each be positioned adjacent to any of the workpiece containers 114 and processing stations 120 on either side of the cabinet 102 (FIG. 2).

The first end-effector 1250a can be spaced apart from the arm 1234 by a first distance $D_1$, and the second end-effector 1250b can be spaced apart from the arm 1234 by a second distance $D_2$. In the embodiment shown in FIG. 14A, the distance $D_1$ is less than the distance $D_2$ such that the first end-effector 1250a is at a different elevation than the second end-effector 1250b. The first end-effector 1250a accordingly moves through a first plane as it rotates about the first rotation axis $A_1$—$A_1$, and the second end-effector 1250b moves through a second plane as it rotates about the second rotation axis $A_2$—$A_2$. The first and second planes are generally parallel and fixedly spaced apart from each other so that the end-effectors 1250a–b cannot interfere with each other. The first and second planes, however, can have other arrangements (i.e., nonparallel) so long as they do not intersect in a region over the arm 1234. The first and second end-effectors 1250a and 1250b can be fixed at the particular elevations relative to the arm 1234 using spacers or other types of devices. For example, the first end effector 1250a can be spaced apart from the arm 1234 by a first spacer 1254a, and the second end-effector 1250b can be spaced apart from the arm 1234 by a second spacer 1254b. The first and second spacers 1254a–b can have different thicknesses to space the end-effectors 1250 apart from the arm 1234 by the desired distances.

Figure 14B:
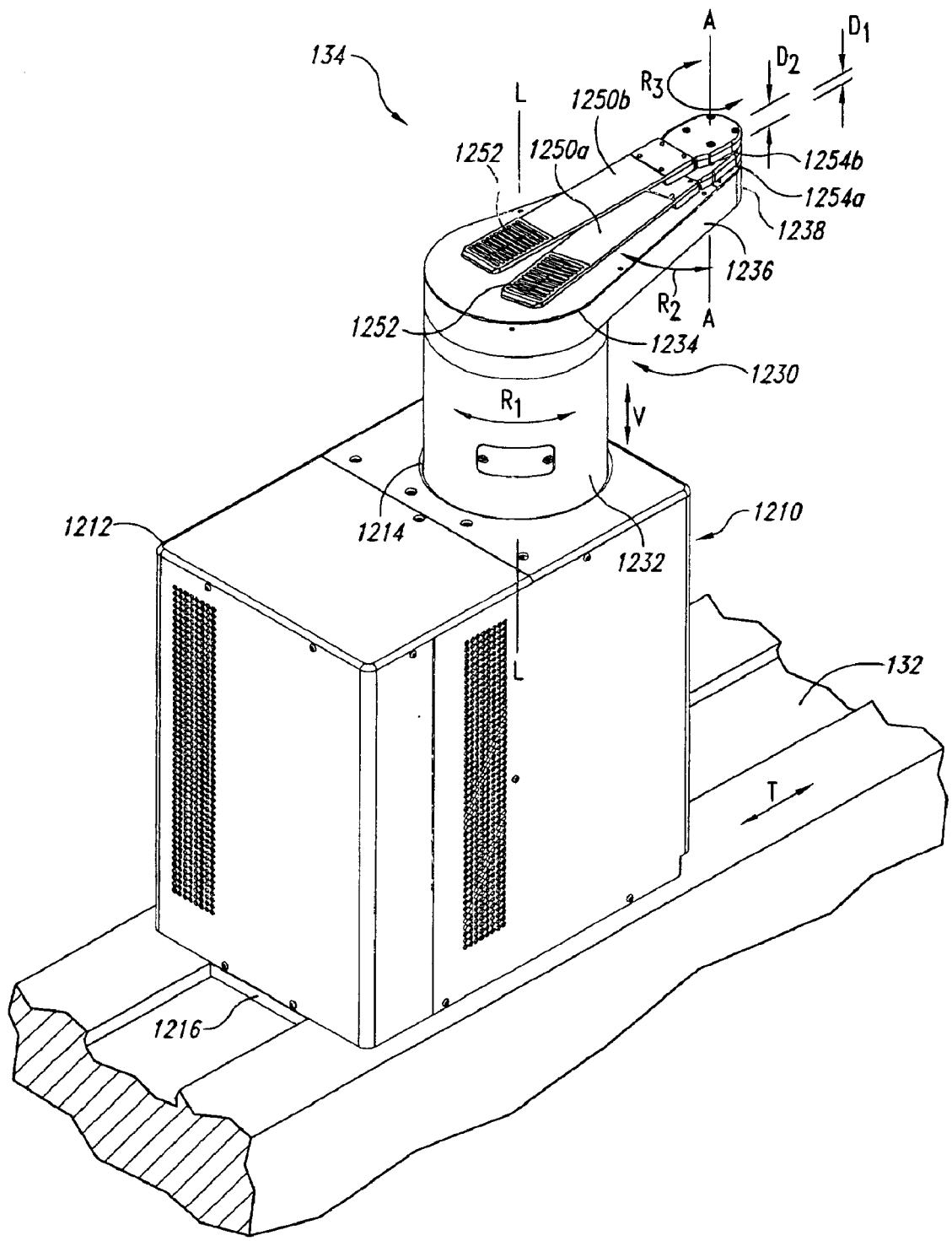

The first and second end-effectors 1250a–b and the arm 1234 can have different configurations than the configuration shown in FIG. 14A. For example, as shown in FIG. 14B, the arm 1234 can have only a single extension 1236 projecting from the waist member 1232 and both of the end-effectors 1250a–b can be carried by the "single-extension" arm such that the first and second end-effectors 1250a–b are fixed at different elevations relative to the arm 1234. The end-effectors 1250a–b, for example, can be coupled to the end 1238 of the arm and rotate about a common rotation axis A—A.

Figure 15A:
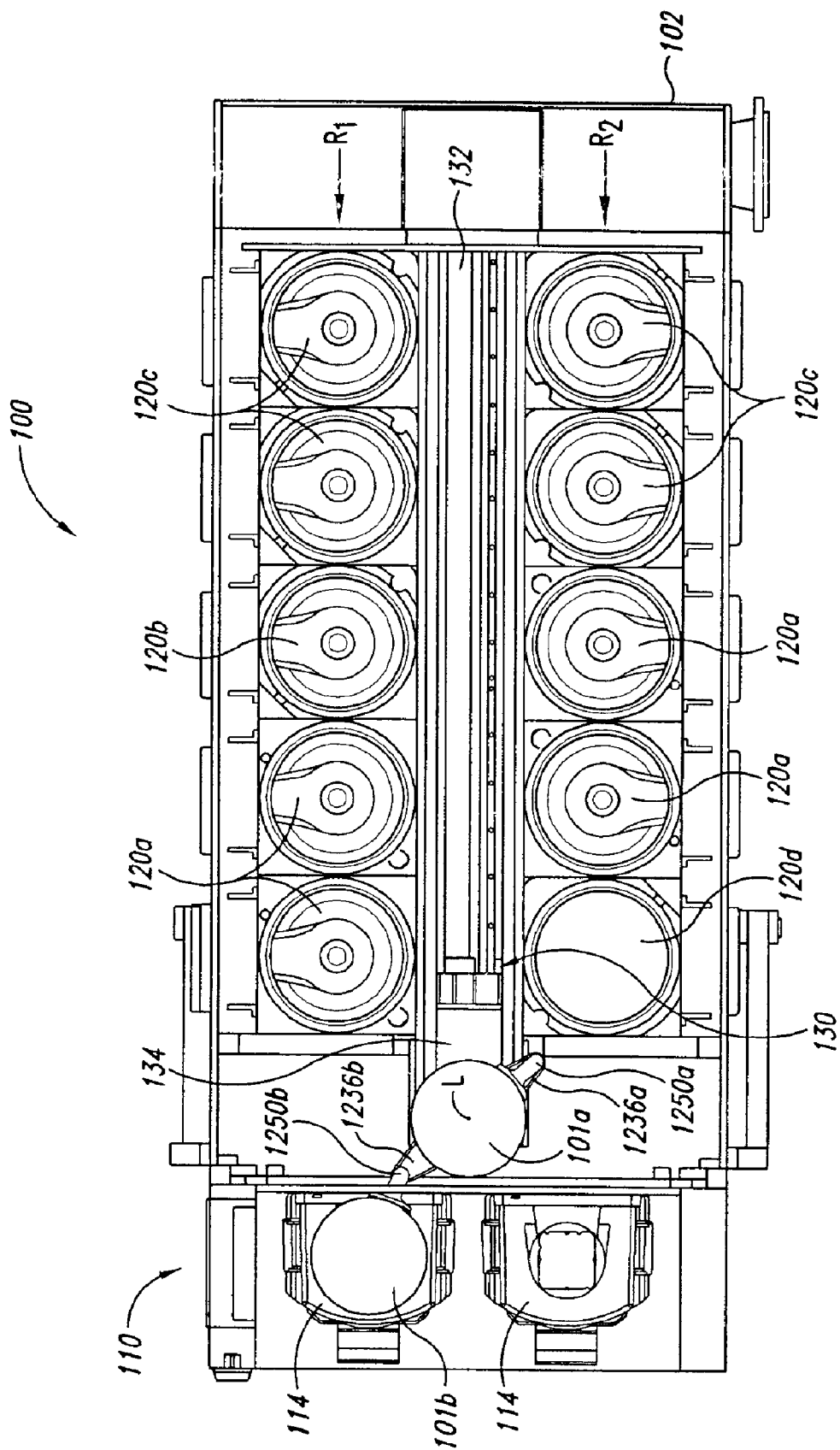
FIG. 15A is a top plan view of a processing apparatus for processing microelectronic workpieces showing one configuration for operating a transfer device in accordance with an embodiment of the invention.
Figure 15B:
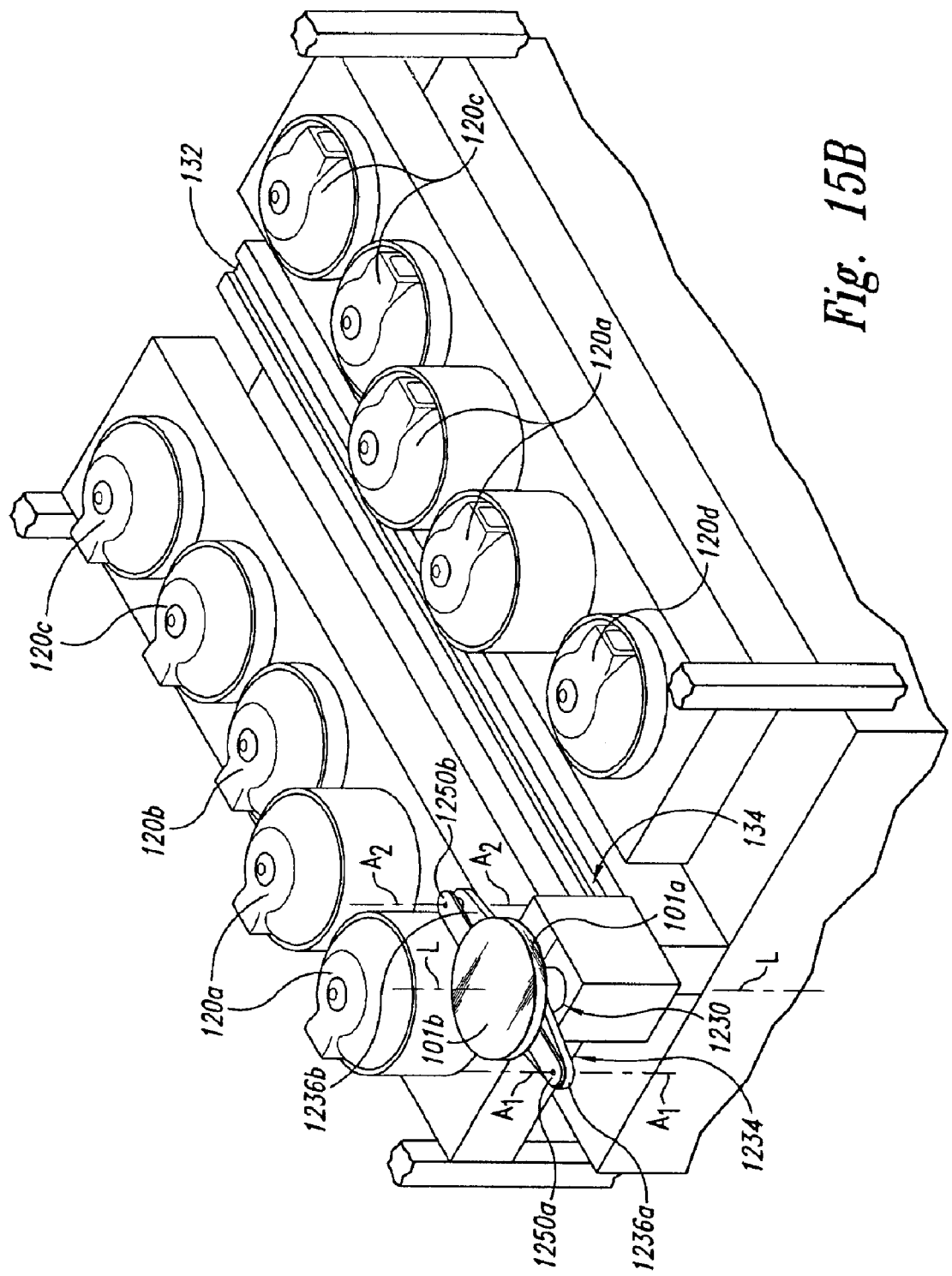
FIG. 15B is a partial isometric view of the transfer device of FIG. 15A showing another configuration for operating the transfer device.
Figure 15C:
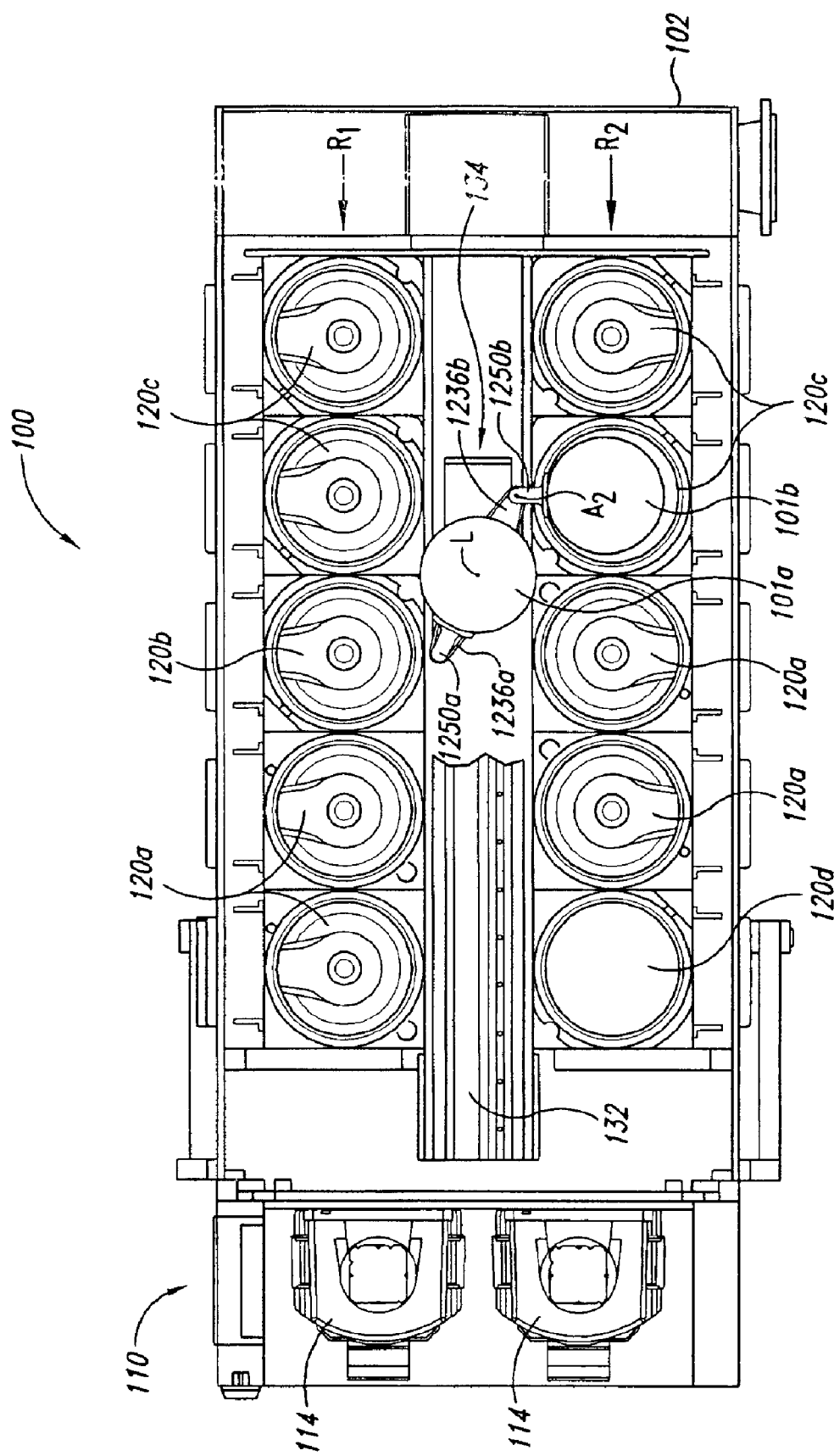
FIG. 15C is a top plan view of the transfer device of FIGS. 15A and 15B showing another configuration for operating the transfer device.

FIGS. 15A–15C illustrate an arrangement of processing stations 120 and several configurations of operating the transfer device 130 in greater detail. The processing stations 120 can include any combination or single type of single-wafer units including (a) clean/etch capsules 120a; (b) electroless plating chambers 120b; (c) electroplating chambers 120c; (d) Rapid Thermal Annealing (RTA) chambers 120d; (e) metrology stations (not shown in FIG. 15A); and/or other types of single-wafer processing stations. In the particular embodiment shown in FIG. 15A, the first row $R_1$ of processing stations 120 includes a plurality of clean/etch capsules 120a proximate to the load/unload station 110, an electroless plating chamber 120b downstream from the clean/etch capsules 120a, and a plurality of electroplating chambers 120c downstream from the electroless plating chamber 120b. The second row $R_2$ of processing stations of this particular embodiment has a similar arrangement, except that an RTA chamber 120d is at the output side of the load/unload station 110 and there is not an electroless chamber between the clean/etch capsule 120a and the electroplating chambers 120c.

The arrangement of processing stations illustrated in FIG. 15A represents only one example of how the processing stations 120 can be arranged within the cabinet 102. In alternate embodiments a metrology station can be substituted for one or more of the other processing stations, the position of the processing stations relative to the load/unload station 110 can be changed, and/or other types of processing stations can be used such that some of the processing stations illustrated in FIG. 15A may not be included in the processing apparatus 100. For example, the position of the clean/etch capsules 120a and the electroplating chambers 120c can be switched, or additional electroplating chambers 120c can be substituted for the electroless chamber 120b and the RTA chamber 120d.

FIG. 15A illustrates one configuration of operating the transfer device 130 after a first workpiece 101a has been loaded onto the first end-effector 1250a. The operation of the first end-effector 1250a can be similar to that of the second end-effector 1250b, and thus only he movement of the second end-effector 1250b will be described below for purposes of brevity. The robot unit 134 can move the arm assembly 1230 (FIG. 14A) so that the second end effector 1250*b* can pick up a second workpiece 101*b* from a workpiece container 114. To do this the robot unit 134 positions the first workpiece 101*a* in a transport position over the lift path L—L, and then the arm assembly 1230 (FIG. 14A) moves vertically until the second end effector 1250*b* is at a desired height to pass underneath the second workpiece 101*b*. The arm assembly 1230 then rotates the second extension 1236*b* about the lift path L—L (FIG. 14A) and/or the second end-effector 1250*b* rotates about the second rotation axis $A_2$—$A_2$ (FIG. 14A) until the second end-effector 1250*b* is under the second workpiece 101*b*. The arm assembly 1230 can then be raised as a vacuum is drawn through the workpiece holder 1252 (FIG. 14A) to securely hold the second workpiece 101*b* to the second end-effector 1250*b*. The robot unit 134 then extracts the second workpiece 101*b* from the workpiece container 114 by a combination of movements of the robot unit 134 along the track 132, rotation of the second extension 1236*b* about the lift path L—L, and/or rotation of the second end-effector 1250*b* about the second rotation axis $A_2$—$A_2$. The remaining workpieces in the container 114 can be loaded onto the end-effectors 1250 in subsequent processing in a similar manner by further adjusting the height of either the workpiece container 114 and/or the arm assembly 1230 (FIG. 14A) or they can be unloaded into the other container 114 by reversing this procedure. In general, it is more desirable to move the arm assembly to the correct height than it is to move the workpiece container 114 because this eliminates the need to precisely index all of the workpieces each time. After picking up the workpieces 101, the transfer device 130 can load or unload any of the workpieces 101 carried by the robot unit 134 in any of the processing stations 120 in either the first row $R_1$ or the second row $R_2$.

The flow of the workpieces through the processing stations 120 varies according to the particular application and use of the processing apparatus 100. In one embodiment, the transfer device 130 can restrict one of the end-effectors to handle only clean workpieces and the other end-effector to handle only dirty workpieces. The clean end-effector can be used to handle the workpieces in the workpiece containers and to remove the workpieces from the clean/etch capsules 120*a*. The dirty end-effector can be used to remove workpieces from the plating chambers 120*b* and 120*c* and then input the dirty workpieces into the clean/etch capsules 120*a*.

One particular process flow for plating copper or other materials onto the second workpiece 110*b* involves placing the second workpiece 101*b* in either (a) the electroless plating chamber 120*b* if the seed layer needs to be enhanced or (b) one of the electroplating chambers 120*c*. After the workpiece 101*b* has been plated, the transfer device 130 extracts the workpiece 101*b* from the corresponding electroplating chamber 120*c* and typically places it in a clean/etch chamber 120*a*. The second workpiece 101*b* can then be withdrawn from the clean/etch capsule 120*a* and placed in the other workpiece container 114 for finished workpieces (the "out-WIP"). It will be appreciated that this process flow is merely one example of potential process flows, and that the movement of the workpieces through the processing stations 120 varies according to the particular configuration of the processing apparatus 100 and the processes being performed on the workpieces. For example, the workpiece 101*b* can be transferred to the annealing chamber 120*d* after the clean/etch chamber 120*a* before it is placed in the out-WIP.

FIG. 15B illustrates another configuration of operating the transfer device 130 in which the workpieces 101*a*–*b* are positioned for being moved along the track 130. The second workpiece 101*b* is superimposed over the first workpiece 101*a* by rotating the first end-effector 1250*a* about the first rotation axis $A_1$—$A_1$ and rotating the second end-effector 1250*b* about the second rotation axis $A_2$—$A_2$ until both end-effectors are over the arm. The arm 1234 also rotates about the lift path L—L so that the arm 1234 and the first and second extensions 1236*a* and 1236*b* extend generally in the direction of the track 132. The robot unit 134 can then translate along the track 132 between the processing stations 120.

The configuration illustrated in FIG. 15B is particularly useful in 300 mm applications to reduce the overall width of the processing apparatus 100. It is desirable to minimize the area of the floor space occupied by each processing apparatus, but many designs for accommodating 300 mm wafers tend to occupy much larger areas than those for use with 200 mm wafers because the processing stations and the area between the processing stations must be able to accommodate the larger wafers. By superimposing the workpieces over one another for transport along the track 132, the open area used for transporting the workpieces between the rows of processing stations can be reduced to approximately the diameter of a single workpiece. Additionally, the same configuration can be used for handling 200 mm wafers such that the area of floor space occupied by a 300 mm tool is not significantly more, if any, than a 200 mm tool. After the workpieces 101*a*–*b* are superimposed for movement along the track 132, the robot unit 134 can move along the track to a desired processing station and the arm assembly 1230 can move vertically along the lift path L—L to position the workpieces at desired elevations.

FIG. 15C illustrates another configuration of operating the transfer device 130 in which the robot unit 134 is loading the second workpiece 101*b* into one of the electroplating chambers 120*c*. The robot unit 134 slides along the track 132 until the second extension 1236*b* of the arm 1234 (FIG. 15B) is proximate to the desired electroplating station 120*c*. The arm 1234 then rotates about the lift path L—L and the second end-effector 1250*b* rotates about the second rotation axis $A_2$—$A_2$ until the second workpiece 101*b* is positioned over an inverted head of the electroplating station 120*c*. The robot unit 134 can accordingly position each of the end-effectors 1250*a* and 1250*b* on the desired side of the cabinet 102 and at a desired height so that the end-effectors 1250*a* and 1250*b* can each access any of the processing stations 120 in either the first row $R_1$ or the second row $R_2$. The transfer device 130 accordingly provides a single-robot having a single arm and dual end-effectors that can service any of the workpiece containers 114 and/or processing modules 120 within the cabinet 102.

Several embodiments of the transfer device 130 are expected to prevent collisions with the workpieces 101 without complex software algorithms or complex mechanical systems. An aspect of these embodiments of the transfer device 130 is that they have only a single arm and the end-effectors are coupled to the single arm so that the first end-effector operates in a first plane and the second end-effector operates in a second plane that does not intersect the first plane over the arm. The first and second end-effectors can be mechanically spaced apart from each other to operate in different planes by rotatable spacers that space the first and second end effectors apart from the arm by first and second distances, respectively, irrespective of the elevation of the arm itself. The end-effectors are thus arranged so that they can rotate freely relative to the arm but the workpieces cannot collide with each other. Therefore, the embodiments of the transfer device 130 that have a single arm with end-effectors coupled to the arm at different elevations are expected to mitigate collisions between the workpieces.

Several embodiments of the transfer device 130 are also versatile and can be used in many different tools because the end-effectors have a significant freedom of movement. An aspect of an embodiment of the transfer device 130 is that the arm can (a) translate along a track through the machine, (b) move transversely to the track along a lift path to change the elevation of the end-effectors, and (c) rotate about the lift-path. This allows the arm to position the end-effectors effectors at a number of locations and elevations within the tool so that the tool can have several different types and arrangements of processing stations serviced by a single robot. Another aspect is that the end-effectors can be located at opposite ends of the arm, and they can independently rotate about the arm. This allows each end-effector to service any of the processing stations within the tool. Thus, several embodiments of the transfer device 130 provide the benefits of having two independently operable end-effectors in a single robot unit without the complex mechanical components and software required for systems with two separate robot units.

Many of the embodiments of the transfer device 130 also provide a high throughput of finished wafers. The throughput of a machine used to fabricate microelectronic devices is typically measured by the w/hr/ft² processed through the machine. One aspect of providing a high throughput is that the linear track allows several processing stations to be arranged in rows which are serviced by a single robot. The linear arrangement of processing stations and the linear-track transfer device significantly decrease the floor space required for each processing station compared to systems that use a rotary robot system. Moreover, by transferring the workpieces along the track in a superimposed arrangement, the distance between the rows of processing stations can be reduced to approximately a single wafer diameter. This is particularly useful in 300 mm applications because carrying these workpieces side-by-side along a track would require a significant increase in the foot print of the processing tool. Another aspect of providing a high throughput is that the single-arm, dual end-effector robot can operate quickly to access all, or at least most, of the processing stations in the tool because (a) it does not need to have complex collision avoidance algorithms that slow down processing time, and (b) it can use high-speed motors for a high operating speed. The combination of maintaining a fast, versatile robot unit and an arrangement that provides an efficient foot print accordingly provides a high throughput (w/hr/ft²) for several embodiments of the processing apparatus 100.

Figure 16:
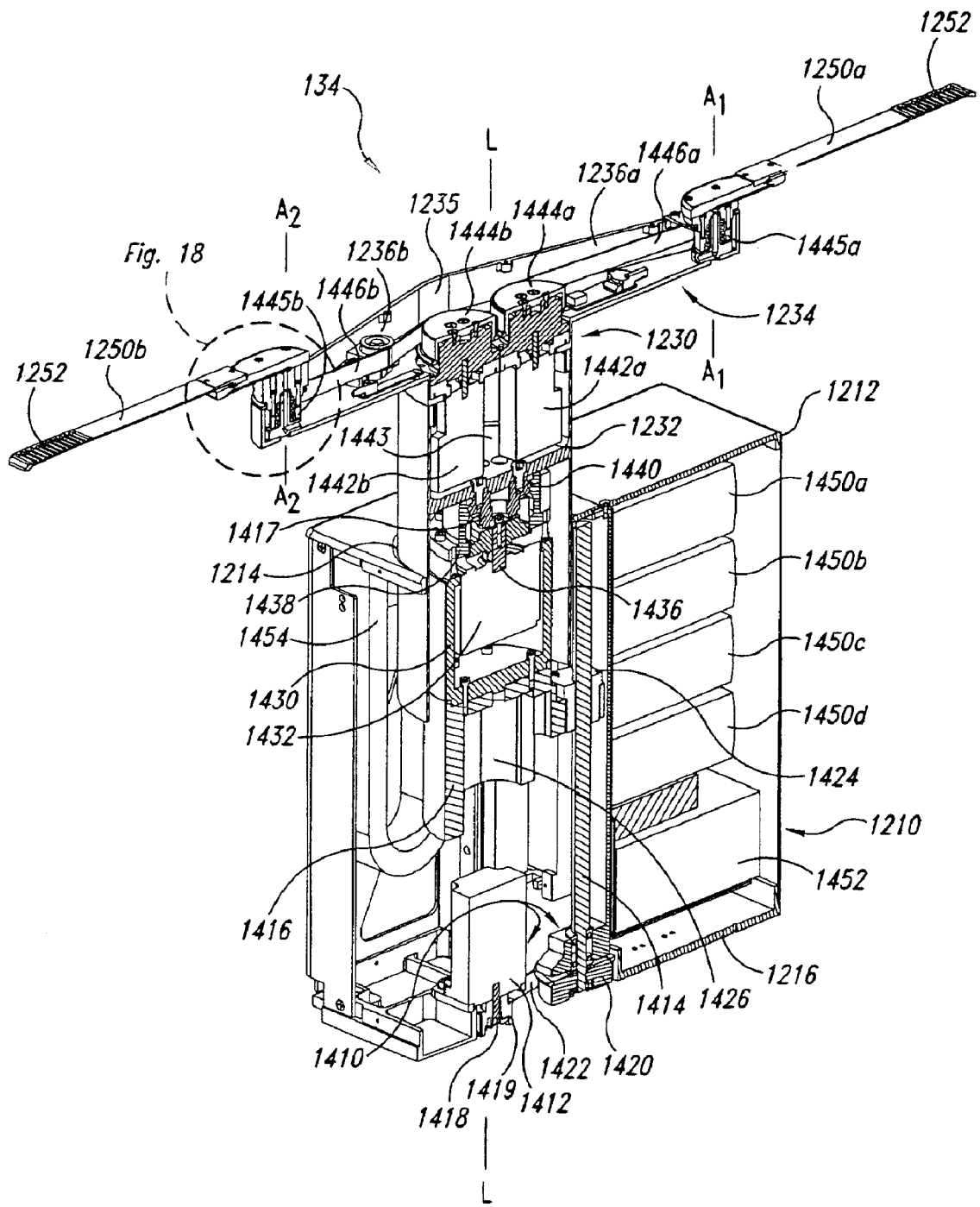
FIG. 16 is an isometric view of a transfer device for handling microelectronic workpieces in accordance with an embodiment of the invention in which selected components are shown in cross section and other components are shown schematically.

FIG. 16 illustrates one embodiment of the robot unit 134 in greater detail. In this particular embodiment, the transport unit 1210 and the arm assembly 1230 can operate in a manner similar to that described above with reference to FIGS. 14A–15C, and thus like reference numbers refer to like components in these figures. The robot unit 134 can include a lift assembly 1410 having a lift actuator 1412, a lift member 1414, and a lift platform 1416 coupled to the lift member 1414. The lift actuator 1412 can be a servomotor, a linear actuator, or another suitable device that can provide precise control of rotational or linear motion. In the embodiment shown in FIG. 16, lift actuator 1412 is a servomotor having a drive shaft 1418 to which a drive pulley 1419 is attached. The lift member 1414 in this embodiment is a ball screw or a lead screw having a lower end securely connected to a passive pulley 1420. The lift assembly 1410 can also include a guide, such as a guide rail 1414a. The output from the lift actuator 1412 is coupled to the passive pulley 1420 by a belt 1422 around the drive pulley 1419 and the passive pulley 1420. The lift assembly 1410 can further include a nut 1424 that is threadedly coupled to the lead-screw lift member 1414 and fixedly coupled to the lift platform 1416.

The lift assembly 1410 operates to raise/lower the lift platform 1416 by energizing the lift actuator 1412 to rotate the drive pulley 1419 and produce a corresponding rotation of the lead-screw lift member 1414. The nut 1424 moves vertically according to the rotation of the lift member 1414 to raise/lower the lift platform 1416 for adjusting the elevation of the first and second end-effectors 1250a and 1250b. It will be appreciated that the stroke length of the nut 1424 defines the extent of the lift motion of the arm assembly 1230. Additionally, when the nut 1424 is positioned at the lower end of the lift member 1414, the lift actuator 1412 is received in a cavity 1426 in the lift platform 1416. The cavity 1426 allows the size of the robot unit 134 to be relatively compact and the length of the lift stroke to be relatively large because the lift actuator 1412 can be positioned directly under the lift platform 1416.

It will be appreciated that other embodiments of lift assemblies can be used to raise and lower the arm assembly 1230. For example, the lift member can be a scissor lift assembly driven by a servomotor, or the drive shaft of the lift actuator 1412 can be the lead-screw lift member 1414 to eliminate the pulleys and belts of the embodiment of FIG. 16.

The arm assembly 1230 is carried by the lift assembly 1410 to move along the lift path L—L. In the embodiment shown in FIG. 16, the arm assembly 1230 includes a base 1430 carried by the lift platform 1416 and a waist motor 1432 carried by the base 1430. The waist member 1232 is coupled to an output shaft 1436 of the waist motor 1432 by a boss 1437. The waist motor 1432 is fixedly attached to the base 1430, and a rim 1438 is fixedly attached to the base 1430 to generally enclose the boss 1437. The waist member 1232 is fixedly attached to the boss 1437 such that rotation of the boss 1437 rotates the waist member 1232. A bearing 1440 between the boss 1437 and the rim 1438 allows the waist motor 1432 to rotate the boss 1437 and the waist member 1232 via the output of the drive shaft 1436.

The arm assembly 1230 can further include a first effector-drive 1442a and a second effector-drive 1442b carried in a cavity 1443 of the waist member 1232. The first effector-drive 1442a has an output shaft coupled to a drive pulley 1444a, which is coupled to a passive pulley 1445a by a belt 1446a. The second effector-drive 1442b can be operatively coupled to the second end-effector 1250b by a similar arrangement. The second effector-drive 1442b, for example, can have an output shaft connected to a drive pulley 1444b, which is coupled to a passive pulley 1445b by a belt 1446b. In the embodiment shown in FIG. 14, the first and second effector-drives 1442a and 1442b are servomotors. Alternate embodiments of the arm assembly 1230, however, can use linear actuators housed in the arm 1234 or other types of actuators to manipulate the end-effectors 1250a and 1250b. For example, the effector-drives 1442 can be servomotors that have output shafts with a worm gear, and the passive pulleys 1445 could be replaced with gears that mesh with the worm gears. The rotation of the worm gears would accordingly rotate the end-effectors about the rotation axes.

The arm assembly 1230 operates by (a) rotating the waist member 1232 and the arm 1234 about the lift path L—L, and (b) independently rotating the first and second end-effectors 1250a and 1250b about the first and second rotation axes $A_1$—$A_1$ and $A_2$—$A_2$, respectively. The waist motor 1432 rotates the waist member 1232 and the arm 1234 about the lift path L—L to position the first and second extensions 1236a and 1236b of the arm 1234 at desired locations relative to the workpiece containers 114 (FIG. 2) and/or the processing stations 120 (FIG. 2). The first effector-drive 1442a rotates the first end-effector 1250a about the first rotation axis $A_1$—$A_1$, and the second effector-drive 1442b rotates the second end-effector 1250b about the second rotation axis $A_2$—$A_2$. The effector-drives 1442a–b operate independently from each other and the waist motor 1432 so that the end-effectors 1250a and 1250b can move in a compound motion with the arm 1234. This motion can thus translate the workpieces 101 along virtually any desired path. Therefore, the waist motor 1432 and the end-drives 1442a–b can operate serially or in parallel to provide the desired motion of the end-effectors 1250.

The robot unit 134 can also include a plurality of amplifiers to operate the motors carried by the robot unit 134. In this embodiment, the amplifiers can include four servoamplifiers 1450 (identified by reference numbers 1450a–d). The amplifiers 1450 operate the lift actuator 1412, the waist motor 1432, and the effector-drives 1442a–b. Additionally, the transport unit 134 can include a servoamplifier 1452 for a rail motor (not shown) that moves the transport unit 1210 along the track 132 (FIG. 2). The amplifiers 1450 and 1452 are controlled by a control circuit board (not shown in FIG. 16) that is carried by the transport unit 1210 such that much of the wiring and the electronics for the robot unit 134 are carried locally with the transport unit 1210. Some of the internal wiring for the waist motor 1432 and the effectordrives 1442a–b is carried in a flexible cable track 1454 that moves vertically with the lift platform 1416. This reduces the number of long wires running through the processing apparatus 100.

Figure 17:
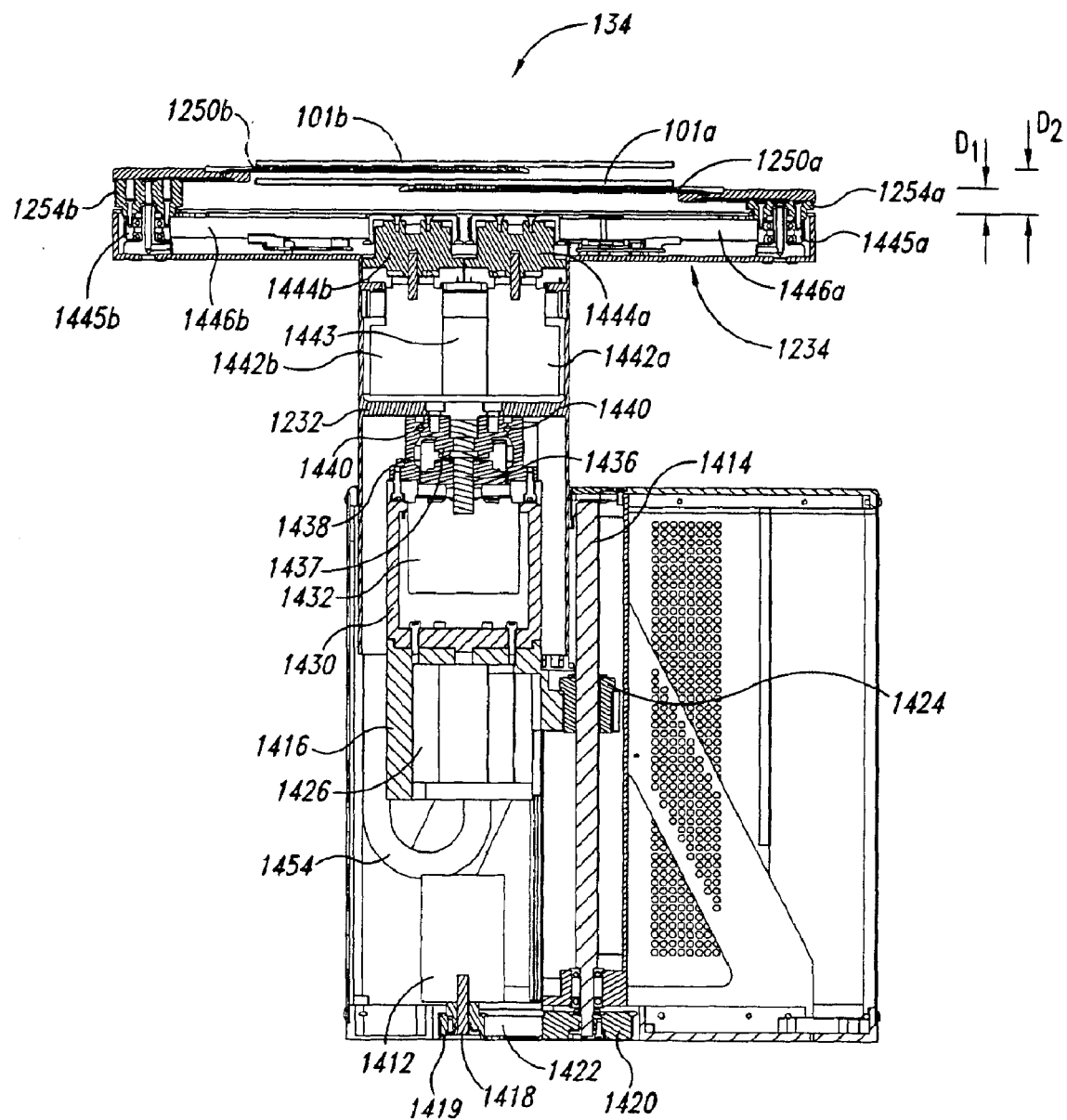
FIG. 17 is a cross-sectional view of the transfer device of FIG. 14A.

FIG. 17 shows the first and second end-effectors 1250a and 1250b in a workpiece transport position. In this configuration, the first spacer 1254a spaces the first end effector effector 1250a apart from the arm 1234 by the first distance $D_1$ and the second spacer 1254b spaces the second end-effector 1250b apart from the arm 1234 by the second distance $D_2$. When the first and second end-effectors 1250a–b are over the arm 1234, the first workpiece 101a can be superimposed under the second workpiece 101b for transportation along the track 132 as explained above with reference to FIG. 15B. It will be appreciated that the first and second end-effectors 1250a and 1250b can be spaced apart from the arm 1234 by different distances and using different techniques. The particular embodiment shown in FIG. 5 uses fixed spacers 1254a and 1254b to provide a fixed differential in the elevation between the first and second end-effectors 1250a and 1250b that mitigates the need for complex collision avoidance algorithms because the first and second workpieces 101a–b are inherently held at elevations in which they cannot collide with one another or other components of the robot unit 34.

Figure 18:
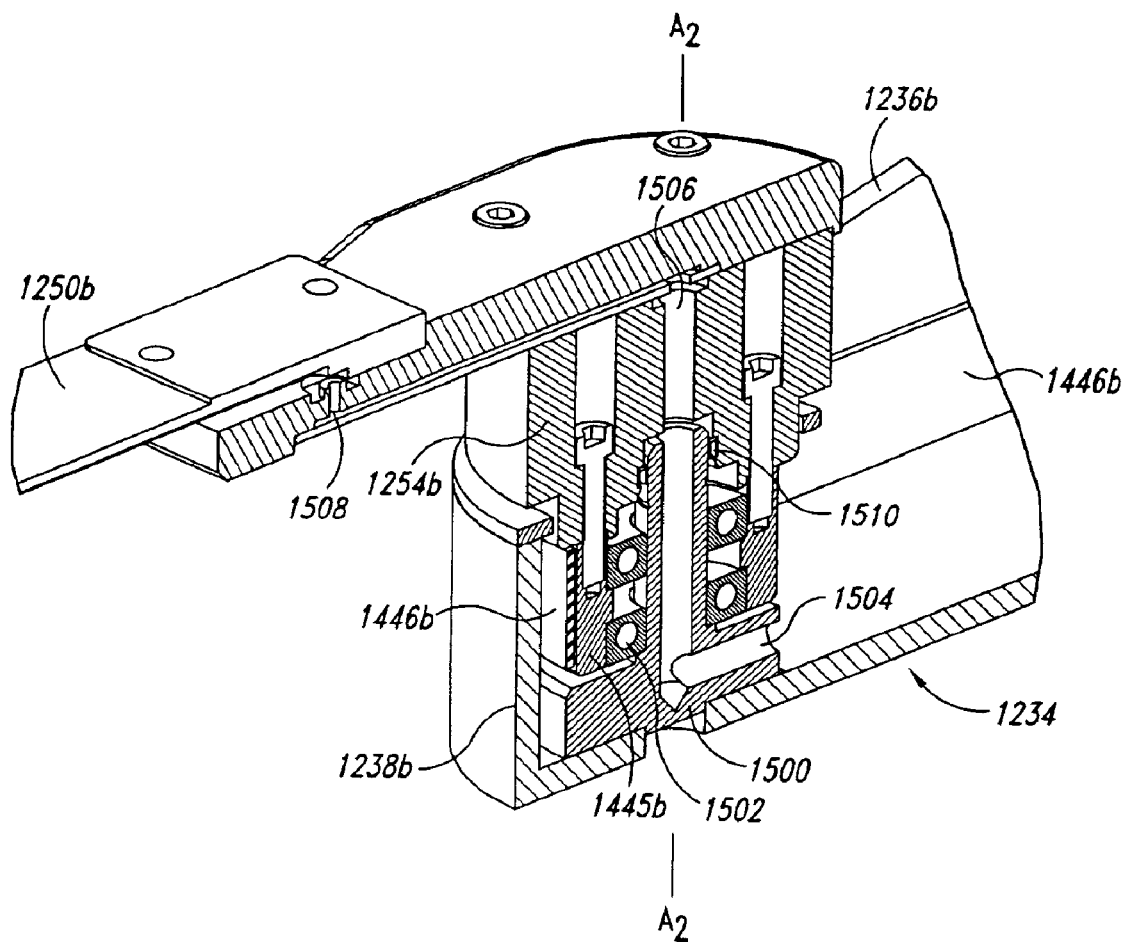
FIG. 18 is a cross-sectional view of an end-effector of the transfer device of FIG. 14A.

FIG. 18 illustrates the connection between the second end-effector 1250b and the second extension 1236b of the arm 1234 in greater detail. In this embodiment, the pulley 1445b is fixedly attached to the spacer 1254b, and a proximal end of the end-effector 1250b is fixedly attached to the spacer 1254b. The belt 1446b accordingly rotates the pulley 1445b about the second rotation axis $A_2$—$A_2$. The pulley 1445b is mounted to a rotary fluid pass through 1500 by a bearing 1502. The fluid pass through 1500 includes a passageway 1504 through which a vacuum can be drawn or a pressurized fluid can be pumped. The passageway 1504 is in fluid communication with a passageway 1506 in the spacer 1254b and a passageway 1508 through the end-effector 1250b such that the fluid can flow through the second end-effector 1250b. In the case of a vacuum end-effector, a vacuum can be drawn through the passageways 1504, 1506 and 1508 to produce a suction at the workpiece holder 1252 (FIG. 14A). A seal 1510 between the fluid pass through 1500 and the spacer 1254b prevents leaks between these two components. It will be appreciated that alternate embodiments of applying a vacuum or driving a pressurized fluid through an end-effector can be accomplished using other structures. Additionally, the end-effectors can be vacuum end-effectors as shown or they can be edge grip end-effectors that use pressurized fluid to drive a linear plunger to hold the edge of the workpiece against protruding tabs (See, e.g., U.S. patent application Ser. Nos. 09/386,566; 09/386,590; and 09/386,568, all of which have been incorporated by reference above).

Several embodiments of the transfer device 130 are also expected to have a high degree of reliability. The transfer device 130 reduces the number of components and the complexity of the operating software compared to transfer devices that have a plurality of independent robot units in a single area. In general, devices that reduce the complexity of a system are more reliable and are easier to maintain because they have fewer components. Therefore, several embodiments of the transfer device 130 are expected to have low maintenance requirements and low down-time caused by component failures.

Figure 19:
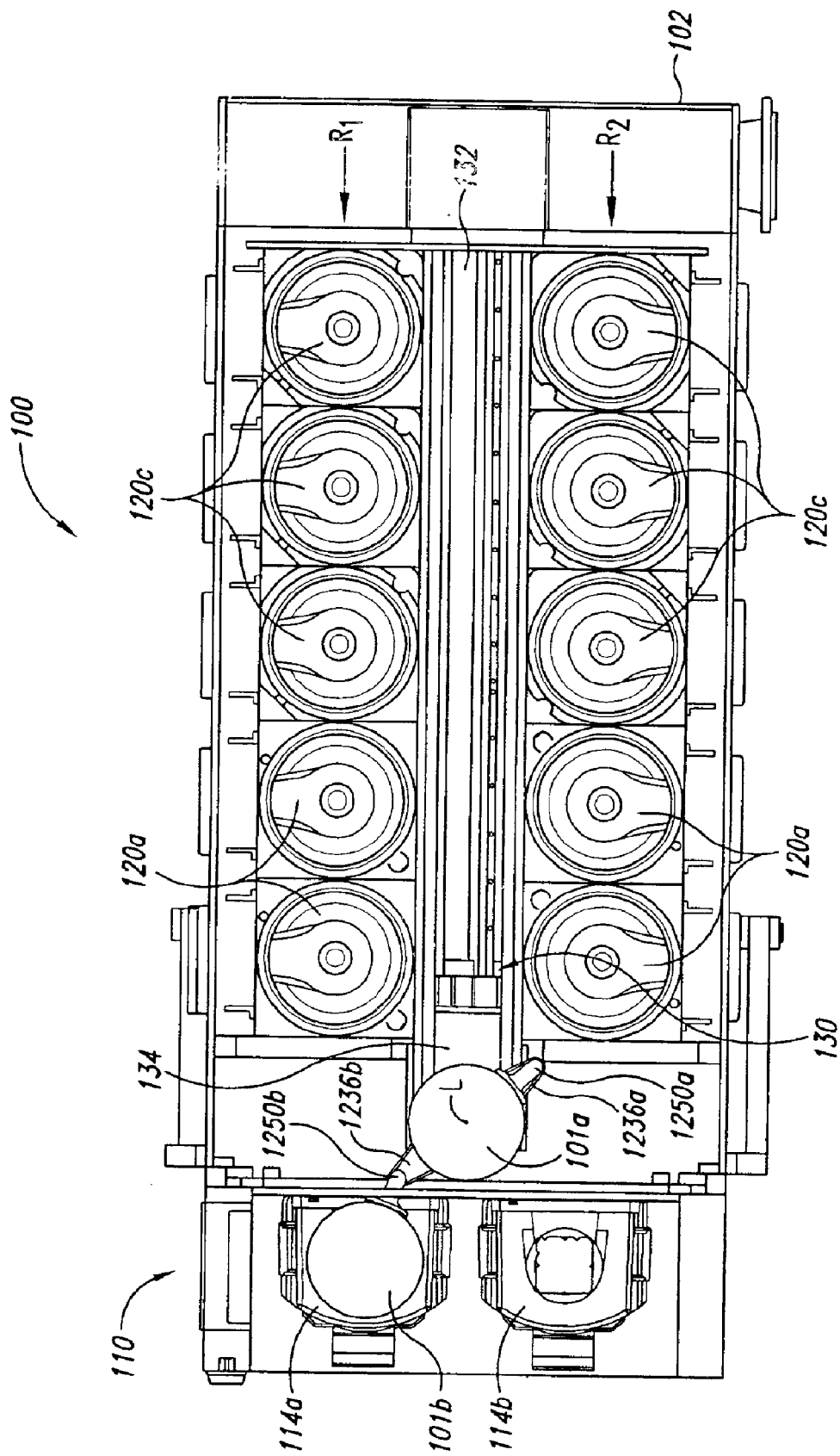
FIG. 19 is a top plan view of a processing apparatus for processing microelectronic workpieces showing another configuration of processing stations and a transfer device in accordance with another embodiment of the invention.
Figure 20:
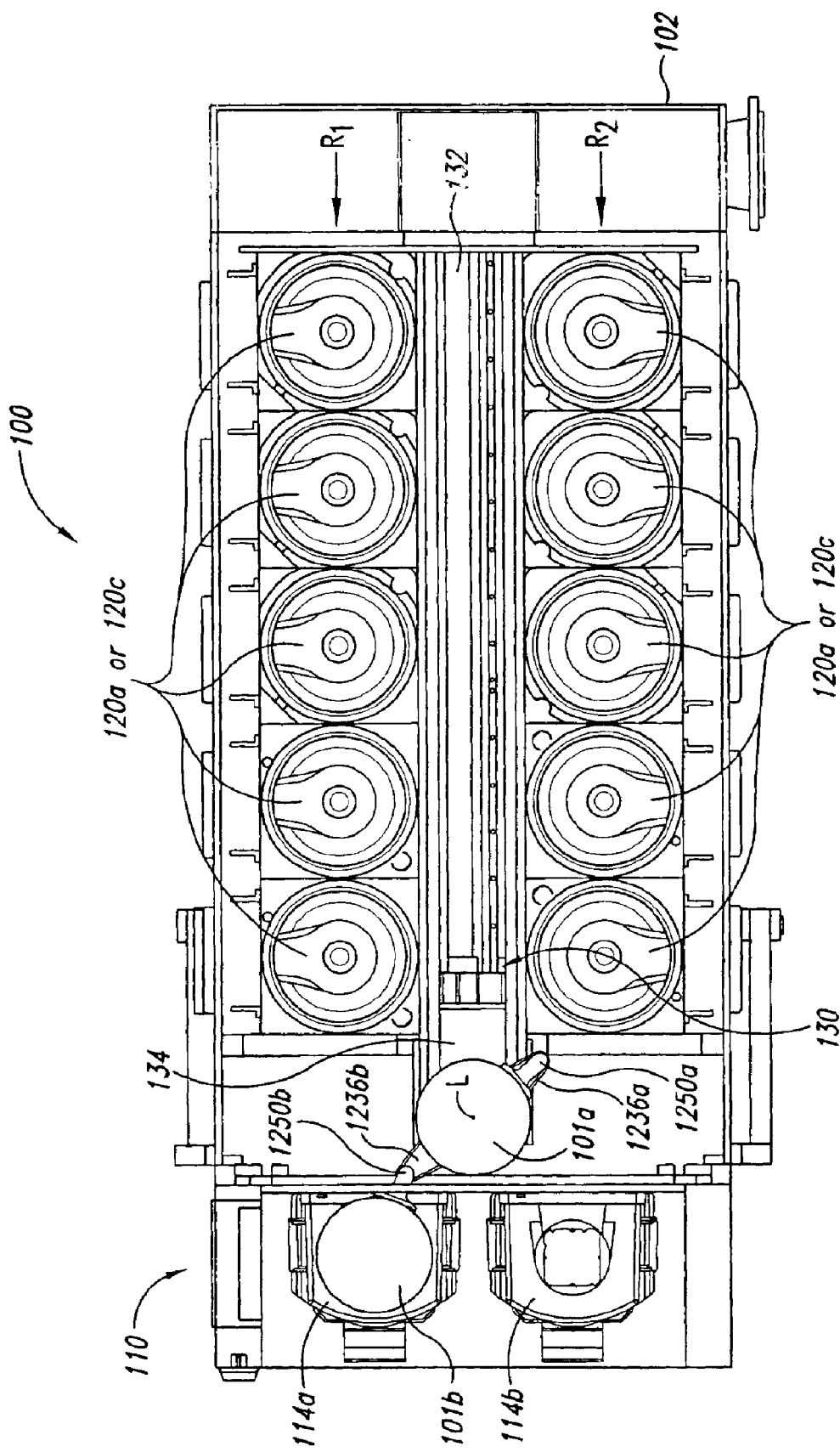
FIG. 20 is a top plan view of a processing apparatus for processing microelectronic workpieces showing still another configuration of processing stations and a transfer device in accordance with another embodiment of the invention.

FIGS. 19 and 20 illustrate alternate embodiments of the integrated processing apparatus 100. FIG. 19 illustrates the integrated processing apparatus 100 having four cleaning chambers 120a proximate to the load/unload station 110 and six electroplating chambers 120c downstream from the cleaning chambers 120a. The process flow for this embodiment of the integrated processing apparatus 100 includes removing workpieces 101 from the in-WIP 114a and placing the workpieces in the electroplating chambers 120c. Each workpiece 101 is individually placed in a single electroplating chamber 120c. After each electroplating procedure has finished, the robot unit 134 removes a plated workpiece 101 from the electroplating chamber 120c and places it in a vacant cleaning chamber 120a. The embodiment of the integrated processing apparatus 100 shown in FIG. 19 has more electroplating chambers 120c than cleaning chambers 120a because the electroplating processes may take longer than the cleaning/etching procedures. Consequently, to equalize the throughput of plated wafers through the electroplating chambers 120c with those through the cleaning chambers 120a, the integrated apparatus 100 can include more electroplating chambers 120c than cleaning chambers 120a. It will be appreciated that alternate embodiments can have a one-to-one correspondence of electroplating chambers and cleaning chambers in applications in which the electroplating cycles takes approximately the same time as the cleaning cycles, or that the integrated apparatus 100 can have more cleaning chambers 120a than electroplating chambers 120c for processes in which the cleaning cycles take longer than the electroplating cycles. FIG. 20 illustrates an alternate embodiment in which all of the processing chambers 120 in the integrated processing apparatus 100 are either cleaning chambers 120a or electroplating chambers 120c. The cleaning chambers 120a, for example, can each be a single wafer wet cleaning CAPSULE™ capable of single or dual side selectable processing of a workpiece with bevel and edge processing capabilities in the Millennium® tool manufactured by Semitool Inc. and described in U.S. patent application Ser. Nos. 09/041,901 filed on Mar. 13, 1998; 09/113,435 filed on Jul. 10, 1998; and 09/437,926 filed on Nov. 11, 1999; all of which are herein incorporated by reference. The CAPSULE™ cleaning chambers are well-suited for removing metal from the backside of the workpiece, performing an etching process for creating a bevel and/or a well-defined edge exclusion area, rinsing the workpiece, and drying the workpiece.

The configuration of the processing stations 120a in the integrated processing tool 100 is designed to enhance the usage of the robot unit 134 so that it handles the workpieces 101 in an efficient manner. For example, the processing stations that perform the initial procedures for processing the workpieces are typically located toward the end of the track 132 away from the load/unload station 110. The processing stations 120 that perform the final procedures for processing the workpiece can be located adjacent, or at least proximate, to the load/unload station 110. The robot unit 134 can accordingly place a finished workpiece 101 in the out-WIP 114b and then pickup a new workpiece 101 from the in-WIP 114a without significantly changing the position of the robot unit 134 along the track 132. This provides for an efficient use of the capacity of the robot unit 134 because it does not need to translate along the track 132 for a great distance without carrying one of the workpieces 101 to one of the processing stations 120.

E. Dedicated Power Supplies

Another aspect of the processing tool 100 is that it can include dedicated power supplies for consistently providing the same power to the electrodes in the reaction vessels. As explained in more detail below, the processing tool 100 can include a plurality of power supplies and conductive links that electrically couple the power supplies to the electrodes in the processing stations. The conductive links are configured relative to the power supplies and the electrodes so that the conductive links have at least substantially the same electrical characteristics for providing consistent power signals to the electrodes.

The present inventors have recognized that there is a need to provide each of the electrochemical processing chambers in a processing tool with at least substantially the same electrochemical processing power to ensure consistent processing performance between the various electrochemical processing chambers. Further, they have recognized that this can be accomplished by placing a number of power supplies at various locations in a processing tool to reduce the impact that the cables in the power distribution network have upon the effective signals received by the electrodes in the electrochemical processing stations. The present inventors accordingly developed various solutions to the foregoing problems that include, for example, locating a plurality of power supplies throughout a processing apparatus so that the electrical links or other types of power distribution lines between the power supplies and the processing chambers have at least substantially the same electrical characteristics and are not subject to extensive electromagnetic interference from other cables. Therefore, several embodiments of microelectronic processing tools in accordance with the invention provide at least substantially the same effective power to electrodes in electrochemical processing stations for enhancing the consistency in the plating performance of similar electrochemical processing stations.

In one aspect of the invention, the apparatus can include a housing at least partially enclosing a process environment. The housing can include a first processing chamber having a first anode and a first cathode, and a second processing chamber having a second anode and a second cathode. A first power supply can be electrically coupled to the first processing chamber to provide electrical power to at least one of the first anode and the first cathode, and a second power supply can be electrically coupled to the second processing chamber to provide electrical power to at least one of the second anode and the second cathode.

In several embodiments, the first power supply can be dedicated to provide power to the first anode and the first cathode separate from the second power supply, and the second power supply can be dedicated to provide power to the second anode and the second cathode separate from the first power supply. Unlike conventional systems that have a single power supply that provides power to the electrodes in all of the processing stations in a tool using cables of different lengths (and thus impedances), a further aspect of several of these embodiments is that the first power supply can be electrically coupled to the first processing chamber with a conductive link having a first impedance, and the second power supply can be electrically coupled to the second processing chamber with a conductive link having a second impedance at least approximately the same as the first impedance. For example, the first and second conductive links can have approximately the same lengths and/or approximately the same resistances because the first and second power supplies can be located approximately the same distances from the first and second processing stations, respectively. This accordingly is expected to reduce the need to compensate for differences in the signals caused by the links. In a further aspect of the invention, the first and second power supplies can each include an input portion configured to receive electrical power and an output portion configured to transmit electrical power. The output portion of each of the first and second power supplies can be electrically decoupled from all other processing chambers of the housing.

In yet a further aspect of an embodiment of the invention, the first and second power supplies are separated from each other so that the first and second conductive links to the power supplies extend through separate raceways. This feature reduces the number of cables in close proximity to each other, which is expected to reduce inductive and capacitive coupling.

The invention is also directed toward a method for assembling a tool for processing a microelectronic workpiece. In one aspect of the invention, the method can include positioning a first processing chamber in a housing, with the first processing chamber having a first anode and a first cathode and being configured to process a microelectronic workpiece. The method can further include positioning a second processing chamber in the housing, with the second processing chamber having a second anode and a second cathode and being configured to process a microelectronic workpiece. The method can still further include coupling a first output portion of a first power supply to at least one of the first anode and the first cathode, with the first output portion electrically decoupled from the second anode and the second cathode. The method can further include coupling a second output portion of a second power supply to at least one of the second anode and the second cathode, with the second output portion electrically decoupled from the first anode and the first cathode.

The invention is also directed toward a method for processing microelectronic workpieces. In one aspect of the invention, the method can include positioning a first microelectronic workpiece in a first processing chamber located within a housing defining a processing environment, and positioning a second microelectronic workpiece in a second processing chamber located within the housing. The method can further include providing power to at least one of a first anode and first cathode of the first processing chamber from a first output portion of a first power supply, and providing power to at least one of a second anode and a second cathode of the second processing chamber from a second output portion of a second power supply different than the first power supply. The power provided by the first power supply and the second power supply can be provided with the second output portion electrically decoupled from the first anode and the first cathode, and the first output portion electrically decoupled from the second anode and the second cathode.

Figure 21:
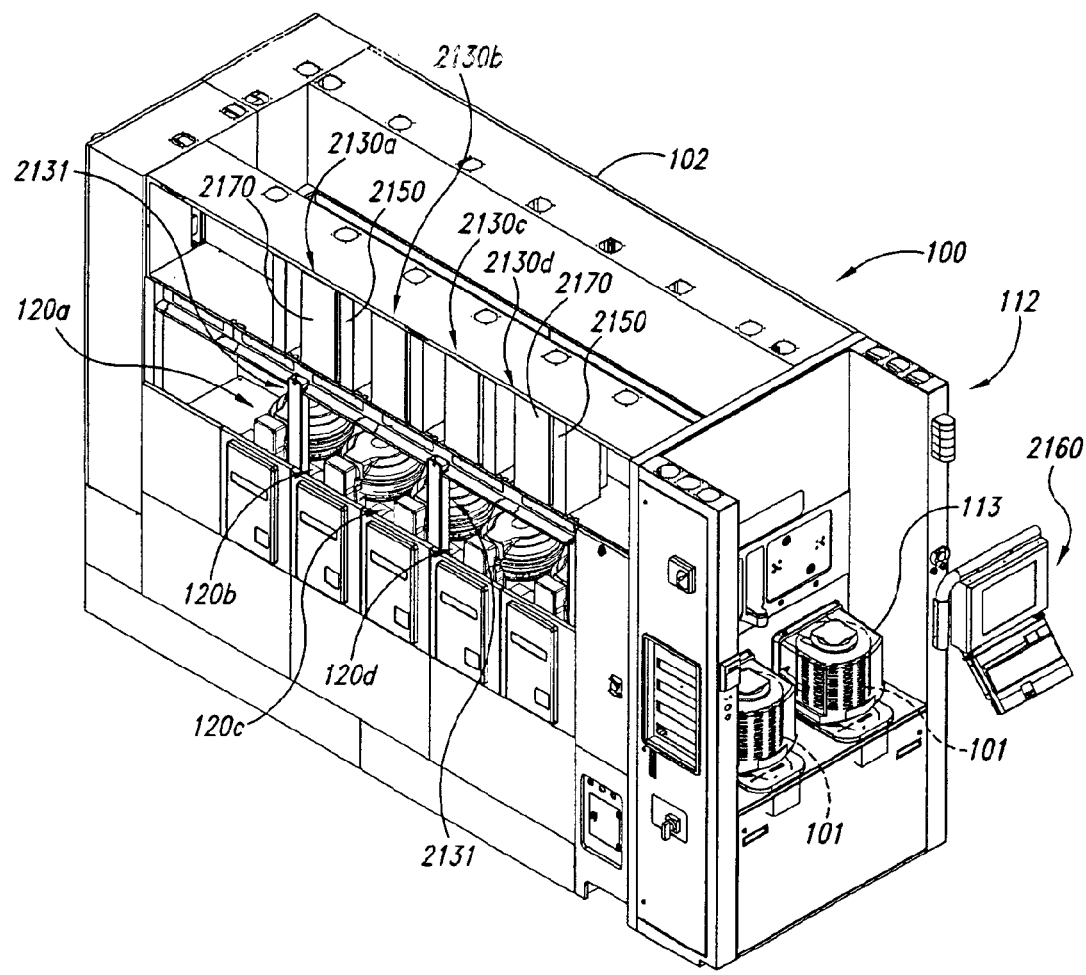
FIG. 21 is an isometric view of an apparatus in accordance with an embodiment of the invention showing selected components schematically.

Referring to FIG. 21, the apparatus 100 can include separate power supplies 2130 (shown in FIG. 21 as power supplies 2130a–d). Each power supply 2130 can be dedicated to provide power to the electrodes of a single processing chamber 120. Accordingly, each power supply 2130 generally has a power conditioning module 2170 (e.g., a rectifier/voltage regulator) at the front end to condition incoming power to a state suitable for use with the electrodes. In an alternate embodiment, each power supply 2130 could be coupled to a valve control module 2150 to provide power to control devices of the processing chambers 120. The apparatus 100 can further include one or more protective conductor enclosures 2131 that carry cables and/or other conductive links between the power supplies 2130 and the processing chambers 120. The operation of the power supplies 2130 can be controlled by a microprocessor such as a system coordination computer 2160 under the direction of a user. Further details of the operation of the power supplies 2130 are described below with reference to the FIGS. 22 and 23.

Figure 22:
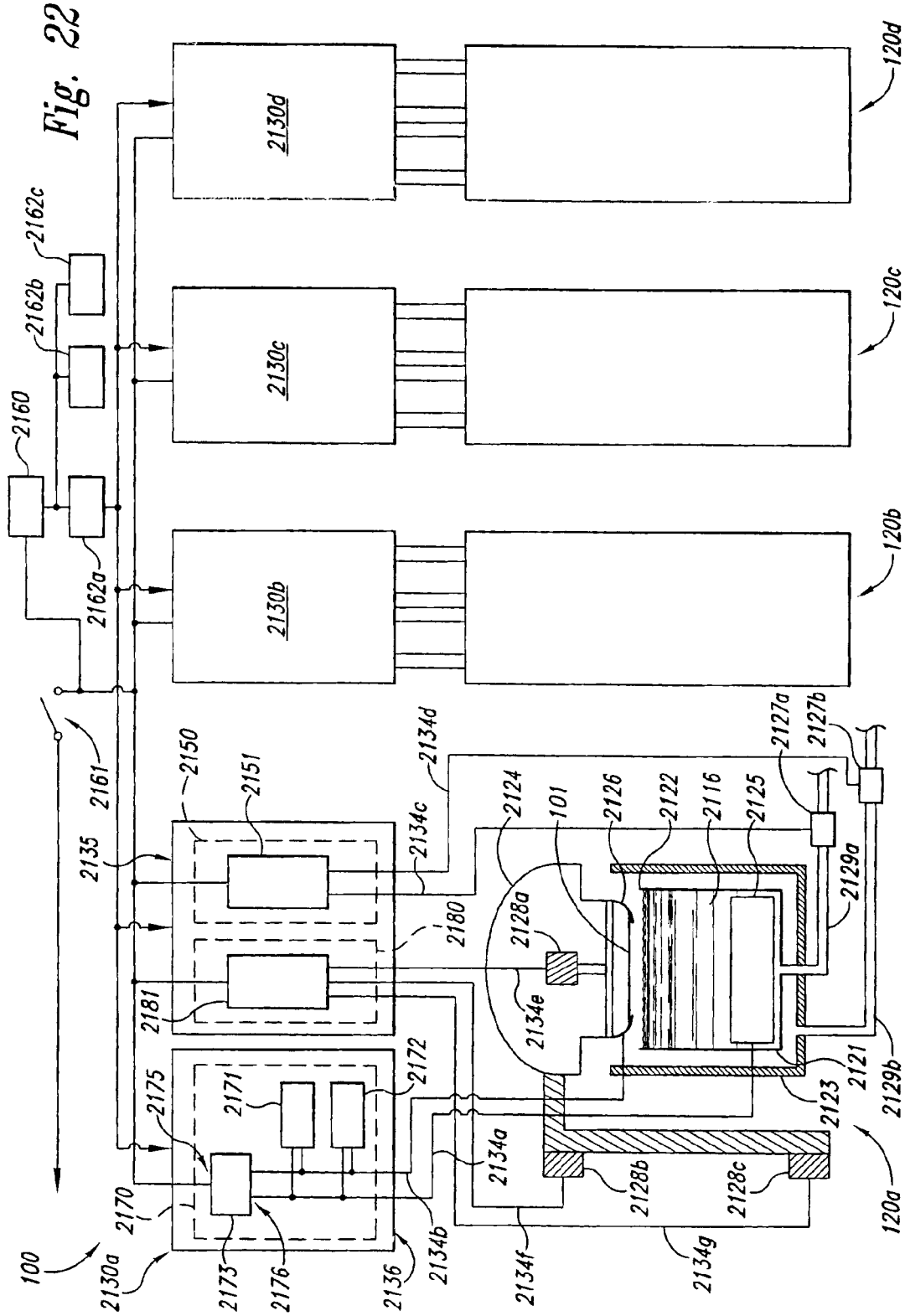
FIG. 22 is a block diagram illustrating components of an apparatus in accordance with an embodiment of the invention showing selected components schematically.

FIG. 22 illustrates a block diagram of many of the components of the apparatus 100 described above with reference to FIG. 21. In one embodiment, the apparatus 100 can include the four processing chambers 120a–d, each coupled to a corresponding dedicated power supply 2130a–d, as described above. For purposes of illustration, power supply 2130a and processing chamber 120a are shown in greater detail than the remaining power supplies 2130b–d and processing chambers 120b–d. In other embodiments, the apparatus 100 can have more or fewer processing chambers 120 coupled to dedicated power supplies 2130. In any of these embodiments, the power provided to one processing chamber 120 can be decoupled from the power provided to some or all of the other processing chambers 120. As a result, communication between the power supplies 2130 and the processing chambers 120 can be more consistent from one processing chamber 120 to the next, as described below.

In one embodiment, the processing chambers 120 can include electroplating chambers configured to plate conductive layers such as metal layers on the microelectronic workpieces 101. For example, the processing chamber 120 can be an electroplating chamber that includes features generally similar to those described above with reference to FIGS. 2–13, or the processing chamber 120 can include features similar to those described in U.S. Pat. No. 6,228,232; U.S. Pat. No. 6,080,291; U.S. application Ser. No. 09/804,696, filed Mar. 12, 2001; and/or U.S. application Ser. No. 09/804,697, filed Mar. 12, 2001, all of which are incorporated herein in their entireties by reference. Accordingly, each processing chamber 120 can include a cup 2121 that supports a first electrode, such as an anode 2125. The cup 2121 receives processing fluid 2116 through a supply line 2129a that is regulated by a supply valve 2127a. The processing fluid 2116 can fill the cup 2121 and spill over a weir 2122 into an overflow vessel 2123. Accordingly, the weir 2122 can define the level of the processing fluid 2116 in the cup 2121. The processing fluid 2116 can exit the processing chamber 120 through an exit line 2129b that is regulated by an exit valve 2127b.

The processing chamber 120 can further include a head 2124 or other support member that supports a microelectronic workpiece 101 in contact with the processing fluid 2116. A second electrode, such as a cathode 2126, is positioned in the head 2124 to apply an electrical potential to the microelectronic workpiece 101. The head 2124 can include a spin motor 2128a that spins the microelectronic workpiece 101 and the cathode 2126 as the microelectronic workpiece 101 contacts the processing fluid. By applying a different potential to the anode than the cathode, the user can controllably apply conductive ions in the processing fluid 2116 to the surface of the workpiece 2114 (or, alternatively, remove conductive material from the workpiece 2114). It will be appreciated that the first and second electrodes can carry either a cathodic or an anodic charge for either depositing or removing material from the workpiece according to the particular materials that are used in the processing chamber.

The head 2124 can be coupled to a lift motor 2128c that lowers the head 2124 and the microelectronic workpiece 101 into contact with the processing fluid 2116 in the cup 2121. The head 2124 can also include a rotate motor 2128b that rotates the head 2124 to an inverted position for placing the microelectronic workpiece 101 in contact with the cathode 2126 prior to processing, and removing the microelectronic workpiece 101 from the cathode 2126 after processing.

The components of the processing chambers 120a–d other than the electrodes and the system coordination computer 2160 are generally powered by other power supplies separate from the power supply 2130. Accordingly, the apparatus 100 can include a power switch 2161 coupleable to a source of power, such as a standard 110-220 volt AC power source. The incoming power can be provided directly to the system coordination computer 2160 and the power supplies 2130a–d. Alternatively, the system coordination computer 2160 can receive power from one of the power supplies 2130, but this is not customary. In either embodiment, the system coordination computer 2160 can be operatively coupled to each of the power supplies 2130a–d to control some or all aspects of the operation of each power supply 2130. For example, the system coordination computer 2160 can send control signals to a module computer 2162a that in turn sends control signals to the power supplies 2130. The system control computer 2160 can also be coupled to other module computers (such as module computers 2160b and 2160c) to control other aspects of the operation of the apparatus 100.

Each power supply 2130 can be configured to step down, rectify, and control the power received from the high-voltage power source. In one embodiment, the power supply 2130 can correspond generally to a device available from Dynatronix, Inc. of Amery, Wis. In other embodiments, the power supply 2130 can include other devices. In any of the foregoing embodiments, the power supply 2130 can include an input portion 2135 that receives the high-voltage power from the AC power source, and an output portion 2136 that delivers controlled low-voltage current to the processing chambers 120. The input portion 2135 and the output portion 2136 can include terminals or other conventional electrical couplings. The input portion 2135 can be coupled to a transformer 2173 having an input side 2175 for receiving high-voltage AC current, and an output side 2176 for providing rectified low-voltage DC current. For example, the transformer 2173 can provide DC current at 48 volts in one embodiment or other voltages in alternate embodiments. In any of the foregoing embodiments, the output side 2176 of the transformer 2173 can be coupled to a storage device 2172, for example a capacitor bank, to store up charge for delivering electrical pulses to the anode 2125 and/or the cathode 2126. The transformer 2173 can also be coupled to a signal conditioner 2171 that can control aspects of the signals delivered to the anode 2125 and/or the cathode 2126. For example, the signal conditioner 2171 can control characteristics such as duration, spacing, and amplitude of the electrical pulses delivered to the anode 2125 and/or the cathode 2126.

Another power source separate from the power supply 2130 is generally coupled to a valve controller 2151 to control the operation of the valves 2127 of the processing chamber 120. The valve controller 2151 can be positioned in the valve control module 2150. In one aspect of this embodiment, the valve control module 2150 can have a standalone housing. Alternatively, the valve control module 2150 and/or the valve controller 2151 can be located in the same housing as the transformer 2173, the storage device 2171 and the signal conditioner 2172. In either embodiment, the valve controller 2151 can control the operation of electrically powered valves, such as the supply valve 2127a, the exit valve 2127b or other valves of the apparatus 100.

A power source separate from the power supply 2130 is also generally coupled to a motor controller 2181 to control the motors 2128a, 2128b and 2128c of the processing chambers 120. In one aspect of this embodiment, the motor controller 2181 can be housed in the power conditioning module 2170 or the valve control module 2150. Alternatively, the motor controller 2181 can be housed in a separate motor control module 2180.

In the particular embodiment shown in FIG. 22, the output portions 2136 of the power supplies 2130 are generally coupled only to the electrodes in corresponding processing chambers 120 with conductive links 2134 (shown individually in FIG. 22 as conductive links 2134a–b), such as electrical cables. Conductive links 2134a and 2134b can be coupled to the anode 2125 and the cathode 2126, respectively. Accordingly, the electrodes in each of the processing chambers 120 can receive power from a single one of the power supplies 2130. An advantage of this arrangement is that the apparatus 100 can be manufactured in a modular fashion, with processing chambers 120 added to or removed from the apparatus 120 during manufacture without having to alter or re-select a central power supply. A further advantage is that if a processing chamber 120 must be removed and replaced in the field, this operation can be completed without having to alter or replace a central power supply.

The other electrical components of the processing chambers 120 can be coupled to power sources other than the power supplies 2130 by links 2134c–2134g. As shown in FIG. 22, the valve control module 2150 and the motor control module 180 are powered by line power. As such, the conditioned power provided by the power supplies 2130a–d is typically used only for the electrodes in the processing chambers 120 in many embodiments of the invention.

In one aspect of this embodiment, the conductive links 2134 can be selected to improve the uniformity of the signals provided to each of the chambers 120a–d independently of whether or not each processing chamber 120 is coupled to a dedicated power supply 2130. For example, when the conductive links are coupled to identical or generally similar components of different processing chambers 120, then the electrical properties of these links can be at least approximately identical. Accordingly, each of the conductive links 2134a provided to the anodes 2125 of each chamber can have at least approximately the same length, and each of the conductive links 2134b provided to the cathodes 2126 can also have approximately the same length.

In a further aspect of this embodiment, each of the conductive links 2134a and 2134b can have the same impedance and/or the same resistance for each of the chambers 120a–d. An advantage of this feature is that the signals provided to the anodes 2125 and cathodes 2126 in each of the chambers 120a–d can be more uniform. For example, by providing cables 2134a–b having at least approximately identical lengths for the processing chambers 120a–d, the impedances and/or resistances for the cable are at least substantially the same for each chamber 120 such that the signals applied to the anodes 2125 and the cathodes 2126 can be more consistent from chamber to chamber, resulting in more uniformly processed microelectronic workpieces 101.

In other embodiments, the conductive links 2134 can have other arrangements for at least approximately matching the impedances of conductive paths to similar components of different chambers 120. For example, the conductive links 2134 can have different lengths, but can include a resistor or a resistor in parallel with a capacitor to match the resistance or impedance of other conductive links 2134 connected to similar components.

Another feature of an embodiment of the arrangement described above with reference to FIGS. 21 and 22 is that each power supply 2130 can be positioned close to its corresponding processing chamber 120. Accordingly, the length of the conductive links 2134 between the power supply 2130 and the processing chamber 120 can be less than for some conventional arrangements. An advantage of this feature is that the resistance of the conductive links will be less likely to affect the strength of the signals carried over the conductive links 2134. A further advantage is that the shorter conductive links 2134 will be less likely to be affected by signals from other conductors within the apparatus 100 to inhibit inductive or capacitive coupling.

In other embodiments, other conductive links 2134 can also be selected to have similar or identical properties. For example, when other electrically operated devices of the processing chambers 120a require or benefit from more consistent signals, these devices can be coupled to conductive links having uniform conductive properties. These conductive links can be applied to the processing chambers 120 when the processing chambers include electroplating vessels (as shown in FIG. 22) or, alternatively, when the processing chambers include other devices, such as annealing chambers, cleaning chambers, metrology chambers, or chambers configured to carry out other processes on the microelectronic workpieces 101.

Figure 23:
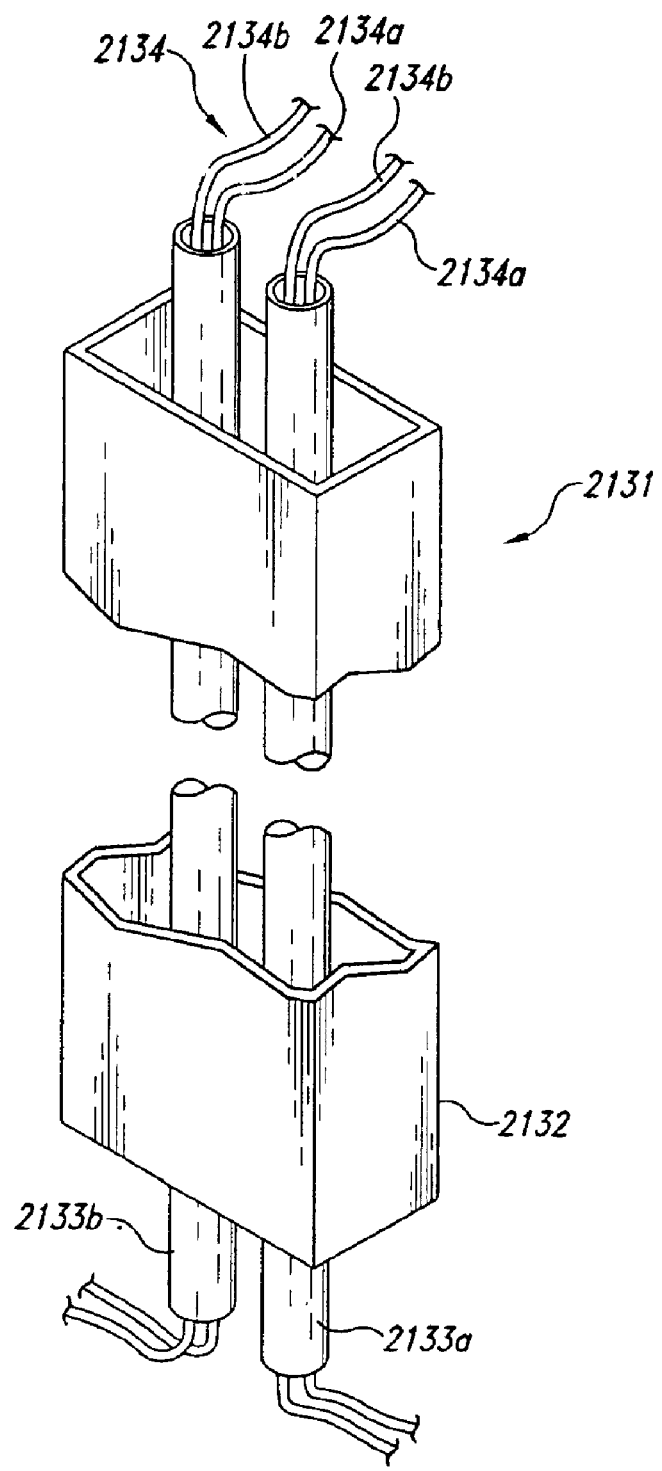
FIG. 23 is an isometric view of a conductor enclosure in accordance with an embodiment of the invention.

FIG. 23 illustrates a protective conductor enclosure 2131 configured to route conductive links 2134 in accordance with an embodiment of the invention. In one aspect of this embodiment, the conductor enclosure 2131 can include a raceway 2132 configured to carry conductive links 2134 from two power supplies 2130 (FIG. 21) to two corresponding processing chambers 120 (FIG. 21). In a further aspect of this embodiment, the raceway 2132 can include two conduits 2133a and 2133b, each of which carries two conductive links 2134a and 2134b for coupling to the anode 2125 (FIG. 22) and the cathode 2126 (FIG. 22) of the processing chamber 120 (FIG. 22). Each conductive link 2134a and 2134b can include a shielded cable. Accordingly, the conductor enclosure 2131 can protect and route the conductive links 2134, and the conduits 2133a and 2133b can shield the conductive links coupled to one processing chamber 2120 from signals transmitted along the conductive links coupled to a neighboring processing chamber 120. An advantage of this arrangement is that signals communicated along one set of conductive links 2134a and 2134b can be less likely to influence or interfere with signals conducted along the conductive links 2134a and 2134b of a neighboring processing chamber 120.

F. Modular and Accessible Lift/Rotate Mechanism

Still a further aspect of the present invention is directed toward a lift and rotate assembly for use in a workpiece processing tool. Several embodiments of the lift and rotate assembly are mounted to the tool so that they enhance the use of space inside a cabinet of a tool. This provides more room for larger processing stations and/or reduces the "foot print" of the tool (i.e., the floor space occupied by the tool). For example, larger processing stations for larger wafers (e.g., 300 mm) can be used in at least approximately the same space as was previously possible for smaller wafers (e.g., 200 mm). Several embodiments of the lift and rotate assembly also provide easy access to the mechanical and electrical components of the lift/rotate assemblies without having to remove the lift and rotate assembly from the tool. This feature reduces the time for servicing and repairing of the lift/rotate assemblies. Additionally, the mechanical and electrical components of the lift/rotate assemblies can be accessed without having to open a lower compartment of the cabinet where the chemical storage tanks and fluid lines are housed. This is beneficial because operators and other personnel are not exposed to chemical vapors when the lift/rotate assemblies are serviced. Several embodiments of lift/rotate assemblies also provide easy access to reaction chambers and other components in the cabinet because they can tilt outward without having to be removed from the cabinet to reduce the time and effort required to service components of the tools inside of the cabinet.

In one embodiment, the lift and rotate assembly comprises a body and a process head for receiving a workpiece. The body contains a lift mechanism for lifting a portion of the body and the process head as a unit with respect to another portion of the body that mounts to the processing tool. The process head is rotatably coupled to the body to enable the process head to rotate with respect to the body and the processing tool. Under one aspect of the invention, the lift and rotate assembly is a modular unit removably attached to an exterior portion of the workpiece processing tool in a position that can be easily accessed and serviced from outside of the workpiece processing tool. The modular unit provides an increased flexibility for changing the configuration of the workpiece processing tool and for the interchangeability of the processing components of the tool while minimizing the down time of the processing tool. The modular unit also allows, as one example, the workpiece processing tool to have a smaller footprint in a clean room. Alternatively, the workpiece processing tool can be configured to handle larger workpieces without having to increase the tool's footprint within the clean room.

In one embodiment of the invention, the body of the lift and rotate assembly has first and second portions, the first portion being releasably connected to an exposed surface of the frame of the workpiece processing tool. The body's second portion is connected to the first portion and the process head. The body's second portion and process head are movable relative to the first portion between raised and lowered positions. Control components are connected to the body and configured to move the body's second portion between the raised and lowered positions. The body, the control components, and the process head from a modular unit are removable as a unit from the exposed surface of the frame. This modular unit can be easily removed from the frame and replaced with another unit to minimize downtime of the workpiece processing tool.

In one embodiment, the lift and rotate assembly is easily accessible from outside of the processing tool while mounted on the tool's frame. Accordingly, the lift and rotate assembly can undergo service, repair, or maintenance from outside of the processing tool without having to access the interior compartment of the workpiece processing tool.

Under one aspect of the invention, the lift and rotate assembly is pivotable relative to the frame between a forward, operating position and a tilted, service position. In the forward, operating position, the body's first portion is adjacent to the frame, and in the tilted, service position, the body's first portion is tilted away from the frame. When the lift and rotate assembly is in the tilted, service position in one embodiment, the lift and rotate assembly is positioned to allow easy access into the interior area of the workpiece processing tool for service, repair, or maintenance, of other components of the processing tool.

Under another aspect of the invention, the body's first portion includes a housing that contains the control components. An access panel is connected to the housing and is movable relative to the housing between open and closed positions when the body is connected to the frame. A plurality of the control components are mounted on the access panel and are accessible from the exterior of the workpiece processing tool while the lift and rotate assembly is connected to the frame. Accordingly, the control components can be easily and quickly accessed for repair, replacement, or maintenance.

Under another aspect of the invention, a processing tool is provided for processing selected workpieces. The processing tool provides a frame, a deck attached to the frame and a processing chamber coupled to the deck inboard of the frame. A lift and rotate assembly is removably mounted to an exposed surface of the frame and spaced outboard of the deck. The lift and rotate assembly has a body, control components, and a process head. The body is releasably connected to the exposed surface of the frame. The control components are connected to the body and positioned to cause a portion of the body and the process head to move relative to the deck between the raised and lowered positions. The body, the control components, and the processing head are removable from the frame as a unit.

In yet another aspect of the invention, a method is provided for servicing a lift and rotate assembly of a workpiece processing tool. The lift and rotate assembly has a body and a process head connected to the body. The method includes accessing the body from the exterior of the frame when the lift and rotate assembly is mounted on the frame. The body includes a housing that contains control components, and an access panel is mounted on the housing. The method further includes moving the access panel to an open position to expose the control components while the lift and rotate assembly is mounted on the frame, and servicing the control components in the housing from exterior of the workpiece processing tool while the lift and rotate assembly is connected to the frame.

Another method includes moving a second portion and the process head relative to a first portion of the body to the raised position, engaging the body from a position exterior of the frame, and tilting the body and the process head as a unit relative to the frame to a tilted, service position. The method of one embodiment also includes servicing the lift and rotate assembly while connected to the frame and in the tilted, service position.

Figure 24:
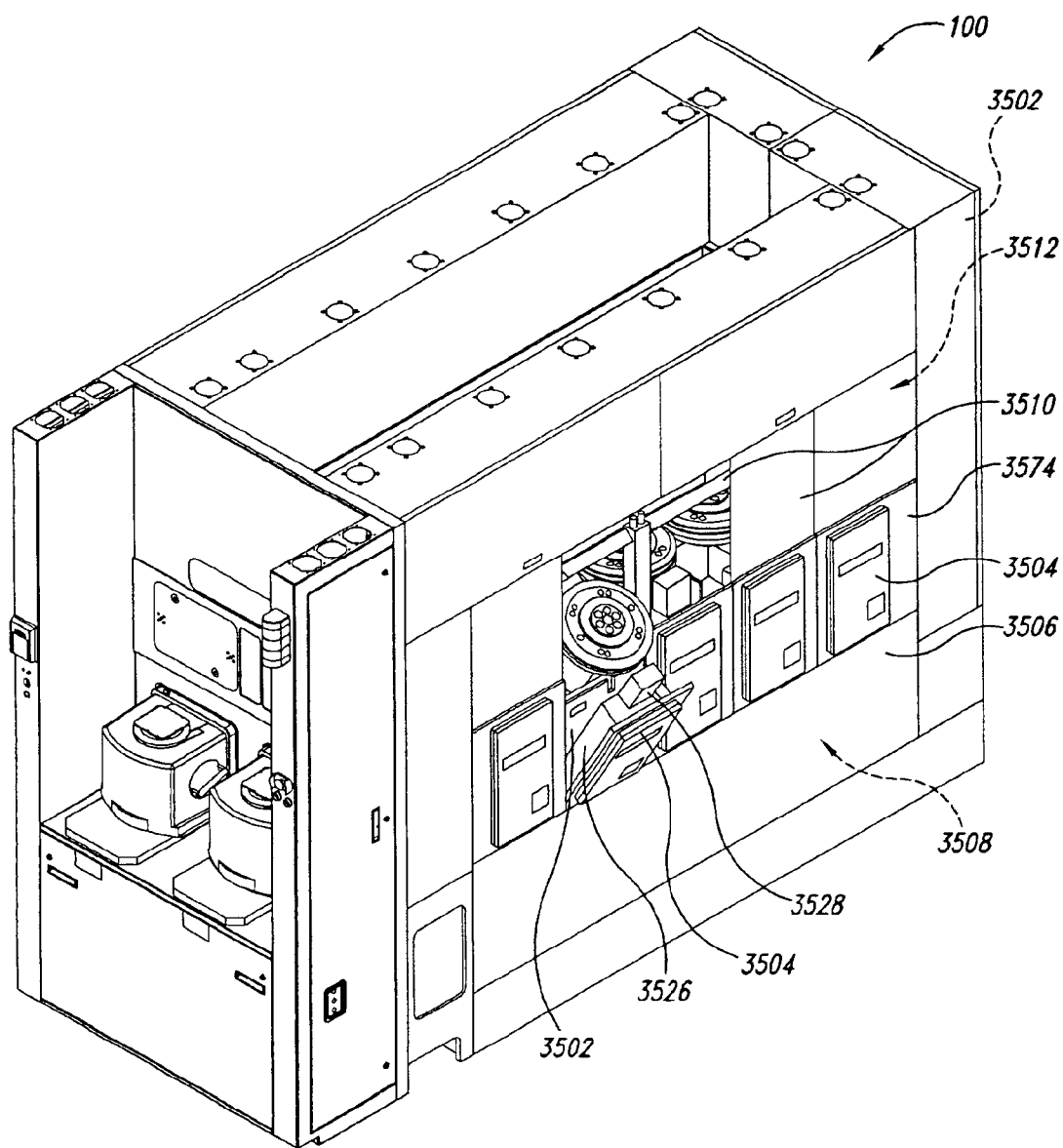
FIG. 24 illustrates an isometric view of the workpiece processing tool illustrating another embodiment of the processing tool and an embodiment of a lift/rotate/tilt assembly in accordance with the invention.

FIG. 24 is an isometric view of another embodiment of the workpiece processing tool 100. In this embodiment, the tool 100 includes an internal frame 3502 and a plurality of lift and rotate assemblies 3504 mounted to an exterior surface or external portion of the frame 3502. The lift/rotate assemblies 3504 are configured to be easily accessible from the outside of the processing tool 100 and to provide easy access to processing chambers inside the tool. The processing tool 100 of the illustrated embodiment has ten lift and rotate assemblies 3504 (five on each side). Greater or fewer lift and rotate assemblies can be installed on processing tools of other embodiments. A lower close-out panel 3506 is removably attached to a lower portion of the frame 3502 below the lift/rotate assemblies 3504 to close out the a lower compartment area 3508. A plurality of upper side panels 3510 are removably attached to the frame 3502 above each of the lift/rotate assemblies 3504. The upper side panels 3510 and the lift/rotate assemblies 3504 close out the upper compartment area 3512 of the workpiece processing tool 3500.

As shown in FIG. 24, the upper side panels 3510 can be opened so that the lift/rotate assemblies 3504 can be tilted outward from the frame 3502 to a service position. In one embodiment, the upper side panel 3510 above a selected lift and rotate assembly 3504 can be opened or removed, and the lift and rotate assembly 3504 can then moved to the tilted position to work on a head assembly or another component without having to physically enter the upper compartment area 3512 of the processing tool 100. This allows easy access to the lift/rotate assemblies 3504 that reduces downtime for service, repairs, or maintenance. The upper side panels 3510 can also be opened to provide access into the upper compartment area 3512 of the processing tool 100 for maintenance, repair, or service of internal components in the processing tool.

Figure 25:
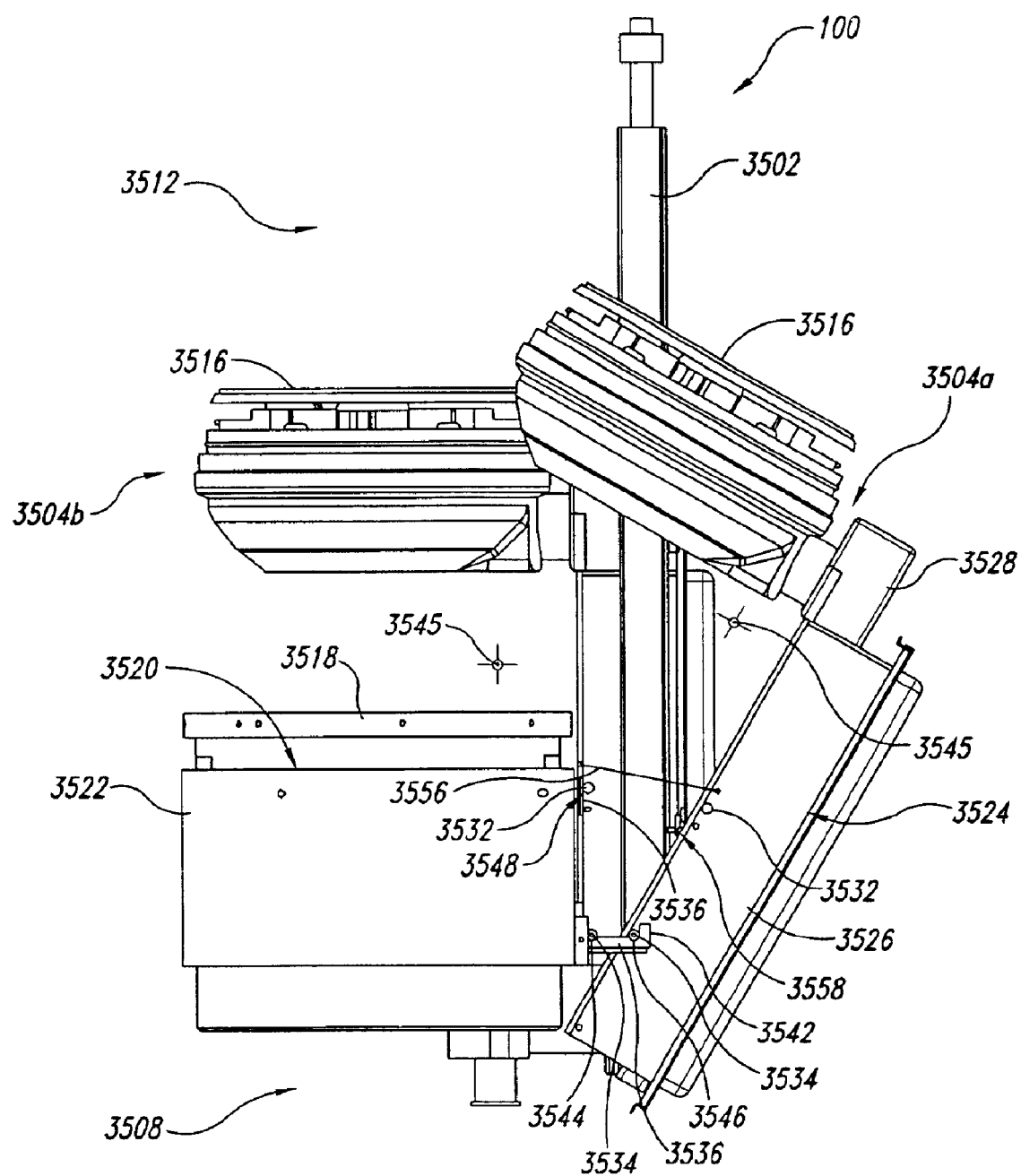
FIG. 25 illustrates an enlarged side elevation view of one lift and rotate assembly of FIG. 24 in the tilted, service position, and another lift and rotate assembly illustrated in the forward, operating position.

FIG. 25 illustrates two lift/rotate assemblies 3504 in greater detail. More specifically, the forward lift/rotate assembly 3504a is shown in the tilted, service position, and the rearward lift/rotate assembly 3504b is shown in the forward, operating position. Both of the lift and rotate assemblies 3504a–b are illustrated having process heads 3516 in the raised position. The process head 3516 of the rearward lift/rotate assembly 3504 is positioned above a processing chamber or bowl 3518 that extends through an opening 3520 in a deck 3522. On the other hand, the process head 3516 of the forward lift/rotate assembly 3504a is positioned partially outside of the tool 100 for easy access.

The lift and rotate assembly 3504 illustrated in FIG. 25 includes a main body 3524 having a first portion 3526 pivotally mounted to the frame 3502 and a second portion 3528 moveably coupled to the first portion 3526. The second portion 3528 is movable relative to the first portion 3526 between raised and lowered positions relative to the deck 3522 and the bowls 3518. The process head 3516 is rotatably attached to the second portion 3528 of the body 3524 and moves with the second portion 3528 as a unit between the raised and lowered positions. Accordingly, the axial and rotational position of the process head 3516 relative to the deck 3522 and bowls 3518 is controlled by the first and second portions 3526 and 3528 of the body 352d.

Figure 26:
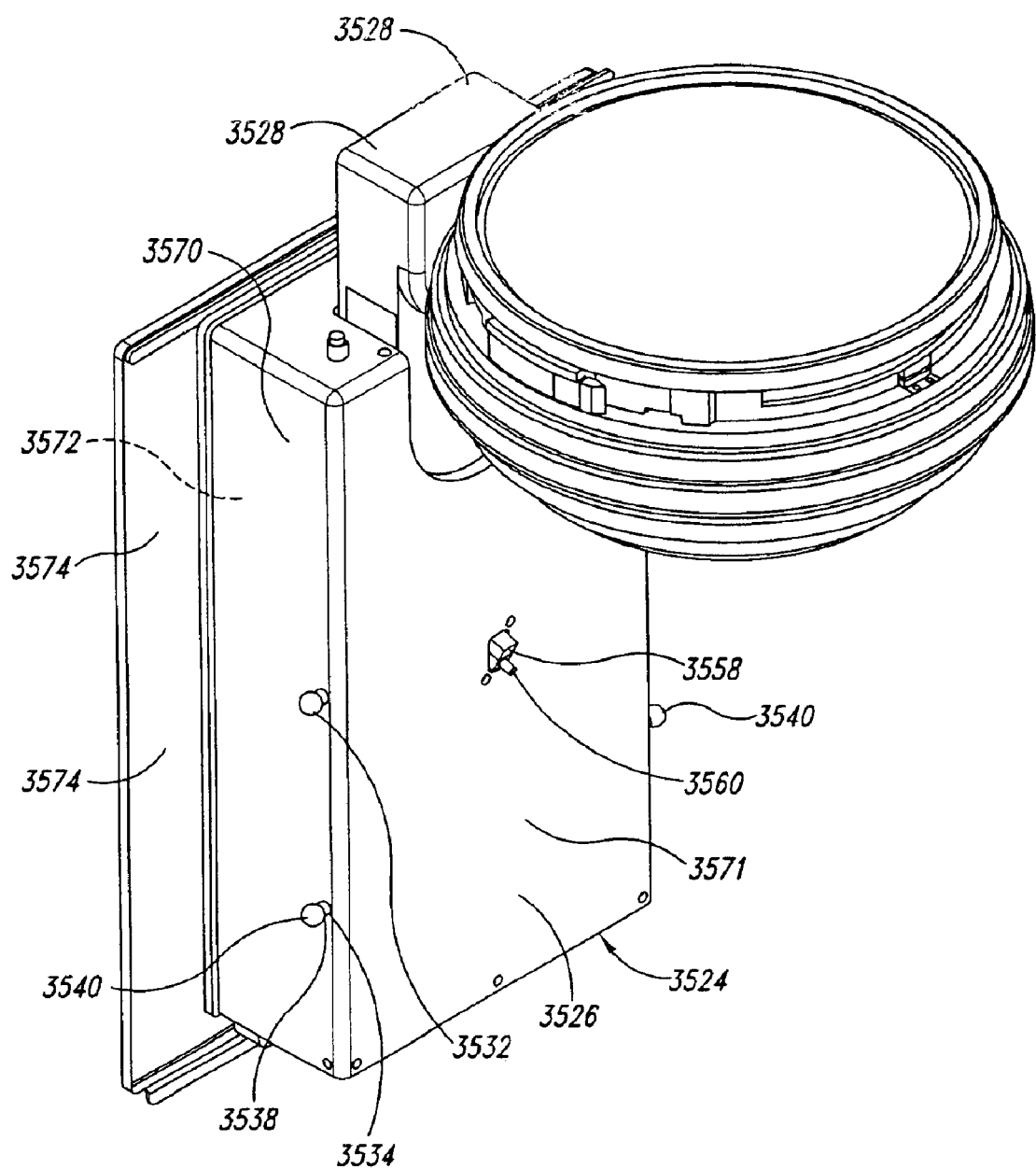
FIG. 26 illustrates an isometric back view of a lift and rotate assembly of FIG. 24 shown removed from the processing tool, and with a process head illustrated in a raised position and rotated into the load position.
Figure 27:
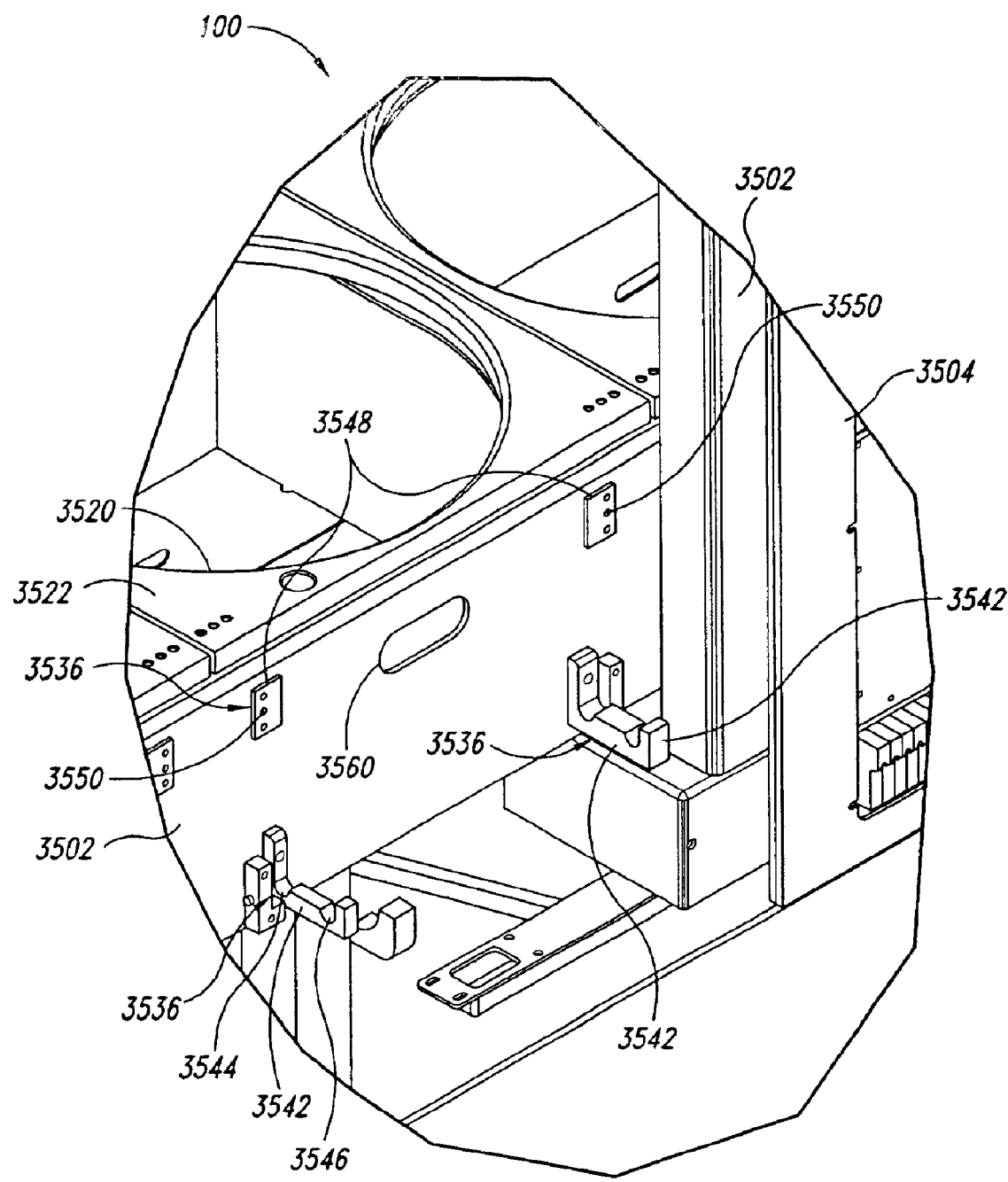
FIG. 27 illustrates an enlarged partial isometric view of the leveling and retaining components on the frame of the processing tool of FIG. 24, with a lift and rotate assembly removed for purposes of clarity.

FIG. 26 illustrates an isometric rear view of the lift and rotate assembly 3504 shown removed from the frame 3502 of the processing tool 100, and FIG. 27 is an enlarged partial isometric view illustrating a portion of the frame 3502 with a lift/rotate assembly 3504 removed that shows leveling and retaining bracketry 3536 which removably retains the lift/rotate assembly 3504 on the frame 3502. As shown in FIG. 26, the lift/rotate assembly 3504 has a pair of upper mounting pins 3532 and a pair of lower mounting pins 3534 projecting from the sides of the first portion 3526. These upper and lower mounting pins 3532 and 3534 are positioned and adapted to connect to the leveling and retaining bracketry 3536 on the frame 3502 (FIG. 27) to removably retain the lift and rotate assembly 3504 on the frame 3502. As best shown in FIG. 26, the upper and lower mounting pins 3532 and 3534 include a shaft portion 3538 projecting from the first portion 3526 and a spherical end portion 3540.

FIG. 27 shows an embodiment of the leveling and retaining bracketry 3536 that includes elongated lower connectors 3542 mounted on the frame 3502 and projecting away from the frame. A pair of lower connectors 3542 is provided for each lift and rotate assembly 3504. The lower connectors 3542 are positioned to receive and support the lower mounting pins 3534 on the respective lift and rotate assembly 3504. Each lower connector 3542 has an inboard recess 3544 adjacent to the frame 3502 and an outboard recess 3546 spaced away from the frame. The inboard and outboard recesses 3544 and 3546 are each shaped and sized to receive and retain the pins 3544 for supporting the lift and rotate assembly 3504 in the selected position relative to the frame 3502.

As best in seen in FIG. 25, when the lift and rotate assembly 3504 is in the forward, operating position, the lower mounting pins 3534 are retained in the inboard recesses 3544 of the lower connectors 3542. In this forward, operating position, the center of mass 3545 of the lift and rotate assembly 3504 is inboard of the inboard recesses 3544, such that gravity biases the lift and rotate assembly 3504 toward the forward, operating position. The location of the center of mass 3545 is generally illustrated in FIG. 25, although the precise location of the center of mass is dependent upon the lift and rotate assembly used in various embodiments for the processing tool. The lower connectors 3542 are adjustable so the position of the lower connectors related to the frame 3502 can be adjusted to retain the respective lift and rotate assembly 3504 in a selected position and orientation when in the forward, operating position. The upper mounting pins 3532 are positioned to engage an adjustable upper leveling component 3548 mounted to the frame 3502 above the lower connectors 3542. As shown in FIG. 27, each upper leveling component 3548 includes a flat engagement surface 3550 positioned to receive the spherical end portion 3540 of the upper mounting pins 3532. The flat engagement surface 3550 allows the respective upper mounting pin 3532 to register thereon so the lift and rotate assembly 3504 is supported in the selected position for proper positioning relative to the frame 3502 and the respective bowl 3518. The upper leveling components 3548 are adjustable to control the lateral position or angular orientation of the lift and rotate assembly 3504 when mounted on the frame 3502 and in the forward, operating position. The location of the upper leveling components 3548 on the exposed surface of the frame 3502 allows the components to be easily adjusted from outside of the processing tool to control the position of the process head 3516 relative to the bowl or deck.

When the lift and rotate assembly 3504 of the illustrated embodiment is to be pivoted from the forward, operating position to the tilted, service position, an operator grasps the body 3524 and initially pulls it in the outboard direction away from the frame 3502. Referring to FIG. 25, the lower mounting pins 3534 are moved out of the inboard recesses 3544 in the lower connectors 3542 and into registry with the outboard recesses 3546. The body 3524 of the lift and rotate assembly 3504 is then spaced slightly apart from the frame 3502 while still being supported by the lower connectors 3542. The lift and rotate assembly 3504 is then pivoted about the lower mounting pins 3534 to tilt the body 3524 of the lift and rotate assembly away from the frame 3502 to the tilted, service position. When the lift and rotate assembly 3504 is tilted outwardly relative to the frame 3502 and in the tilted, service position, the assembly's center of mass 3545 is outboard of the lower mounting pins 3534. Accordingly, gravity assists in retaining the lift and rotate assembly 3504 in the tilted, service position relative to the frame 3502. A retention lanyard 3556 is provided in the illustrated embodiment to prevent the lift and rotate assembly 3504 from over-rotating past the tilted, service position. The retention lanyard is securely fixed at one end to the body 3524 of the lift and rotate assembly 3504 and fixed at the other end to the frame 3502. While the illustrated embodiment uses a retention lanyard 3556, other embodiments can use other rotational limiting mechanisms to control rotation of the lift and rotation assembly relative to the frame 3502.

In the tilted, service position, the process head 3516 is positioned upward and away from the respective bowl 3518 so an operator can access the process head 3516 from outside of the processing tool 100 for maintenance, service, or repair. When the lift and rotate assembly 3504 is in the tilted, service position, an operator can also easily access the bowl or the deck 3522 around the bowl within the processing tool's interior area. This aspect is particularly useful, for example, to service the bowl or to change the bowl configuration for a selected processing procedure (e.g., changing from 200 mm to 300 mm as described above). Accordingly, the modularity and configuration of the lift and rotate assembly 3504 allows for greater and faster interchangeability of the components of the processing tool 100.

One advantage of the embodiment of the lift/rotate assembly 3504 shown in FIGS. 25–27 is that it is substantially a fully contained modular assembly that can be easily mounted onto the frame 3502 of the processing tool 100, or removed from the frame as a unit as shown in FIG. 26. The quick removal of the lift/rotate assembly 3504 is facilitated, in part, by a latch 3558 (shown in FIG. 26) that is mounted on the body 3524. The latch 3558 has a releasable hook 3560 that extends into a latch aperture 3560 formed in the frame 3502 (shown in FIG. 27). The latch 3558 is positioned so the hook portion 3560 extends into the latch aperture 3562 and releasably engages the frame 3502 (FIG. 27). The latch 3558 helps securely retain the lift and rotate assembly 3504 in the forward, operating position with the upper mounting pins 3532 in secure engagement with the upper leveling component 3548 (FIG. 27). In the illustrated embodiment, the latch 3558 is a quarter-turn type latch, although alternate embodiments can use other latching mechanisms, such as a spring or biased latch, to releasably hold the lift and rotate assembly in the forward, operating position. After releasing the latch, the lift/rotate assembly 3504 can be quickly removed from the tool 100.

FIGS. 28–32 illustrate an embodiment of the features that provide for easy access to the mechanical and electrical components for each lift/rotate assembly 3504 without opening the lower compartment 3508 (FIG. 24). This benefit is brought about, at least in part, by the ease with which the lift/rotate assembly 3504 can be removed from the frame 3502. Another feature that enhances the modularity of the lift/rotate mechanisms 3504 is that the electronics and mechanics of each tool are easily accessible without opening the lower compartments.

Figure 28:
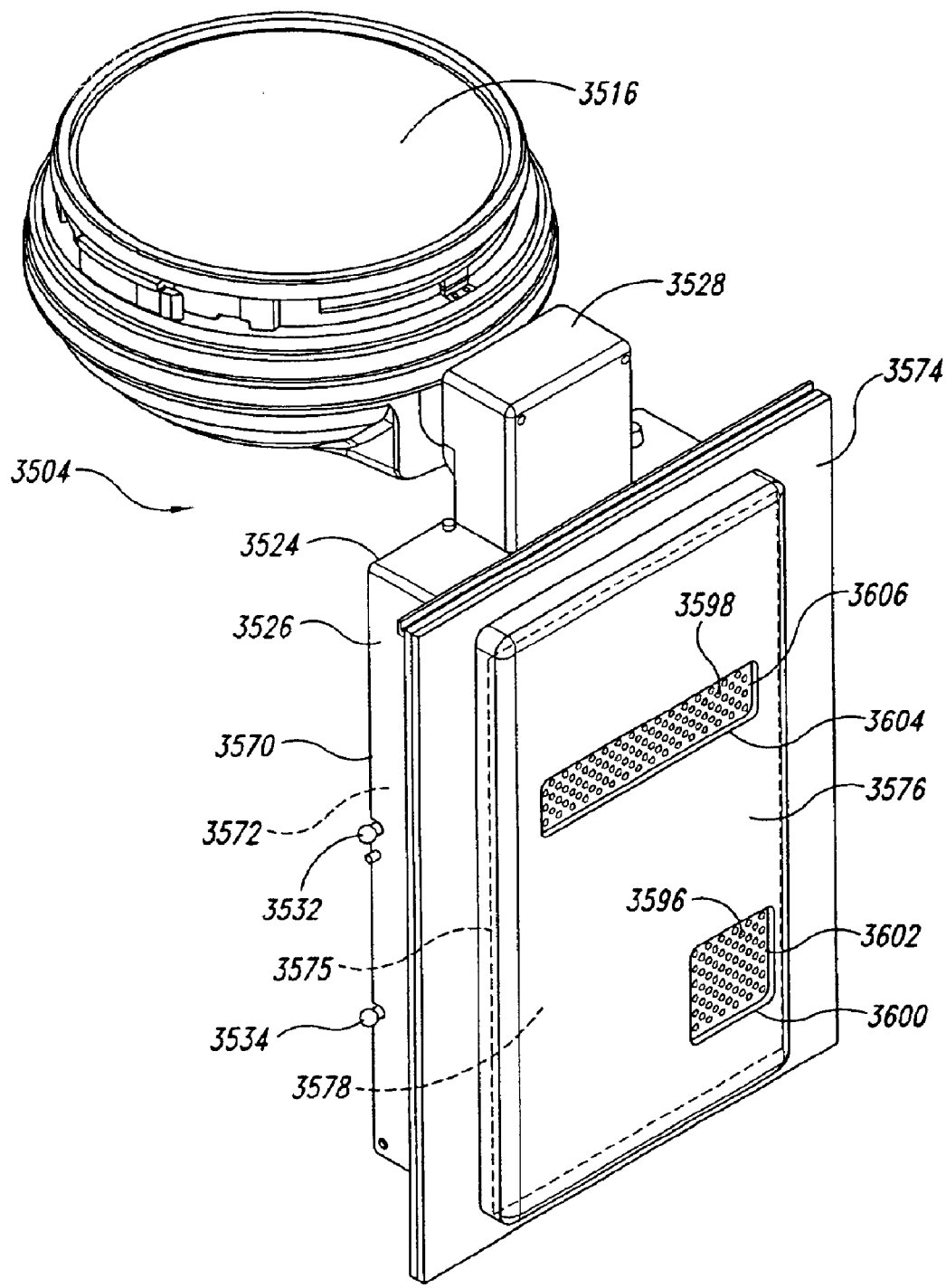
FIG. 28 illustrates an isometric front view of the lift and rotate assembly of FIG. 26.

Referring to FIG. 28, the body 3524 of the lift and rotate assembly 3504 has the first portion 3526 that defines a housing 3570 with an interior area 3572. A close-out bezel 3574 is mounted to the front side of the housing 3570 and is sized to span between the upper side panels 3510 and the lower close-out panel 3506 (FIG. 24) when the lift/rotate assembly 3504 is in the forward, operating position. The close-out bezel 3574 has an enlarged opening 3575 (best shown in FIG. 30) that allows for access into the interior area 3572 of the housing. An access door 3578 (best shown in FIG. 30) is mounted to the front of the housing 3570 and positioned to cover the opening 3575 when the access door is in a closed position. In the illustrated embodiment, an access cover 3576 is also mounted to the access door 3578. The access cover combines with the close-out bezel 3574 to provide an aesthetically pleasing exterior appearance to the lift and rotate assembly 3504 when mounted on the processing tool 100.

Figure 29:
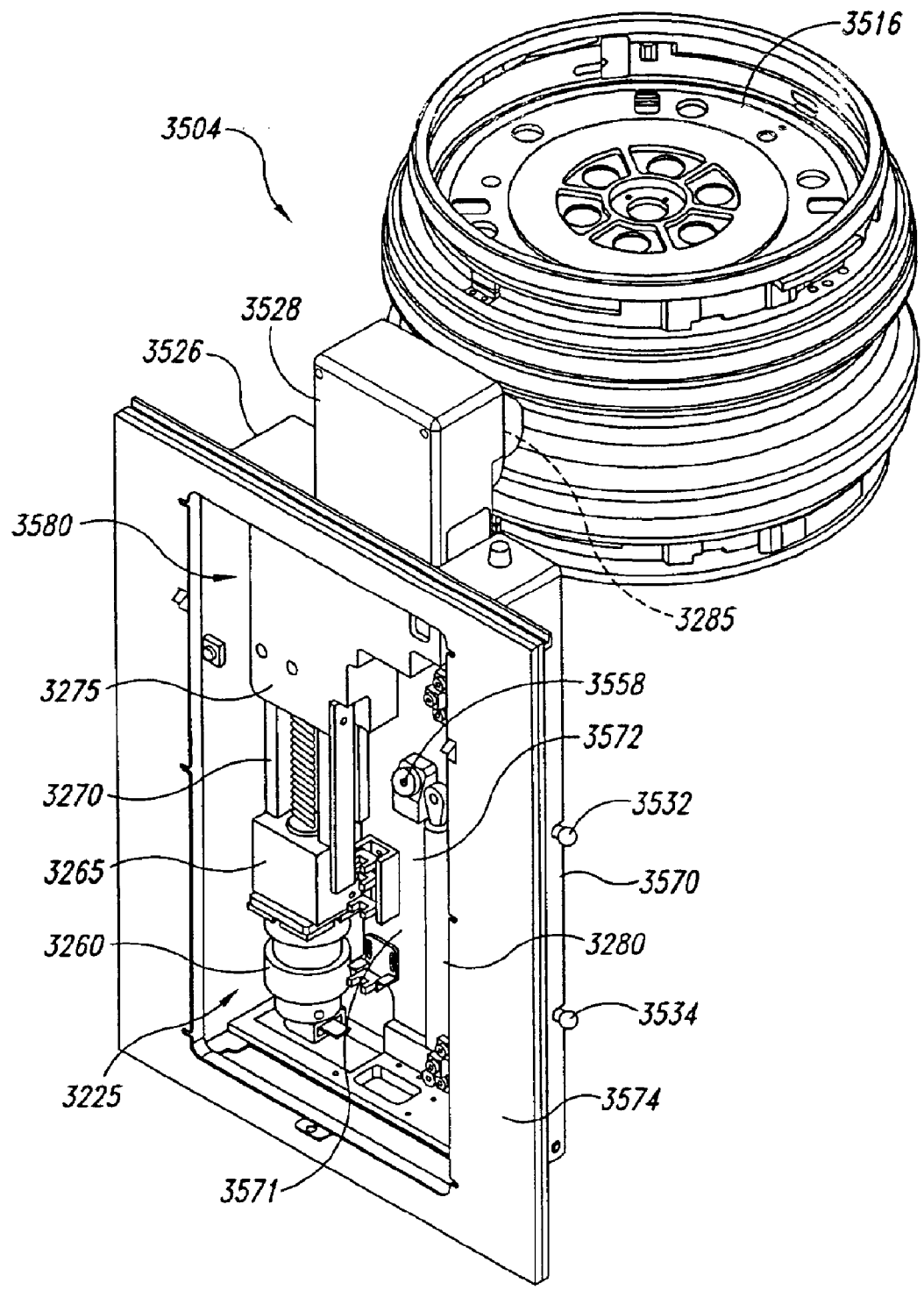
FIG. 29 illustrates an enlarged isometric front view of a lift and rotate assembly of FIG. 24 with an access door removed to illustrate control components.
Figure 30:
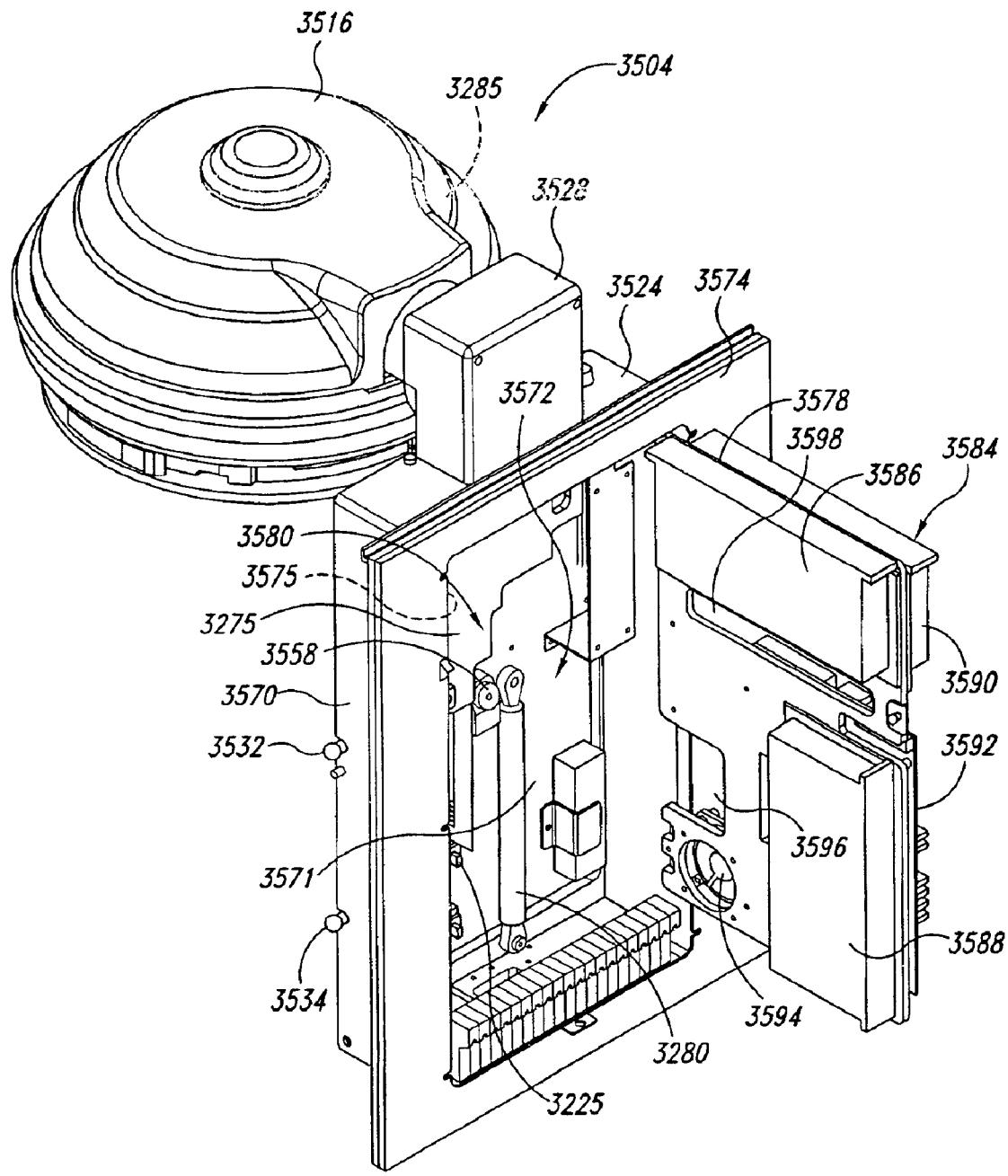
FIG. 30 illustrates an enlarged isometric front view of a lift and rotate assembly of FIG. 24 with an access door in an open position.

FIG. 29 illustrates the lift and rotate assembly 3504 with the access door 3578 removed to illustrate mechanical components 3580 in the interior area 3572 of the housing 3570. FIG. 30 illustrates the lift and rotate assembly 3504 with the access door 3578 in an open position to allow access to the interior area 3572. In the embodiment shown in these figures, a plurality of mechanical components 3580 are mounted to a rear wall 3571 in the interior area 3572 of the housing 3570. The mechanical components 3580 control the lift function of the lift and rotate assembly 3504 to move the second portion 3528 of the body between the raised position (as illustrated) and the lowered position (not illustrated).

Referring to FIG. 29, the mechanical components 3580 of the illustrated embodiment generally include a lift mechanism 3225 having a lift access motor 3260 and a lift actuator 3265 that turns a ball screw 3270. The mechanical components 3580 can also include a guide block 3275 connected to the second portion 3528 of the body and threadedly engaged with the ball screw 3570. In operation, rotation of the ball screw 3270 causes the guide block 3275 to move up or down for raising/lowering the second portion 3528 and the process head 3516. A compressed gas spring 3280 mounted in the interior area 3572 of the housing 3570 is coupled to the system to counterbalance the weight of the process head 3516 and second portion 3528 for reducing the load on the lift motor 3260. The illustrated embodiments also include the rotate axis assembly 3285 located within the second portion 3528 of the body for selectively rotating the process head 3516 relative to the body 3524.

Referring to FIG. 30, the latch 3558 is also mounted to the rear wall of the housing 3570 and accessed from the interior of the housing. For example, an operator can open the access door 3578 to expose the interior area 3572, and then turn the latch 3558 one-quarter turn to disengage it from the frame 3502. The lift and rotate assembly 3504 can then tilt from the forward, operating position to the service position as explained above.

One advantage of the embodiment shown in FIGS. 29 and 30 is that the mechanical components 3580 are fully contained within the interior area 3572 of the housing 3570 to provide a compact modular assembly for controlling the lift and rotational movement of the process head 3516. For example, the mechanical components 3580 in one embodiment can be coupled to quick disconnect members to provide power, such as electrical or pneumatic power, to the mechanical components for operation of the lift and rotate assembly 3504. In alternate embodiments, hydraulic power can be provided to the mechanical components if needed.

Figure 31:
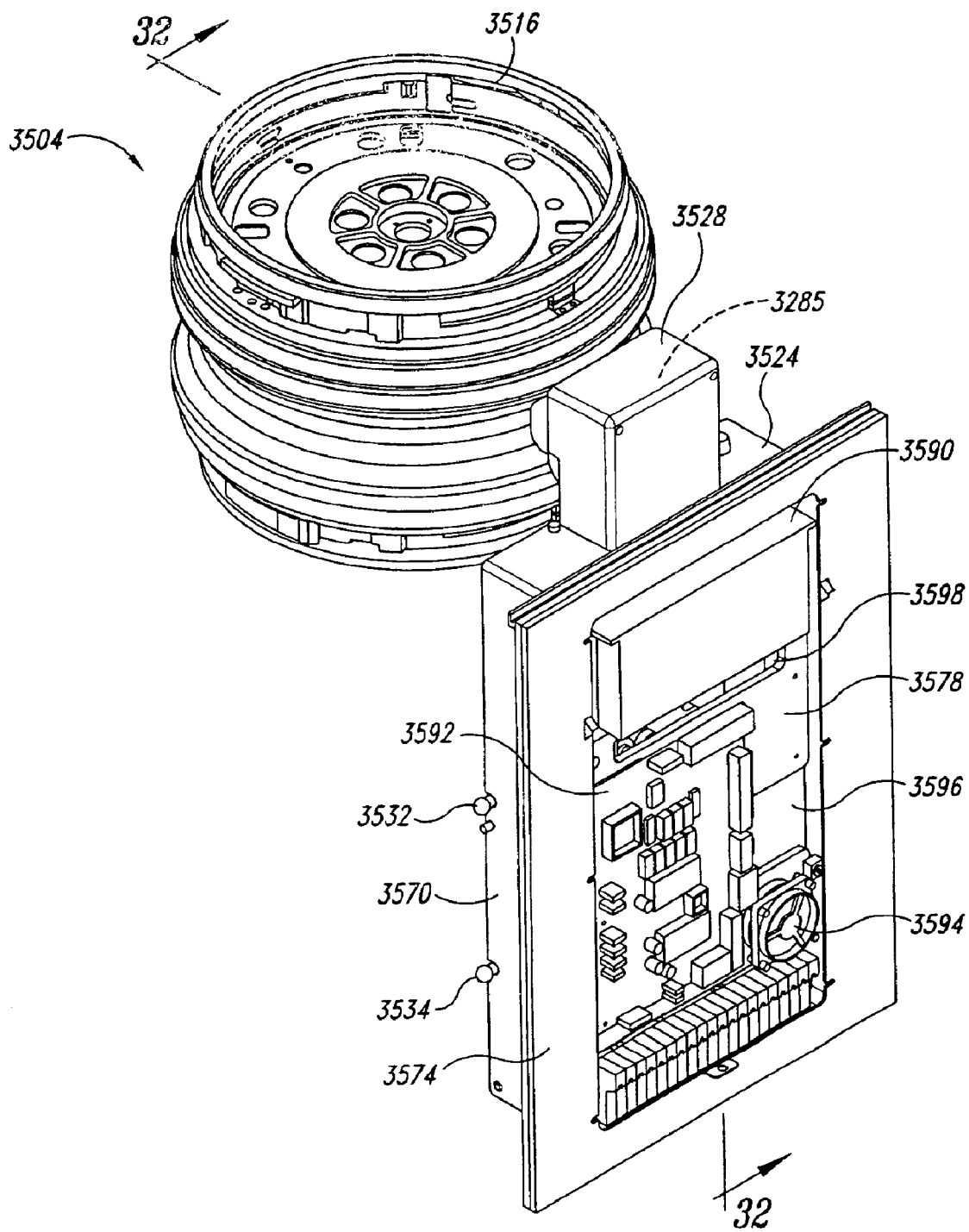
FIG. 31 illustrates an isometric front view of the lift and rotate assembly of FIG. 29 with the access door in a closed position and an access cover removed to illustrate electronic components on the access door.

As best seen in FIGS. 30 and 31, the lift and rotate assembly 3504 also includes an electronics module 3584 mounted on the access door 3578 and configured to control and monitor operation of the lift and rotate assembly 3504. The electronics module 3584 includes a rotate amplifier 3586 and a spin amplifier 3588 mounted on the inside surface of the access door 3578. The electronics module 3584 also includes a lift amplifier 3590 and a lift/rotate control board 3592 mounted on the outside of the access door 3578. The lift/rotate control board 3592, the lift amplifier 3590, the spin amplifier 3588, and the rotate amplifier 3586 are all modular components that can each be removed and replaced with a new component. Moreover, because the mechanical and electrical components are contained in the housing 3570, which is itself readily detachable from the tool 100 because it is mounted to an external portion of the frame 3502, each lift/rotate assembly 3504 can be easily removed or installed without having to access the upper or lower compartments. This allows for fast and efficient servicing or repair of the lift/rotate assembly 3504 to reduce the amount of downtime of the tool 100.

In the illustrated embodiment, a cooling fan 3594 is also mounted in an aperture formed in the bottom portion of the access door 3578 adjacent to the lift/rotate control board 3592. The access door 3578 also has an air inlet aperture 3596 located above the electronics cooling fan 3594 and an elongated air outlet aperture 3598 below the lift amplifier 3590 and the rotate amplifier 3586. The air inlet aperture 3596 allows the cooling fan 3594 to draw air into the interior area 3572 of the housing 3570 to cool the electronics on the inside of the access door 3578. The airflow in the interior area 3572 also cools the mechanical components 3580 contained within the housing 3570 to the extent needed. The air outlet aperture 3598 allows the cooling air to flow out of the interior area 3572 when the access door 3578 is closed to maintain good airflow through the housing 3570 and over the electrical and mechanical components.

Figure 32:
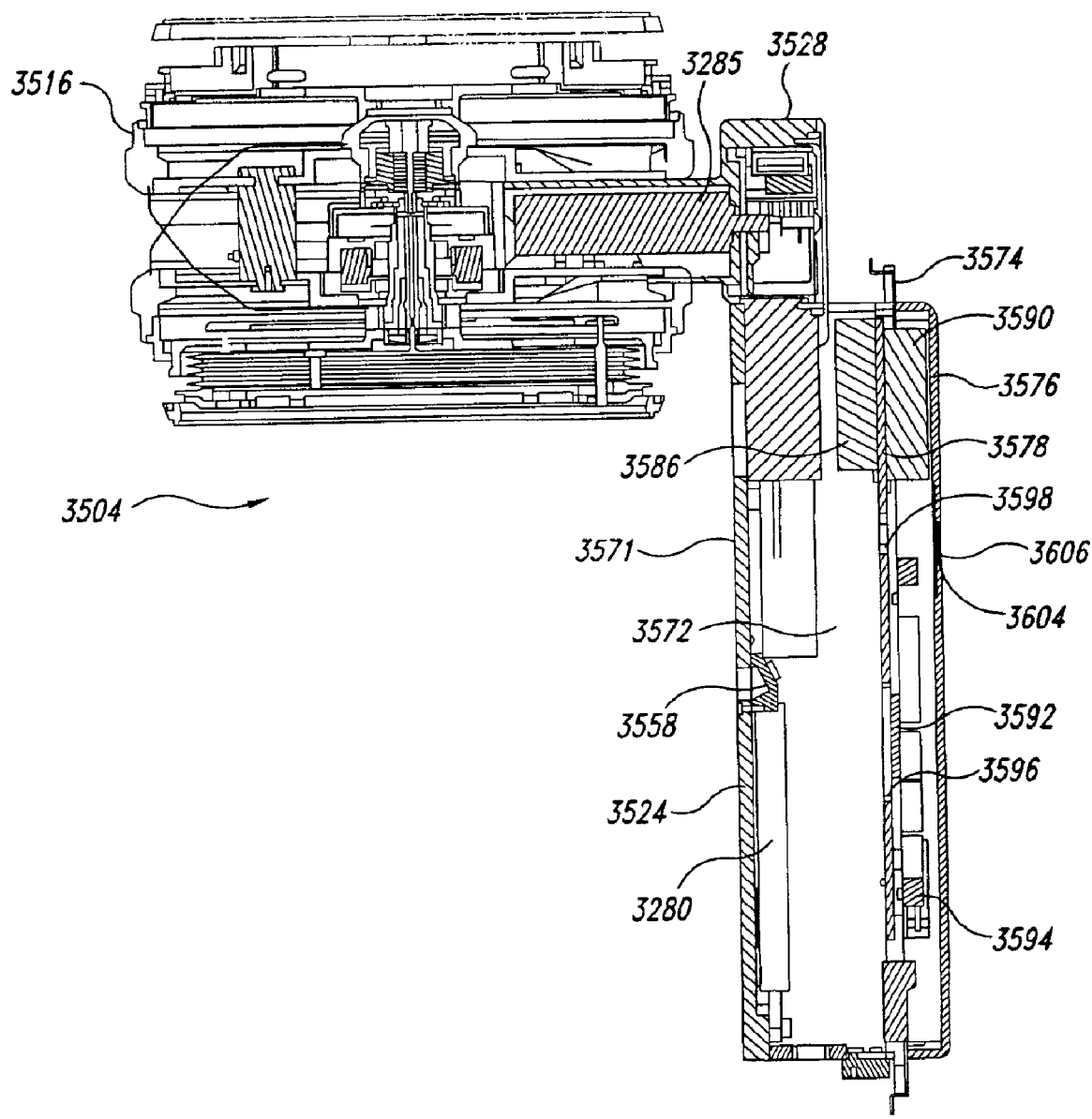
FIG. 32 illustrates a cross-sectional view taken substantially along line 32—32 of FIG. 31 with the access cover attached to the access door.

As indicated above and shown in FIGS. 28 and 32, the access cover 3576 is removably mounted onto the outside of the access door 3578 to cover the lift amplifier 3590, the lift/rotate control board 3592, the cooling fan 3594, and other components that may be mounted to the outside of the door. The access cover 3576 includes an air inlet aperture 3600 (FIG. 28) with a flow screen 3602 positioned adjacent to the air inlet aperture 3596 in the access door. The access cover 3576 also has an air outlet aperture 3604 with a flow screen 3606 positioned adjacent to the air outlet aperture 3598 in the access door. The air inlet and outlet apertures 3600 and 3604 in the access cover allows the cooling airflow to enter and exit the interior area 3572 of the housing 3570, and also to flow over the components mounted to the outside of the access door. The airflow pattern in alternate embodiments can be controlled or changed by using different access covers 3576 having inlet or outlet apertures of different sizes or locations as needed for the configuration of the modules on the access door or in the housing's interior area.

One benefit of several embodiments of the lift/rotate assemblies 3504 is that the mechanical and electrical components can be serviced or repaired without having to open the lower compartment 3508 (FIG. 24). When the lift and rotate assembly 3504 is in the forward, operating position, an operator can easily access the electronics module 3584 on the access door 3578 from the exterior of the processing tool 100. Similarly, the operator can access the mechanical components 3580 of the lift and rotate assembly 3504 simply by opening the access door 3578 either when the lift and rotate assembly is in the forward, operating position or in the tilted, service position. Accordingly, the operator does not need to access the interior area of the processing tool 100 in order to service or repair the mechanical or electrical components for an individual lift and rotate assembly. This is beneficial because the operator is not exposed to chemical vapors contained in the lower compartment 3508. Moreover, as explained above, the entire lift and rotate assembly 3504 can be removed and replaced with a new lift and rotate assembly for more extensive service/repairs to reduce downtime.

Another benefit of several embodiments of the lift and rotate assemblies 3504 is that they increase the area in the tool for processing stations and/or transfer devices. One feature that provides these benefits is that the lift/rotate assemblies 3504 are mounted to an external portion of the frame 3502. This not only allows the lift/rotate assemblies to be easily removed, but it also provides more space in the interior region of the cabinet for components. For example, mounting of the lift and rotate assembly 3504 on the forward (i.e., external face) edge of the frame 3502 also allows a smaller deck 3522 to be used in the processing tool 100 for reducing the tool's footprint. This smaller footprint translates into very valuable space savings within a clean room that typically contains a semiconductor wafer-processing tool. Alternatively, larger process heads 3516 and bowls 3518 can be used for a 300 mm wafer or other larger workpiece without having to enlarge the size of the processing tool's deck footprint within the clean room.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A tool for electrochemical processing of microelectronic workpieces, comprising:
   a cabinet having a frame, at least one upper panel enclosing an upper compartment, and at least one lower panel enclosing a lower compartment, wherein the lower panel has an opening, and wherein the cabinet defines an interior enclosure;
   a lift/rotate assembly having a housing rotatably coupled to an external portion of the frame to tilt outward relative to the frame, mechanical lift components in the housing, and a door coupled to the housing, wherein the door is received in the opening of the lower panel of the cabinet; and
   an electrochemical processing station comprising
   (a) a reaction vessel in the interior enclosure, the reaction vessel comprising a container and at least one electrode in the container, and
   (b) a head assembly carried by the lift/rotate assembly, the head assembly having a workpiece holder configured to hold a microelectronic workpiece relative to the reaction vessel during a processing cycle.

2. A tool for electrochemical processing of microelectronic workpieces, comprising:

a cabinet defining an interior enclosure;

a first electrochemical processing station comprising (a) a first reaction vessel in the interior enclosure, the first reaction vessel comprising a first container, a first field shaping unit in the first container, and a plurality of separate first electrodes, wherein the first field shaping unit includes first electrode compartments that each contain one of the first electrodes, and (b) a first head assembly having a workpiece holder configured to hold a microelectronic workpiece relative to the first field shaping unit during a processing cycle;

a second electrochemical processing station comprising (a) a second reaction vessel in the interior enclosure, the second reaction vessel comprising a second container, a second field shaping unit in the second container, and a plurality of separate second electrodes, wherein the second field shaping unit includes second electrode compartments that each contain one of the second electrodes, and (b) a second head assembly having a workpiece holder configured to hold a microelectronic workpiece relative to the second field shaping unit during a processing cycle;

a first power supply having a first electrical link coupled to the first electrodes in the first reaction vessel; and a second power supply having a second electrical link coupled to the second electrodes in the second reaction vessel separately from the first power supply.

3. A tool for electrochemical processing of microelectronic workpieces, comprising:

a cabinet defining an interior enclosure;

an electrochemical processing station comprising (a) a reaction vessel in the interior enclosure, the reaction vessel comprising a container and at least one electrode in the container, and (b) a head assembly having a workpiece holder configured to hold a microelectronic workpiece relative to the reaction vessel during a processing cycle; and a transfer device for handling workpieces in the cabinet, the transfer device having a robot comprising (a) an arm assembly including an arm that moves along a lift path and/or rotates about the lift path, and (b) first and second end-effectors carried by the arm, wherein the first and second end-effectors rotate relative to the arm about at least one rotation axis generally parallel to the lift path.

4. A tool for electrochemical processing of microelectronic workpieces, comprising:

a cabinet defining an interior enclosure;

an electrochemical processing station comprising (a) a reaction vessel in the interior enclosure, the reaction vessel comprising a container and at least one electrode in the container, and (b) a head assembly having a workpiece holder configured to hold a microelectronic workpiece relative to the reaction vessel during a processing cycle; and a transfer device for handling workpieces in the cabinet, the transfer device having a robot comprising (a) an arm assembly including an arm that moves along a lift path and/or rotates about the lift path, and (b) first and second end-effectors carried by the arm, wherein the first and second end-effectors rotate relative to the arm about at least one rotation axis generally parallel to the lift path, and wherein the first end-effector is spaced apart from the arm by a first distance to rotate through a first plane and the second end-effector is spaced apart from the arm by a second distance to rotate through a second plane separate from the first plane.

5. A tool for electrochemical processing of microelectronic workpieces, comprising:

a cabinet defining an interior enclosure;

an electrochemical processing station comprising (a) a reaction vessel in the interior enclosure, the reaction vessel comprising a container, a plurality of electrodes in separate electrode compartments in the container, and at least one interface member coupled to at least one of the electrode compartments between a corresponding electrode and a workpiece processing site, the interface member being configured to prevent selected matter from passing from the electrode compartment containing the corresponding electrode to the workpiece processing site, and (b) a head assembly having a workpiece holder configured to hold a microelectronic workpiece relative to the reaction vessel during a processing cycle; and a transfer device for handling workpieces in the cabinet, the transfer device having a robot comprising (a) an arm assembly including an arm that moves along a lift path and/or rotates about the lift path, and (b) at least a first end-effector carried by the arm.

6. A tool for electrochemical processing of microelectronic workpieces, comprising:

a cabinet defining an interior enclosure, the cabinet having a frame and panels attached to the frame to define the interior enclosure;

an electrochemical processing station comprising (a) a reaction vessel in the interior enclosure, the reaction vessel comprising a container and at least one electrode in the container, and (b) a head assembly having a workpiece holder configured to hold a microelectronic workpiece relative to the reaction vessel during a processing cycle;

a transfer device for handling workpieces in the cabinet, the transfer device having a robot comprising (a) an arm assembly including an arm that moves along a lift path and/or rotates about the lift path, and (b) first and second end-effectors carried by the arm, wherein the first and second end-effectors rotate relative to the arm; and a lift/rotate assembly having a housing rotatably coupled to an external portion of the frame to tilt outward relative to the frame, mechanical lift components in the housing, and a door coupled to the housing, wherein the door is accessible to be opened without opening the cabinet.

7. A tool for electrochemical processing of microelectronic workpieces, comprising:

a cabinet defining an interior enclosure;

a transfer device for handling workpieces in the cabinet, the transfer device having a robot comprising (a) an arm assembly including an arm that moves along a lift path and/or rotates about the lift path, and (b) first and second end-effectors carried by the arm, wherein the first and second end-effectors rotate relative to the arm; and a first electrochemical processing station comprising
(a) a first reaction vessel in the interior enclosure, the first reaction vessel comprising a first container and a plurality of separate first electrodes in the first container, and
(b) a first head assembly having a workpiece holder configured to hold a microelectronic workpiece relative to the first reaction vessel during a processing cycle;
a second electrochemical processing station comprising
(a) a second reaction vessel in the interior enclosure, the second reaction vessel comprising a second container and a plurality of separate second electrodes in the second container, and
(b) a second head assembly having a workpiece holder configured to hold a microelectronic workpiece relative to the second reaction vessel during a processing cycle;
a first power supply having a first electrical link coupled to the first electrodes in the first reaction vessel; and
a second power supply having a second electrical link coupled to the second electrodes in the second reaction vessel.

8. A tool for electrochemical processing of microelectronic workpieces, comprising:
a cabinet defining an interior enclosure;
an electrochemical processing unit in the cabinet, the electrochemical processing unit comprising a head assembly having a workpiece holder with a plurality of electrical contacts arranged to engage a perimeter portion of a microelectronic workpiece and a processing chamber aligned with the head assembly, the processing chamber comprising (a) an outer housing, (b) a reaction vessel in the outer housing, the reaction vessel having an inlet through which an electrochemical processing solution flows into the processing chamber and a weir over which the electrochemical processing fluid flows into the outer housing, (c) a first electrode compartment in the reaction vessel and a second electrode compartment in the reaction vessel concentric with the first electrode compartment, and (d) a plurality of electrodes including a first electrode in the first electrode compartment and a second electrode in the second electrode compartment; and
a controller operatively coupled to the first and second electrodes, wherein the controller is configured to provide an independent electrical current to each of the first and second electrodes.

9. The tool of claim 8 wherein the processing chamber further comprises a field shaping unit between the workpiece holder and the first and second electrodes, and wherein the field shaping unit is configured to shield at least a portion of the microelectronic workpiece from the first and second electrodes.

10. The tool of claim 9 wherein the first electrode compartment is separated from the second electrode compartment by an annular wall, and wherein the field shaping unit comprises an annular lateral dielectric section attached to the annular wall.

11. The tool of claim 9 wherein the field shaping unit comprises a first annular lateral section over at least a portion of the first electrode and a second annular lateral section over at least a portion of the second electrode.

12. The tool of claim 8 wherein the first electrode is a first annular conductive ring and the second electrode is a second annular conductive ring.

13. The tool of claim 12 wherein the processing chamber further includes a flow director in the reaction vessel that directs a flow of processing solution generally along a central area of the reaction vessel within the first annular conductive ring.

14. The tool of claim 8 wherein the processing chamber further comprises an interface member between the first electrode and the weir of the reaction vessel, the interface member being configured to inhibit particles from flowing from the first electrode compartment to the weir.

15. The tool of claim 14 wherein the interface member comprises a filter.

16. The tool of claim 14 wherein the interface member comprises an ion-membrane.

17. The tool of claim 14 wherein the processing chamber further comprises a primary flow guide configured to direct a primary flow of a catholyte to the workpiece holder, a secondary flow system configured to direct a secondary flow of an anolyte through the first and second electrode compartments, and the interface member comprises an ion-membrane between the primary flow and the secondary flow that preferentially allows ions to pass between the secondary flow and the primary flow.

18. The tool of claim 8, further comprising a transfer device for handling workpieces in the cabinet, the transfer device having a robot comprising an arm assembly including an arm that moves and/or rotates relative to a lift path, a first end-effector rotatably attached to the arm at a first elevation, and a second end-effector rotatably attached to the arm at a second elevation above the first elevation.

19. A tool for electrochemical processing of microelectronic workpieces, comprising:
a cabinet defining an interior enclosure;
an electrochemical processing unit in the cabinet, the electrochemical processing unit comprising a head assembly having a workpiece holder with a plurality of electrical contacts arranged to engage a perimeter portion of a microelectronic workpiece and a processing chamber aligned with the head assembly, the processing chamber comprising (a) a reaction vessel having an inlet through which an electrochemical processing solution flows into the processing chamber, (b) a plurality of electrodes in the reaction vessel including a first annular electrode and a second annular electrode concentric with respect to the first annular electrode, and (c) a field shaping unit in the reaction vessel comprising an annular lateral section of a dielectric material between the second electrode and the workpiece holder to shape an electric field generated by the first electrode at a peripheral region of the workpiece holder; and
a controller operatively coupled to the first and second electrodes, wherein the controller is configured to provide an independent electrical current to each of the first and second electrodes.

20. The tool of claim 19 wherein the field shaping unit further comprises a first annular lateral section over at least a portion of the first electrode and a second annular lateral section over at least a portion of the second electrode.

21. The tool of claim 19 wherein the first electrode is a first annular conductive ring and the second electrode is a second annular conductive ring.

22. The tool of claim 21 wherein the processing chamber further includes a flow director in the reaction vessel that directs a flow of processing solution along a central area of the reaction vessel and within the first annular conductive ring.

23. The tool of claim 19 wherein the processing chamber further comprises an interface member between the first electrode and the workpiece holder, and wherein the interface member is configured to inhibit particles from flowing from the first electrode to the workpiece holder.

24. The tool of claim 23 wherein the interface member comprises a filter.

25. The tool of claim 23 wherein the interface member comprises an ion-membrane.

26. The tool of claim 23 wherein the processing chamber further comprises a primary flow guide configured to direct a primary flow of a catholyte toward the workpiece holder, a secondary flow system configured to direct a secondary flow of an anolyte through by the first and second electrode compartments, and the interface member comprises anion-membrane between the primary flow and the secondary flow that preferentially allows ions to pass between the secondary flow and the primary flow.

27. The tool of claim 19, further comprising a transfer device for handling workpieces in the cabinet, the transfer device having a robot comprising an arm assembly including an arm that moves and/or rotates relative to a lift path, a first end-effector rotatably attached to the arm at a first elevation, and a second end-effector rotatably attached to the arm at a second elevation above the first elevation.

28. A tool for electrochemical processing of microelectronic workpieces, comprising:
a cabinet defining an interior enclosure;
an electrochemical processing unit in the cabinet, the electrochemical processing unit comprising a head assembly having a workpiece holder with a plurality of electrical contacts arranged to engage a perimeter portion of a microelectronic workpiece and a processing chamber aligned with the head assembly, the processing chamber comprising (a) a reaction vessel having an inlet through which an electrochemical processing solution flows into the processing chamber, (b) a plurality of electrodes in the reaction vessel including a first annular electrode and a second annular electrode concentric with respect to the first annular electrode, and (c) a field shaping unit in the reaction vessel configured to substantially shield at least a portion of a workpiece held in the workpiece holder from line of sight exposure from at least one of the first and second annular electrodes; and
a controller operatively coupled to the first and second electrodes, wherein the controller is configured to provide an independent electrical current to each of the first and second electrodes.

29. The tool of claim 28, further comprising an annular first electrode compartment in which the first annular electrode is positioned, an annular second electrode compartment in which the second annular electrode is positioned, and an annular wall separating the first and second electrode compartments.

30. The tool of claim 29 wherein the field shaping unit comprises a lateral dielectric section attached to the annular wall.

31. The tool of claim 29 wherein the processing chamber further comprises an interface member between the first annular electrode and the workpiece holder, the interface member being configured to inhibit particles from flowing from the first annular electrode to the workpiece holder.

32. The tool of claim 31 wherein the interface member comprises a filter.

33. The tool of claim 31 wherein the interface member comprises an ion-membrane.

34. The tool of claim 31 wherein the processing chamber further comprises a primary flow guide configured to direct a primary flow of a catholyte toward the workpiece holder, a secondary flow system configured to direct a secondary flow of an anolyte through the first and second electrode compartments, and the interface member comprises an ion-membrane between the primary flow and the secondary flow that preferentially allows ions to pass between the secondary flow and the primary flow.

35. The tool of claim 28 wherein the field shaping unit comprises a first annular lateral dielectric section over at least a portion of the first electrode and a second annular lateral dielectric section over at least a portion of the second electrode.

36. The tool of claim 28 wherein the first electrode is a first annular conductive ring and the second electrode is a second annular conductive ring.

37. The tool of claim 36 wherein the processing chamber further includes a flow director in the reaction vessel configured to direct flow along a central area of the reaction vessel and within the first annular conductive ring surrounds the flow director.

38. The tool of claim 28, further comprising a transfer device for handling workpieces in the cabinet, the transfer device having a robot comprising an arm assembly including an arm that moves and/or rotates relative to a lift path, a first end-effector rotatably attached to the arm at a first elevation, and a second end-effector rotatably attached to the arm at a second elevation above the first elevation.

39. A tool for electrochemical processing of microelectronic workpieces, comprising:
a cabinet defining an interior enclosure;
an electrochemical processing unit in the cabinet, the electrochemical processing unit comprising a head assembly having a workpiece holder with a plurality of electrical contacts arranged to engage a perimeter portion of a microelectronic workpiece and a processing chamber aligned with the head assembly, the processing chamber comprising (a) a reaction vessel having an inlet through which an electrochemical processing solution flows into the processing chamber, (b) a plurality of electrodes in the reaction vessel including a first electrode and a second electrode concentric with respect to the first annular electrode in the reaction vessel, and (c) a first interface member between the first electrode and the workpiece holder configured to inhibit selected matter in the processing solution from reaching the workpiece holder; and
a controller operatively coupled to the first and second electrodes, wherein the controller is configured to provide an independent electrical current to each of the first and second electrodes.

40. The tool of claim 39 further comprising a second interface member between the second electrode and the workpiece holder configured to inhibit selected matter in the processing solution from reaching the workpiece holder.

41. The tool of claim 39 wherein the interface member comprises a filter configured to filter particulate matter from the processing solution.

42. The tool of claim 39 wherein the interface member comprises a filter configured to filter particulate matter and bubbles from the processing solution.

43. The tool of claim 39 wherein the interface member comprise an ion membrane.

44. The tool of claim 39 wherein the processing chamber further comprises a primary flow guide configured to direct a primary flow of a catholyte to the workpiece holder, a secondary flow system configured to direct a secondary flow of an anolyte through the first and second electrode compartments, and the interface member comprises an ion-membrane between the primary flow and the secondary flow that preferentially allows ions to pass between the secondary flow and the primary flow.

* * * * *

UNITED STATES PATENT AND TRADEMARK OFFICE
CERTIFICATE OF CORRECTION

PATENT NO. : 6,921,467 B2
DATED : July 26, 2005
INVENTOR(S) : Kyle M. Hanson et al.

It is certified that error appears in the above-identified patent and that said Letters Patent is hereby corrected as shown below:

Column 2,
Line 18, "workpiece" should be -- workpieces --;

Column 38,
Line 66, "he" should be -- the --;

Column 41,
Line 12, delete "effectors";

Column 43,
Line 40, "effector effector 1250a" should be -- effector 1250a --.

Signed and Sealed this

Twenty-second Day of November, 2005

JON W. DUDAS
*Director of the United States Patent and Trademark Office*